(12) United States Patent
Ando et al.

(10) Patent No.: US 8,907,349 B2
(45) Date of Patent: Dec. 9, 2014

(54) SEMICONDUCTOR DEVICE AND METHOD OF MANUFACTURING THE SAME

(71) Applicant: Renesas Electronics Corporation, Kanagawa (JP)

(72) Inventors: Yuji Ando, Kanagawa (JP); Kazuki Ota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/872,914

(22) Filed: Apr. 29, 2013

(65) Prior Publication Data

US 2013/0292690 A1    Nov. 7, 2013

(30) Foreign Application Priority Data

May 2, 2012    (JP) ................. 2012-105363

(51) Int. Cl.
| | | |
|---|---|---|
| *H01L 29/15* | (2006.01) | |
| *H01L 29/778* | (2006.01) | |
| *H01L 29/205* | (2006.01) | |
| *H01L 29/43* | (2006.01) | |
| *H01L 29/66* | (2006.01) | |
| *H01L 29/10* | (2006.01) | |
| *H01L 29/20* | (2006.01) | |

(52) U.S. Cl.
CPC .......... *H01L 29/778* (2013.01); *H01L 29/7786* (2013.01); *H01L 29/1066* (2013.01); *H01L 29/205* (2013.01); *H01L 29/2003* (2013.01); *H01L 29/432* (2013.01); *H01L 29/66462* (2013.01)
USPC ............................................ 257/76; 257/194

(58) Field of Classification Search
CPC ................... H01L 29/66431; H01L 29/66462; H01L 29/7787; H01L 2924/13064
USPC ....................................................... 257/76, 194
See application file for complete search history.

(56) References Cited

U.S. PATENT DOCUMENTS

| | | | |
|---|---|---|---|
| 7,038,252 B2 | 5/2006 | Saito et al. | |
| 7,508,015 B2 | 3/2009 | Saito et al. | |
| 7,816,707 B2 | 10/2010 | Hikita et al. | |
| 7,868,355 B2 * | 1/2011 | Sato | ............................... 257/192 |
| 8,264,002 B2 | 9/2012 | Hikita et al. | |
| 2005/0189559 A1 | 9/2005 | Saito et al. | |
| 2006/0138454 A1 | 6/2006 | Saito et al. | |
| 2006/0180831 A1 * | 8/2006 | Nakazawa et al. | ............ 257/189 |
| 2006/0273347 A1 | 12/2006 | Hikita et al. | |
| 2007/0210335 A1 * | 9/2007 | Ikeda et al. | ................... 257/201 |

(Continued)

FOREIGN PATENT DOCUMENTS

| | | |
|---|---|---|
| JP | 11-261053 A | 9/1999 |
| JP | 2005-244072 A | 9/2005 |
| JP | 2006-339561 A | 12/2006 |

*Primary Examiner* — Tu-Tu Ho
(74) *Attorney, Agent, or Firm* — Foley & Lardner LLP

(57) ABSTRACT

In a high electron mobility transistor, with a normally-off operation maintained, on-resistance can be sufficiently reduced, so that the performance of a semiconductor device including the high electron mobility transistor is improved. Between a channel layer and an electron supply layer, a spacer layer whose band gap is larger than the band gap of the electron supply layer is provided. Thereby, due to the fact that the band gap of the spacer layer is large, a high potential barrier (electron barrier) is formed in the vicinity of an interface between the channel and the electron supply layer.

20 Claims, 37 Drawing Sheets

(56) References Cited

U.S. PATENT DOCUMENTS

| | | | |
|---|---|---|---|
| 2008/0237640 A1* | 10/2008 | Mishra et al. | 257/194 |
| 2009/0212325 A1* | 8/2009 | Sato | 257/192 |
| 2010/0327293 A1 | 12/2010 | Hikita et al. | |
| 2012/0112202 A1* | 5/2012 | Hwang et al. | 257/76 |
| 2012/0299011 A1 | 11/2012 | Hikita et al. | |

* cited by examiner

SEMICONDUCTOR DEVICE AND METHOD OF MANUFACTURING THE SAME

CROSS-REFERENCE TO RELATED APPLICATION

The present application claims priority from Japanese Patent Application No. 2012-105363 filed on May 2, 2012, the content of which is hereby incorporated by reference into this application.

BACKGROUND

The present invention relates to a semiconductor device and a technique of manufacturing the same, and, for example, relates to a technique effective when applied to a semiconductor device including a transistor using a nitride semiconductor and a technique of manufacturing the same.

Japanese Patent Application Laid-Open No. H11-261053 (Patent Document 1), Japanese Patent Application Laid-Open No. 2005-244072 (Patent Document 2), and Japanese Patent Application Laid-Open No. 2006-339561 (Patent Document 3) describe techniques shown below, for example. That is, the above-mentioned documents describe a high electron mobility transistor (HEMT) provided with a channel layer, an electron supply layer formed on the channel layer, and a pair of source electrode and drain electrode formed in direct contact with the electron supply layer. The high electron mobility transistor further includes a p-type cap layer formed so as to be sandwiched between the source electrode and the drain electrode, and a gate electrode formed on the p-type cap layer.

SUMMARY

In the above high electron mobility transistor, negative charges are produced in the p-type cap layer due to ionization of acceptors contained in the p-type cap layer. This causes depletion of the channel layer under the gate layer, thereby allowing a normally-off operation. In the above high electron mobility transistor, however, the present inventors have found the following problem. When the carrier concentration of a two-dimensional electron gas generated at the interface between the channel layer and the electron supply layer is increased by applying a positive voltage to the gate electrode in order to turn on the high electron mobility transistor, electrons flow from the two-dimensional electron gas to the gate electrode, and a gate leakage current is generated. The presence of the gate leakage current limits a maximum carrier concentration of the two-dimensional electron gas accumulated in the channel layer. The limitation of the maximum carrier concentration of the two-dimensional electron gas means that the amount of carriers contributing as a channel current is limited, and thus it becomes difficult to reduce on-resistance. That is, in the above high electron mobility transistor, there is the problem that it is difficult to reduce the on-resistance sufficiently with the normally-off operation maintained.

The above and other preferred aims and novel characteristics of the present invention will be apparent from the description of the present specification and the accompanying drawings.

The typical ones of the inventions disclosed in the present application will be briefly described as follows.

According to an embodiment, a high electron mobility transistor (field-effect transistor) includes a spacer layer between a channel layer and an electron supply layer, and a band gap of the spacer layer is larger than a band gap of the electron supply layer.

According to an embodiment, in the high electron mobility transistor, an on-resistance can be sufficiently reduced with a normally-off operation maintained, so that the performance of a semiconductor device including the high electron mobility transistor can be improved.

BRIEF DESCRIPTIONS OF THE DRAWINGS

The above and other objects, advantages and features of the present invention will be more apparent from the following description of certain preferred embodiments taken in conjunction with the accompanying drawings, in which.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range mentioned above.

Also, the same components are denoted by the same reference symbols throughout the drawings for describing the embodiments, and the repetitive descriptions thereof will be omitted. Note that, in some drawings, hatching is used even in a plan view so as to make the drawings easy to understand.

(First Embodiment)

<Description of Related Art>

First, before a technical idea in a first embodiment is described, a related art will be described, and then a point that the related art has room for improvement in terms of reducing an on-resistance will be described. Then, a technical idea in the first embodiment configured so as to improve the point will be described.

Figure 1:
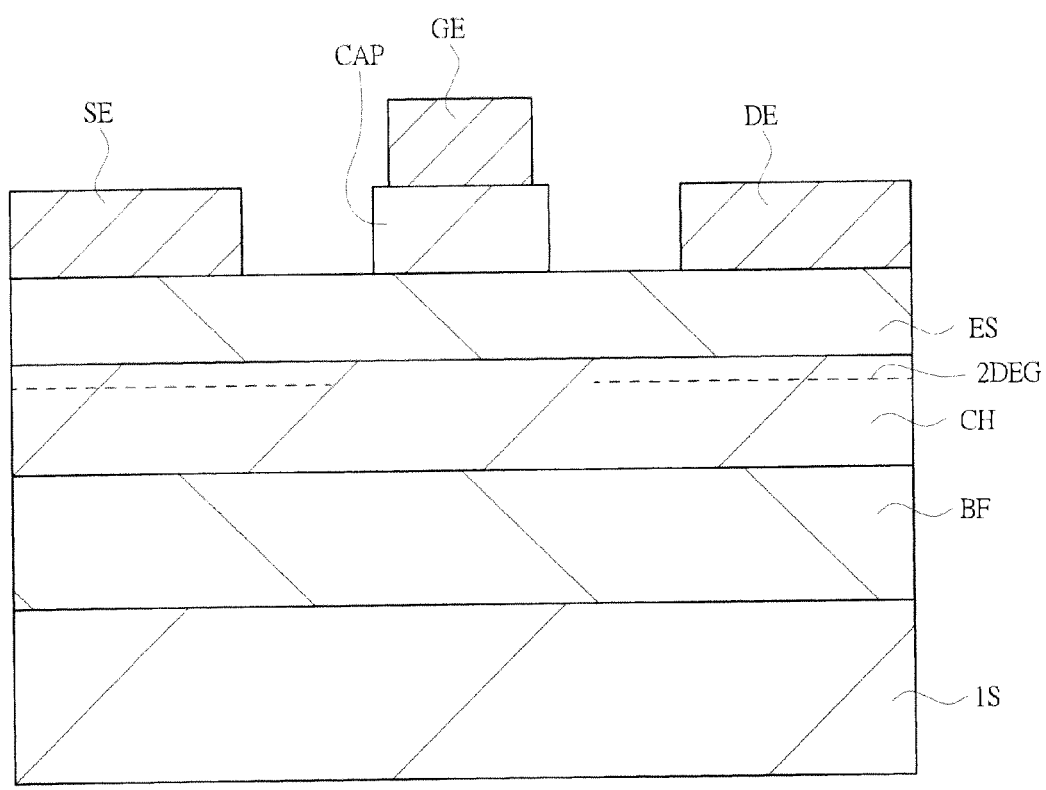
FIG. 1 is a sectional view showing the configuration of a high electron mobility transistor in a related art.

FIG. 1 is a sectional view showing the configuration of a high electron mobility transistor (HEMT) in a related art. As shown in FIG. 1, in the high electron mobility transistor in the related art, a buffer layer BF composed of, for example, undoped gallium nitride (GaN) is formed on a semiconductor substrate 1S composed of silicon (Si), for example. Then, a channel layer CH composed of, for example, undoped gallium nitride (GaN) is formed on the buffer layer BF.

Here, the buffer layer BF is formed for the purpose of relaxing mismatch between lattice spacing of silicon (Si) constituting the semiconductor substrate 1S and lattice spacing of gallium nitride (GaN) constituting the channel layer. That is, if the channel layer CH composed of gallium nitride (GaN) is formed directly on the semiconductor device 1S composed of silicon, a lot of crystal defects are formed in the channel layer CH, which causes the performance of the high electron mobility transistor to degrade. This is why the buffer layer BF intended for lattice relaxation is interposed between the semiconductor substrate 1S and the channel layer CH. The formation of the buffer layer BF can improve the quality of the channel layer CH formed on the buffer layer BF, and thus the performance improvement of the high electron mobility transistor can be achieved.

Then, an electron supply layer ES composed of, for example, undoped aluminum gallium nitride (AlGaN) is formed on the channel layer CH. A source electrode SE and a drain electrode DE are formed on the electron supply layer ES so as to be separated from each other. The materials of the source electrode SE and the drain electrode DE are selected such that the source electrode SE and the electron supply layer ES, and the drain electrode DE and the electron supply layer ES are in ohmic contact.

Next, a p-type cap layer CAP composed of, for example, p-type gallium nitride (p-GaN) is formed on the electron supply layer ES positioned between the source electrode SE and the drain electrode DE separated from each other, and a gate electrode GE is formed on the p-type cap layer CAP.

In the high electron mobility transistor in the related art thus configured, a two-dimensional electron gas 2DEG is produced in the vicinity of an interface between the channel layer CH and the electron supply layer ES. That is, the electron affinity of the gallium nitride (GaN) constituting the channel layer CH and the electron affinity of aluminum gallium nitride (AlGaN) differ from each other. Therefore, due to a conduction band offset based on the difference in electron affinity, and the influence of piezoelectric polarization and spontaneous polarization existing in the channel layer CH and the electron supply layer, a well-type potential lower than the Fermi level is produced in the vicinity of the interface between the channel layer CH and the electron supply layer ES. As a result, electrons are accumulated in the well-type potential, and thus the two-dimensional electron gas 2DEG is produced in the vicinity of the interface between the channel layer CH and the electron supply layer ES.

Here, in the high electron mobility transistor shown in FIG. 1, since the p-type cap layer CAP is formed below the gate electrode GE, the threshold voltage can be made positive, that is, the high electron mobility transistor can constitute a normally-off device. Here, if the p-type cap layer CAP is absent and the gate electrode GE is formed directly on the electron supply layer ES, the threshold voltage becomes negative, that is, the high electron mobility transistor results in a normally-on device. Since a transistor for power control is required to be a normally-off device, the structure in FIG. 1 where the p-type cap layer CAP has been formed below the gate electrode GE has been suggested.

When a nitride semiconductor is used for the channel layer CH and the electron supply layer ES, in addition to the well-type potential due to the conduction band offset between the channel layer CH and the electron supply layer ES, the piezoelectric polarization and the spontaneous polarization due to the usage of the nitride semiconductor lower the bottom of the well-type potential. As a result, if the p-type cap layer CAP is absent, even without voltage application to the gate electrode GE, the two-dimensional electron gas 2DEG is generated in the vicinity of the interface between the channel layer CH and the electron supply layer ES. As a result, the high electron mobility transistor results in a normally-on device.

On the other hand, in the case of the configuration in FIG. 1 where the p-type cap layer CAP is formed below the gate electrode GE, negative charges due to ionization of acceptors of the p-type cap layer CAP raise the conduction band of the electron supply layer ES. As a result, in thermal equilibrium, the two-dimensional electron gas can be prevented from being formed in the channel layer CH. Thus, the transistor having the configuration shown in FIG. 1 can realize a normally-off device.

However, if a positive voltage is applied to the gate electrode GE and the carrier concentration of the two-dimensional electron gas 2DEG generated in the vicinity of the interface between the channel layer CH and the electron supply layer ES is increased in order to turn on the high electron mobility transistor, a leakage current occurs from the gate electrode GE to the channel layer CH. The presence of the gate leakage current limits the maximum carrier concentration of the two-dimensional electron gas 2DEG accumulated in the channel layer CH. The limitation of the maximum carrier concentration of the two-dimensional electron gas 2DEG means that the amount of carriers contributing as a channel current is limited, which makes it difficult to reduce the on-resistance. That is, the high electron mobility transistor in the related art has room for improvement in terms of reducing the on-resistance sufficiently with the normally-off operation maintained.

Figure 2:
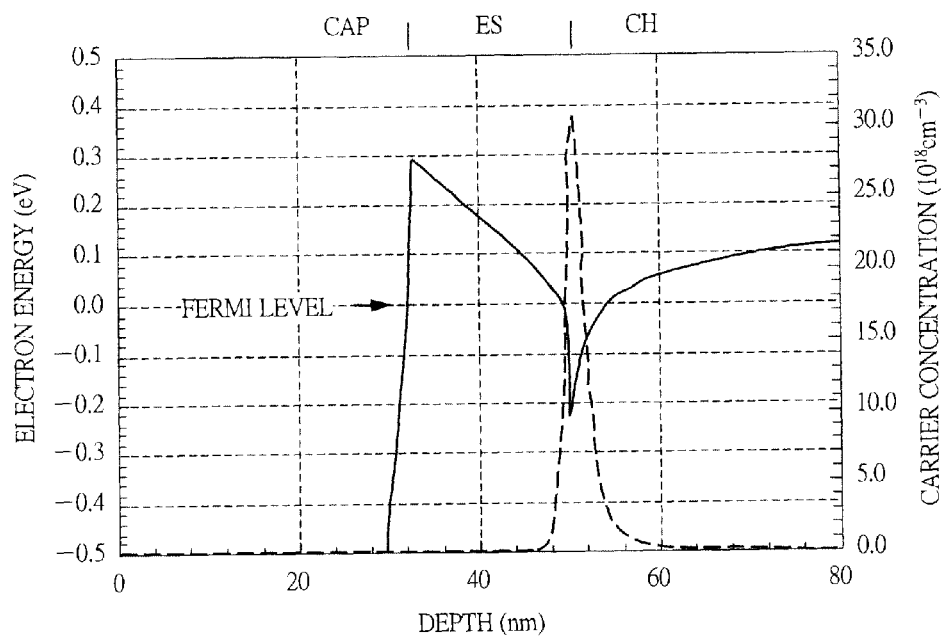
FIG. 2 is a graph showing calculation results of a conduction band energy distribution (solid line) and a carrier concentration distribution (broken line) immediately beneath a gate electrode, in the high electron mobility transistor according to the related art.

The details of this problem will be further described below. FIG. 2 is a graph showing calculation results of a conduction band energy distribution (solid line) and a carrier concentration distribution (broken line) immediately beneath the gate electrode, in the high electron mobility transistor according to the related art. In FIG. 2, the horizontal axis represents the depth (nm) from the gate electrode GE. Similarly, the left-sided vertical axis represents the electron energy (eV), namely, the conduction band energy, and the right-sided vertical axis represents the carrier concentration ($10^{18}$ cm$^{-3}$). In FIG. 2, a region up to about 30 nm in depth is the p-type cap layer CAP, and a region from about 30 nm to about 50 nm in depth is the electron supply layer ES. A region equal to or more than 50 nm in depth is the channel layer CH. Here, the impurity concentration in the p-type cap layer CAP is about $5 \times 10^{18}$ cm$^{-3}$, for example, and the aluminum composition of aluminum gallium nitride (AlGaN) constituting the electron supply layer ES is 0.22.

FIG. 2 shows that a positive voltage has been applied to the gate electrode GE, from which it can be seen that the carrier concentration in the vicinity of the interface between the channel layer CH and the electron supply layer ES is high. That is, as shown in FIG. 2, it can be seen that when a positive voltage is applied to the gate electrode GE, the two-dimensional electron gas is accumulated in the vicinity of the interface between the channel layer CH and the electron supply layer ES. Specifically, the carrier concentration (area density) of the two-dimensional electron gas obtained by integrating the carrier concentration shown in FIG. 2 in the depth direction is about $1 \times 10^{13}$ cm$^{-2}$.

Thus, in a bias condition where sufficient carriers (electrons) are induced in the channel layer CH, the conduction band of the p-type cap layer CAP has energy lower than the Fermi level in the channel layer CH. On the other hand, the conduction band of the electron supply layer ES composed of aluminum gallium nitride (AlGaN) has energy higher than the Fermi level in the channel layer CH. Therefore, the conduction band of the electron supply layer ES forms a potential barrier against the two-dimensional electron gas formed in the channel layer CH. At this time, if the gate voltage applied to the gate electrode GE is increased in a positive direction and the carrier concentration is increased, the potential barrier lowers. Therefore, as the gate voltage applied to the gate electrode GE increases, some electrons in the two-dimensional electron gas get over the lowered potential barrier, and flow to the side of the gate electrode. It is thought that this results in the gate leakage current flowing from the gate electrode GE to the channel layer CH.

Figure 3:
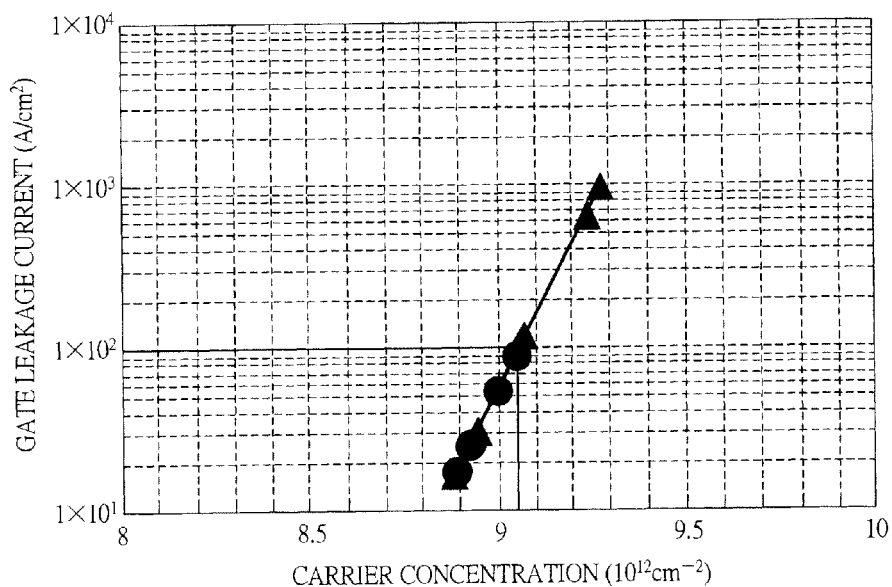
FIG. 3 shows calculation results showing a relationship between a gate leakage current and a carrier concentration of a two-dimensional electron gas.

The result of calculation of the gate leakage current is shown below. FIG. 3 shows calculation results showing a relationship between the gate leakage current and the carrier concentration of the two-dimensional electron gas. In FIG. 3, the horizontal axis represents the carrier concentration of the two-dimensional electron gas ($10^{12}$ cm$^{-2}$), and the vertical axis represents the gate leakage current (A/cm$^2$). FIG. 3 shows a case where the p-type cap layer CAP (the p-type impurity concentration is $5\times10^{19}$ cm$^{-3}$) is used as a cap layer and a case where an undoped cap layer is used. Specifically, the black circles in FIG. 3 represent the case of using the p-type cap layer CAP, and the black triangles represent the case of using the undoped cap layer.

As shown in FIG. 3, it can be seen that when the carrier concentration of the two-dimensional electron gas is constant, the gate leakage currents take constant values regardless of the impurity concentration of the cap layer. Similarly, it can be seen from the experiment that the relationship between the gate leakage current and the carrier concentration of the two-dimensional electron gas does not depend on the thickness of the cap layer, either. These results confirm the fact that the layer forming the potential barrier against the two-dimensional electron gas is the electron supply layer ES but not the cap layer. From the above result of analysis by the present inventors, the maximum carrier concentration of the two-dimensional electron gas defined under the condition that the gate leakage current reaches a predetermined value (1 mA/mm) is estimated to be about $9\times10^{12}$ cm$^{-2}$ (see FIG. 3). This value does not change even if the impurity concentration or thickness of the cap layer is changed. Therefore, it can be seen that it is effective to add inventiveness to the electron supply layer constituting the potential barrier, not the cap layer, in order to suppress the gate leakage current.

As described above, in the high electron mobility transistor in the related art, when a positive voltage is applied to the gate electrode to increase the carrier concentration of the two-dimensional electron gas, the gate leakage current occurs. This limits the maximum carrier concentration of the two-dimensional electron gas that can be accumulated in the channel layer CH. As a result, in the high electron mobility transistor in the related art, there is a room for improvement in terms of reducing the on-resistance sufficiently with the normally-off operation maintained. Therefore, in the first embodiment, inventiveness for improving this point is added. Specifically, in the first embodiment, even in a bias condition where a positive voltage is applied to the gate electrode GE, the gate leakage current is suppressed, and consequently the on-resistance can be reduced with the normally-off operation maintained. The technical idea in the first embodiment to which this inventiveness is added will be described.

<Summary of the First Embodiment>

Figure 4:
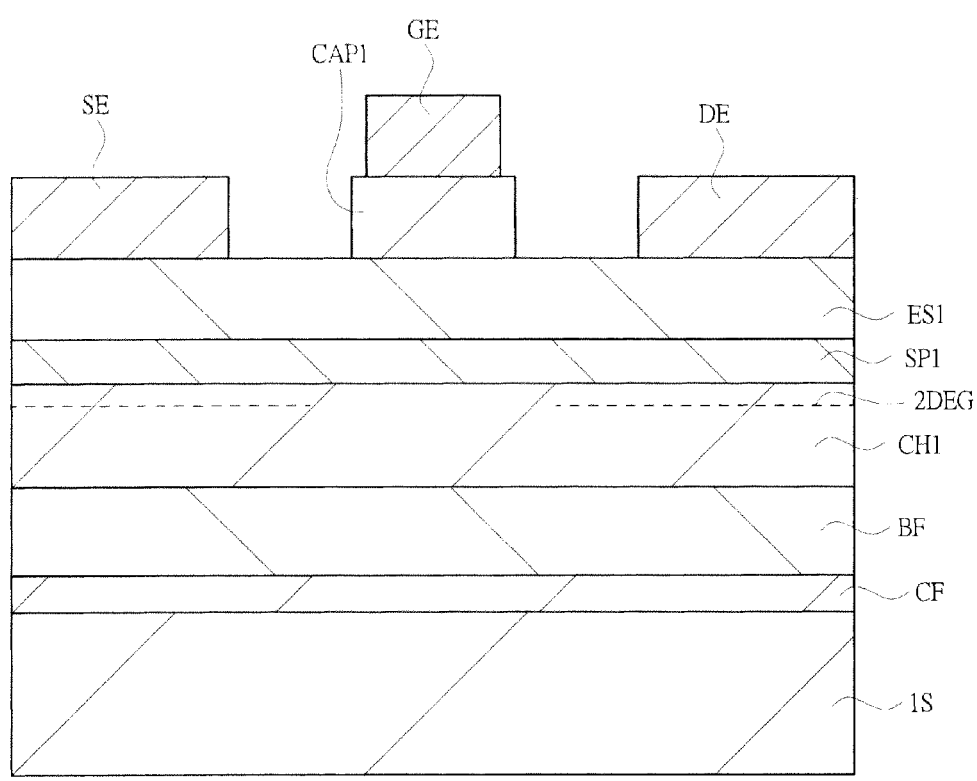
FIG. 4 is a sectional view showing the configuration of a high electron mobility transistor in a first embodiment.

In the first embodiment, as shown in FIG. 4, a channel layer CH1, a spacer layer SP1, and an electron supply layer ES1 are formed of group III-nitride semiconductor materials in this order, respectively. On the electron supply layer ES1, the source electrode SE and the drain electrode DE, which are electrically connected to the channel layer CH1, are disposed so as to be separated from each other. On the electron supply layer ES1 sandwiched between the source electrode SE and the drain electrode DE, the gate electrode GE is formed via a p-type cap layer CAP1 selectively formed. According to the high electron mobility transistor in the first embodiment thus configured, the band gap of the spacer layer SP1 is larger than the band gap of the electron supply layer ES1. This point is a feature of the first embodiment.

Consequently, according to the high electron mobility transistor in the first embodiment, since negative charges are produced in the p-type cap layer CAP1 due to ionization of acceptors, the position of the conduction band of the p-type cap layer CAP1 is raised. As a result, the channel layer CH1 under the gate electrode GE is depleted, so that a normally-off operation becomes possible. In the first embodiment, due to the fact that the band gap of the spacer layer SP1 is large, a high potential bather (electron barrier) is formed in the vicinity of the interface between the channel layer CH1 and the electron supply layer ES1. Consequently, according to the high electron mobility transistor in the first embodiment, the high potential bather significantly suppresses the gate leakage current. Therefore, according to the high electron mobility transistor in the first embodiment, the maximum carver concentration of a two-dimensional electron gas accumulated in the channel layer CH1 increases, so that such a remarkable advantageous effect as allowing the on-resistance of the high electron mobility transistor in the first embodiment to be sufficiently reduced can be obtained. Further, since the maximum carrier concentration (channel electron concentration) of the two-dimensional electron gas increases, transconductance gm is improved, so that device characteristic can be enhanced.

<Configuration of Semiconductor Device>

A detailed configuration of a semiconductor device in the first embodiment will be described below. FIG. 4 is a sectional view showing the configuration of the high electron mobility transistor (semiconductor device) in the first embodiment. As shown in FIG. 4, in the high electron mobility transistor in the first embodiment, a nucleation layer CF composed of a superlattice of alternate layers of undoped aluminum nitride (AlN) and undoped gallium nitride (GaN), for example, is formed on a semiconductor substrate 1S composed of silicon (Si), for example. For example, the thickness of the nucleation layer CF is 200 nm. A buffer layer BF composed of undoped gallium nitride (GaN), for example, is formed on the nucleation layer CF. The surface of the buffer layer BF is a (0001) Ga plane. The film thickness of the buffer layer BF is 1 μm, for example. A channel layer CH1 composed of undoped gallium nitride (GaN), for example, is formed on the (0001) Ga plane of the buffer layer BF. The film thickness of the channel layer CH is 50 nm, for example.

Here, the nucleation layer CF and the buffer layer BF are formed for the purpose of relaxing mismatch between lattice spacing of silicon (Si) constituting the semiconductor substrate 1S and lattice spacing of gallium nitride (GaN) constituting the channel layer CH1. That is, if the channel layer CH1 composed of gallium nitride (GaN) is formed directly on the semiconductor substrate 1S composed of silicon, due to lattice strains, a lot of crystal defects are formed in the channel layer CH, which causes the performance of the high electron mobility transistor to degrade. This is why the nucleation layer CF and the buffer layer BF for the purpose of lattice relaxation are interposed between the semiconductor substrate 1S and the channel layer CH. Forming the nucleation layer CF and the buffer layer BF can improve the quality of the channel layer CH1 formed on the buffer layer BF, thereby improving the performance of the high electron mobility transistor.

Then, a spacer layer SP1 composed of undoped $Al_xGa_{1-x}N$, for example, is formed on the channel layer CH1. The film thickness of the spacer layer SP1 is 1 nm, for example. An electron supply layer ES1 composed of undoped $Al_yGa_{1-y}N$, for example, is formed on the spacer layer SP1. The film thickness of the electron supply layer ES1 is 14 nm, for example. A source electrode SE and a drain electrode DE are formed on the electron supply layer ES1 so as to be separated from each other. The materials of the source electrode SE and the drain electrode DE are selected such that the source electrode SE and the electron supply layer ES1, or the drain electrode DE and the electron supply layer ES1 are in ohmic contact.

Next, a p-type cap layer CAP1 composed of p-type $Al_zGa_{1-z}N$ ($0 \le z \le 1$), for example, is formed on the electron supply layer ES1 positioned between the source electrode SE and the drain electrode DE separated from each other, and a gate electrode GE is formed on the p-type cap layer CAP1. The impurity concentration of the p-type cap layer CAP1 is $5 \times 10^{18}/cm^3$, for example, and the film thickness of the p-type cap layer CAP1 is 30 nm, for example.

The semiconductor layer structure composed of the buffer layer BF, the channel layer CH1, the spacer layer SP1, the electron supply layer ES1, and the p-type cap layer CAP1 is formed by group-III plane growth of deposition in the direction of a [0001] crystal axis (C axis). That is, the respective surfaces (on the side of the gate electrode GE) of the buffer layer BF, the channel layer CH1, the spacer layer SP1, the electron supply layer ES1, and the p-type cap layer CAP1 are (0001) group-III planes (sometimes simply called (0001) planes). For example, the interface between the spacer layer SP1 and the electron supply layer ES1 is a (0001) group-III plane.

Figure 5:
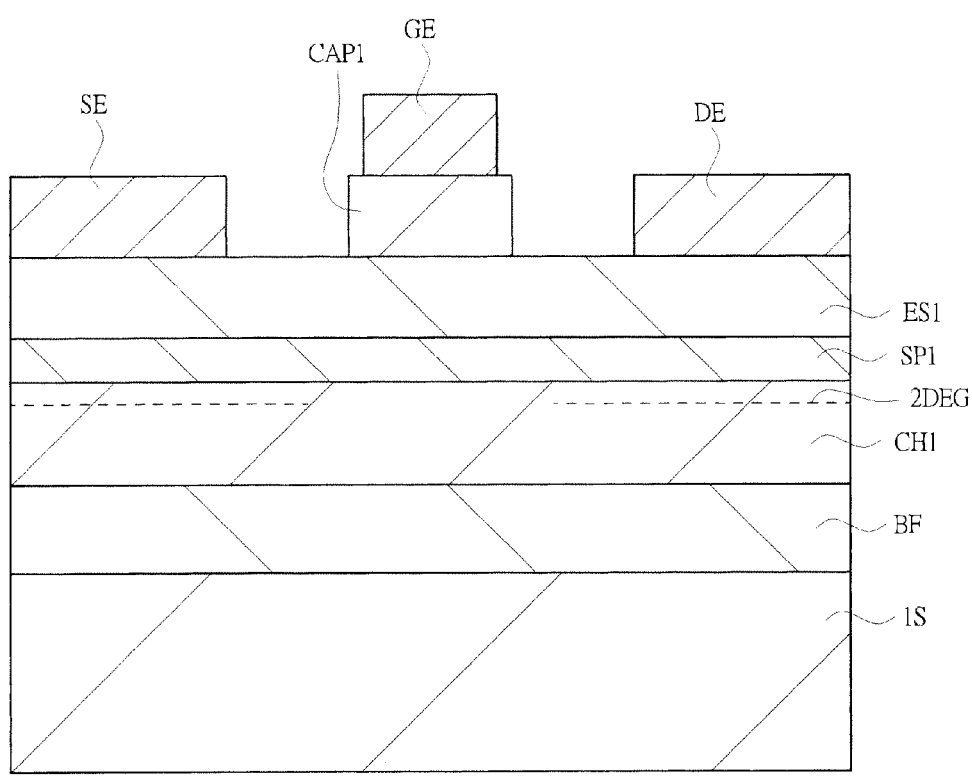
FIG. 5 is a sectional view showing the configuration of a high electron mobility transistor in another aspect.

It should be noted that in FIG. 4, the example of using the semiconductor substrate 1S composed of silicon (Si), for example, has been described, but it is also possible to use a semiconductor substrate 1S composed of gallium nitride (GaN). FIG. 5 is a sectional view showing the configuration of a high electron mobility transistor using the semiconductor substrate 1S composed of gallium nitride (GaN). The configuration of the high electron mobility transistor shown in FIG. 5 is almost identical to the configuration of the high electron mobility transistor shown in FIG. 4. A difference therebetween is that in the high electron mobility transistor shown in FIG. 5 the buffer layer BF composed of undoped gallium nitride (GaN), for example, is formed directly on the semiconductor substrate 1S composed of gallium nitride (GaN). That is, in the high electron mobility transistor shown in FIG. 5, since the semiconductor substrate 1S and the buffer layer BF are both composed of gallium nitride (GaN), there is no need to eliminate lattice mismatch between the semiconductor substrate 1S and the buffer layer BF. In other words, in the high electron mobility transistor shown in FIG. 5, since there is no need to take into account lattice relaxation for solving lattice mismatch between the semiconductor substrate 1S and the channel layer CH1, the nucleation layer CF, which is essential in the high electron mobility transistor shown in FIG. 4, is not provided. Thus, the configurations shown in FIGS. 4 and 5 are possible configurations of the high electron mobility transistor in the first embodiment, and the technical idea in the first embodiment is applicable to both the configurations. A feature in the first embodiment will be described below.

<Feature of First Embodiment>

A feature in the first embodiment lies in that the spacer layer SP1 whose band gap is larger than the band gap of the electron supply layer ES1 is provided between the channel layer CH1 and the electron supply layer ES1, as shown in FIGS. 4 and 5. Thereby, due to the fact that the band gap of the spacer layer SP1 is large, a high potential barrier (electron barrier) is formed in the vicinity of the interface between the channel layer CH and the electron supply layer ES1. That is, a higher potential barrier is formed when the spacer layer SP1 is provided than when the spacer layer SP1 is not provided. As a result, according to the high electron mobility transistor in the first embodiment, the high potential barrier significantly suppresses the gate leakage current. Therefore, according to the high electron mobility transistor in the first embodiment, the maximum carrier concentration of the two-dimensional electron gas accumulated in the channel layer CH1 increases, so that the on-resistance of the high electron mobility transistor in the first embodiment can be sufficiently reduced.

Specifically, in the first embodiment, the spacer layer SP1 is formed of undoped $Al_xGa_{1-x}N$ (including AlN when x=1), and the electron supply layer ES1 is formed of undoped $Al_yGa_{1-y}N$. Then, the condition that the band gap of the spacer layer SP1 becomes larger than the band gap of the electron supply layer ES1 will be described below.

First, a band gap Eg of $Al_rGa_{1-r}N$ can be approximately expressed by the following expression (1), for example.

$$Eg(Al_rGa_{1-r}N) = 3.4 + 2.8r \quad (1)$$

From the expression (1), it can be seen that the band gap becomes larger as the Al composition ratio r of aluminum gallium nitride ($Al_rGa_{1-r}N$) increases. Therefore, if the Al composition ratio x of the spacer layer SP1 and the Al composition ratio y of the electron supply layer ES1 are set so as to satisfy an inequality (2), the band gap of the spacer layer SP1 becomes larger than the band gap of the electron supply layer ES1.

$$y < x \quad (2)$$

Thus, by forming the spacer layer SP1 and the electron supply layer ES1 such that the composition ratio x of the spacer layer SP1 and the composition ratio y of the electron supply layer ES1 satisfy the inequality (2), a potential barrier, which is higher than a potential barrier when the spacer layer SP1 is not provided, can be formed when the spacer layer SP1 is provided. As a result, the high potential barrier significantly suppresses the gate leakage current, so that the maximum carrier concentration of the two-dimensional electron gas accumulated in the channel layer CH1 increases, which enables the on-resistance of the high electron mobility transistor in the first embodiment to be sufficiently reduced.

Figure 6:
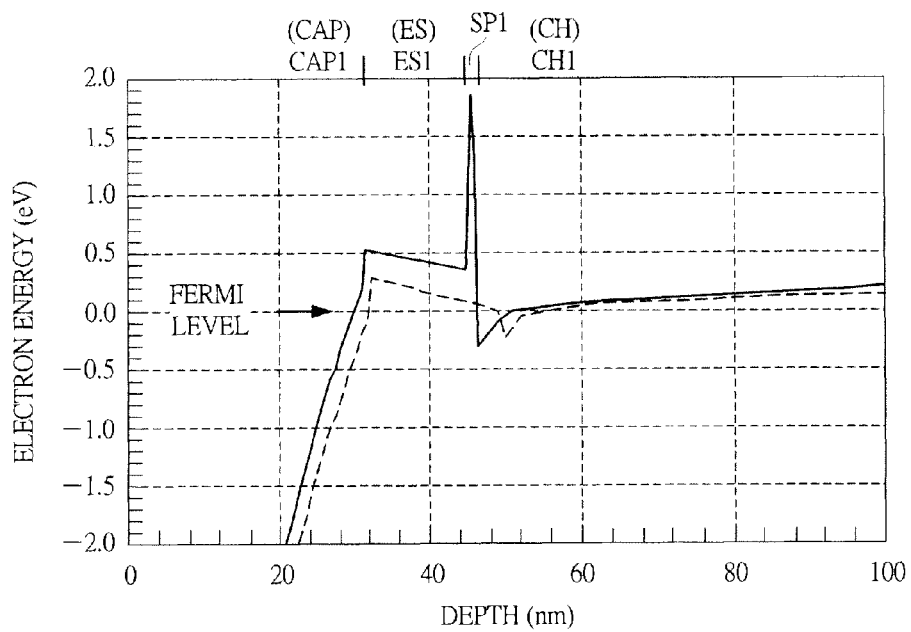
FIG. 6 is a graph showing conduction band energy distributions beneath a gate electrode, in the high electron mobility transistor according to the first embodiment, and in the high electron mobility transistor according to the related art.

FIG. 6 is a graph showing conduction band energy distributions beneath the gate electrode GE, in the high electron mobility transistor according to the first embodiment, and in the high electron mobility transistor according to the related art. In FIG. 6, the composition ratio of the spacer layer SP1 x=1, and the composition ratio of the electron supply layer ES1 y=0.22, for example. In other words, the spacer layer SP1 is composed of aluminum nitride (AlN), and the electron supply layer ES1 is composed of $Al_{0.22}Ga_{0.78}N$.

In FIG. 6, the horizontal axis represents the depth (nm) from the gate electrode GE, and the vertical axis represents the electron energy (eV). In FIG. 6, in the high electron mobility transistor in the first embodiment, a region up to about 30 nm in depth is the p-type cap layer CAP1, and a region from about 30 nm to about 44 nm in depth is the electron supply layer ES1. A region equal to or more than 45 nm in depth is the channel layer CH1, and the spacer layer SP1 is formed between the electron supply layer ES1 and the channel layer CH1. On the other hand, in the high electron mobility transistor in the related art, a region up to about 30 nm in depth is the p-type cap layer CAP, and a region from about 30 nm to about 50 nm in depth is the electron supply layer ES. A region equal to or more than 50 nm in depth is the channel layer CH. Here, the impurity concentrations of the p-type cap layer CAP1 and the p-type cap layer CAP are about $5 \times 10^{18}$ cm$^{-3}$, for example, and the aluminum composition ratios of aluminum gallium nitride (AlGaN) constituting the electron supply layer ES1 and the electron supply layer ES are 0.22.

FIG. 6 shows the state that a positive voltage has been applied to the gate electrode GE. It can be seen that at this time, in the high electron mobility transistor in the first embodiment, a well-type potential is formed in the vicinity of the interface between the channel layer CH1 and the spacer layer SP1, and the carrier concentration in the well-type potential becomes high. That is, it can be seen that, as shown in FIG. 6, when a positive voltage is applied to the gate electrode GE, the two-dimensional electron gas is accumulated in the vicinity of the interface between the channel layer CH1 and the spacer layer SP1 (solid line). On the other hand, it can be seen that in the high electron mobility transistor in the related art, a well-type potential is formed in the vicinity of the interface between the channel layer CH and the electron supply layer ES, and the carrier concentration in the well-type potential becomes high. That is, it can be seen that, as shown in FIG. 6, when a positive voltage is applied to the gate electrode GE, the two-dimensional electron gas is accumulated in the vicinity of the interface between the channel layer CH and the electron supply layer ES (broken line).

Here, first, attention will be focused on the high electron mobility transistor in the related art. As represented in the broken line in FIG. 6, in the related art, the potential barrier due to the electron supply layer ES is formed. It can be seen that the height of this potential barrier is as low as about 0.3 eV. Therefore, it is thought that some electrons of the two-dimensional electron gas accumulated in the well-type potential in the vicinity of the interface between the channel layer CH and the electron supply layer ES can get over the potential barrier easily to flow to the side of the gate electrode GE. It is supposed that this results in an increase in the gate leakage current flowing from the gate electrode GE toward the channel layer CH. Therefore, the maximum carrier concentration of the two-dimensional electron gas that can be accumulated in the channel layer CH is limited. From this, the high electron mobility transistor in the related art has a room for improvement in terms of reducing the on-resistance sufficiently with the normally-off operation maintained.

Then, attention is focused on the high electron mobility transistor in the first embodiment. As represented in the solid line in FIG. 6, it can be seen that in the first embodiment, the potential barrier due to the electron supply layer ES1 and the potential barrier due to the spacer layer SP1 are formed. It can be seen that at this time, the potential barrier due to the electron supply layer ES1 is approximately equal to the potential barrier of the electron supply layer ES in the related art, but that the potential barrier due to the spacer layer SP1 is remarkably high. This is due to the fact that the conduction band offset between aluminum nitride (AlN) constituting the spacer layer SP1 and gallium nitride (GaN) constituting the channel layer CH1 is as large as about 1.9 eV. Further, an internal electric field caused by piezoelectric polarization and spontaneous polarization is also generated within the aluminum nitride (AlN) constituting the spacer layer SP1. Therefore, according to a synergetic effect of the above large conduction band offset and the above internal electric field, the potential barrier having a height of 2 eV or more is formed in the vicinity of the interface of the channel layer CH1.

From this, it is supposed that it becomes difficult for part of the two-dimensional electron gas accumulated in the well-type potential in the vicinity of the interface between the channel layer CH1 and the spacer layer SP1 to get over the high potential barrier. This means that the gate leakage current flowing from the gate electrode GE toward the channel layer CH1 is sufficiently reduced. As a result, according to the high electron mobility transistor in the first embodiment, the maximum carrier concentration of the two-dimensional electron gas accumulated in the channel layer CH1 increases, so that such a remarkable effect as allowing the on-resistance of the high electron mobility transistor in the first embodiment to be reduced sufficiently can be obtained.

Specifically, the fact that the gate leakage current can be significantly reduced according to the high electron mobility transistor in the first embodiment, as compared with the high electron mobility transistor in the related art, will be described.

Figure 7:
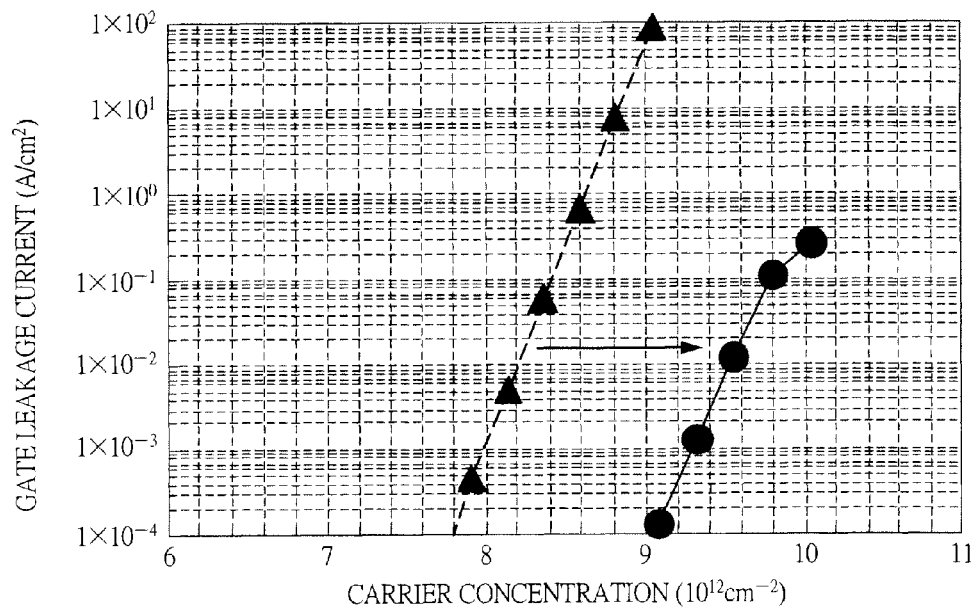
FIG. 7 is calculation results showing relationships between a gate leakage current and a carrier concentration of a two-dimensional electron gas, in the high electron mobility transistor in the first embodiment, and in the high electron mobility transistor according to the related art.

FIG. 7 is calculation results showing relationships between the gate leakage current and the carrier concentration of the two-dimensional electron gas, in the high electron mobility transistor in the first embodiment, and in the high electron mobility transistor according to the related art. In FIG. 7, the horizontal axis represents the carrier concentration ($10^{12}$ $cm^{-2}$) of the two-dimensional electron gas, and the vertical axis represents the gate leakage current ($A/cm^2$). The solid line in FIG. 7 represents the first embodiment, and the broken line in FIG. 7 represents the related art. As shown in FIG. 6, the high electron mobility transistor in the first embodiment has a high potential barrier (the height is 2 eV or more) in the vicinity of the interface between the channel layer CH1 and the spacer layer SP1. Therefore, as shown in FIG. 7, it can be seen that at the same carrier concentration of the two-dimensional electron gas, the gate leakage current in the first embodiment is suppressed by as much as about six orders of magnitude, as compared with the gate leakage current in the related art. For example, in terms of the position of a carrier concentration of the two-dimensional electron gas of $9 \times 10^{12}$ $cm^{-1}$, the gate leakage current in the related art is $1 \times 10^2$ ($A/cm^2$), whereas the gate leakage current in the first embodiment is $1 \times 10^{-4}$ ($A/cm^2$).

From this, it can be seen that FIG. 7 specifically shows that according to the high electron mobility transistor in the first embodiment, the maximum carrier concentration of the two-dimensional electron gas accumulated in the channel layer CH1 increases, so that the on-resistance of the high electron mobility transistor in the first embodiment can be reduced sufficiently.

Thus, the first embodiment has the configuration where the spacer SP1 whose band gap is larger than the band gap of the electron supply layer ES1 is interposed. Therefore, the mechanism that a high potential barrier of about 2 eV is formed in the vicinity of the interface of the channel layer CH1 can reduce the gate leakage current, and ultimately can sufficiently reduce the on-resistance of the high electron mobility transistor in the first embodiment.

Further, in the first embodiment, it is also possible to use another mechanism, not the above mechanism, to reduce the on-resistance of the high electron mobility transistor, and therefore such another mechanism will also be described. For example, in the related art, the two-dimensional electron gas is produced in the vicinity of the interface between the electron supply layer ES and the channel layer CH, and electrons constituting the two-dimensional electron gas travel along the interface between the electron supply layer ES and the channel layer CH. At this time, the electron supply layer ES is formed of aluminum gallium nitride (AlGaN), and thus the electron supply layer ES is composed of a ternary mixed crystal semiconductor material. In aluminum gallium nitride (AlGaN) that is a ternary mixed crystal semiconductor material, aluminum atoms (Al atoms) and gallium atoms (Ga atoms) are randomly arranged. Therefore, the electrons travelling along the interface of the electron supply layer ES are reduced in electron mobility by alloy scattering due to the random arrangement of the aluminum atoms (Al atoms) and the gallium atoms (Ga atoms). As a result, in the high electron mobility transistor in the related art, the reduction in electron mobility causes an increase in on-resistance.

On the other hand, in the first embodiment, the two-dimensional electron gas is produced in the vicinity of the interface between the spacer layer SP1 and the channel layer CH1, and electrons constituting the two-dimensional electron gas travel along the interface between the spacer layer SP1 and the channel layer CH1. At this time, in the first embodiment, aluminum nitride (AlN) is used as the spacer layer SP1. In this case, the electrons constituting the two-dimensional electron gas travel along the vicinity of the interface between aluminum nitride (AlN) that is a binary compound semiconductor material and the channel layer CH1. Since the aluminum nitride (AlN) is a binary compound semiconductor material, the alloy scattering due to the random arrangement of the aluminum atoms (Al atoms) and the gallium atoms (Ga atoms) is suppressed, unlike aluminum gallium nitride (AlGaN) that is a ternary mixed crystal semiconductor material. Therefore, according to the high electron mobility transistor in the first embodiment, the electron mobility can be improved, so that the on-resistance can be sufficiently reduced.

From the above, according to the high electron mobility transistor in the first embodiment, since the spacer layer SP1 whose band gap is larger than the band gap of the electron supply layer ES1 is interposed, a first mechanism is present that a high potential barrier is formed in the vicinity of the interface of the channel layer CH1. In addition, according to the high electron mobility transistor in the first embodiment, since aluminum nitride (AlN) that is a binary compound semiconductor material is used as the spacer layer, a second mechanism is present that the alloy scattering is suppressed and thus the electron mobility is improved. Therefore, according to the first embodiment, reduction in gate leakage current and improvement in electron mobility can be achieved by a synergetic effect of the above first mechanism and second mechanism. From this, according to the high electron mobility transistor in the first embodiment, such a remarkable advantageous effect that a significant reduction in on-resistance can be achieved can be provided by a synergetic effect of the effect of increasing the maximum carrier concentration of the two-dimensional electron gas due to the reduction in gate leakage current and the improvement in electron mobility. Thus, according to the first embodiment, the performance of the semiconductor device can be improved.

Here, a feature of the first embodiment lies in that the spacer layer SP1 having a large band gap is interposed between the electron supply layer ES1 and the channel layer CH1 so that a high potential barrier is formed between the channel layer CH1 and the p-type cap layer CAP1 (gate electrode GE). Therefore, it can also be thought that the electron supply layer ES1 itself is replaced with the spacer layer SP1, instead of interposing the spacer layer SP1 between the electron supply layer ES1 and the channel layer CH1. Even in this case, it can be thought that the gate leakage current can be reduced, since a high potential barrier can be formed between the channel layer CH1 and the p-type cap layer CAP1 (gate electrode GE).

However, if the configuration where the electron supply layer ES1 itself is replaced with the spacer layer SP1 is adopted, the threshold voltage of the high electron mobility transistor shifts to the negative side, so that it becomes difficult to realize a normally-off device. That is, since an object of the first embodiment is to reduce the on-resistance with the normally-off operation maintained, a configuration that the normally-off operation becomes difficult needs to be avoided.

The fact will be described below that the threshold voltage of the high electron mobility transistor shifts to the negative side when the configuration where the electron supply layer ES1 itself is replaced with the spacer layer SP1 is adopted. That is, a comparison will be made between the configuration where the electron supply layer ES1 itself is composed of aluminum nitride (AlN) and the spacer layer SP1 is not introduced and the configuration of the first embodiment.

First, a semiconductor layer structure composed of the buffer layer BF, the channel layer CH1, the spacer layer SP1, and the electron supply layer ES1 is formed by group-III plane growth of deposition in the direction of a crystal axis (C axis). That is, the channel layer CH1 is formed on a (0001) Ga plane of the buffer layer BF, and the spacer layer SP1 is formed on a (0001) plane of the channel layer CH1. The electron supply layer ES1 is formed on a (0001) plane of the spacer layer SP1. An interface of the spacer layer SP1 between the same and the electron supply layer ES1 is a (0001) group-III plane.

In this case, based on spontaneous polarization and piezoelectric polarization, polarization charges are generated at upper and lower interfaces of each semiconductor layer. The area density of the polarization charges is $6.4 \times 10^{13}$ cm$^{-2}$ for aluminum nitride (AlN) constituting the spacer layer SP1, and $1.2 \times 10^{13}$ cm$^{-2}$ for aluminum gallium nitride ($Al_{0.22}Ga_{0.78}N$) constituting the electron supply layer ES1. That is, the area density of the polarization charges generated in the spacer layer SP1 is higher than the area density of the polarization charges generated in the electron supply layer ES1. The polarity of the polarization charges in the case of group-III plane growth is negative on the surface side and positive on the back surface side. That is, the polarity of the polarization charges generated in the spacer layer SP1 is negative on the surface side and positive on the back surface side, and the polarity of the polarization charges generated in the electron supply layer ES1 is also negative on the surface side and positive on the back surface side.

In the first embodiment, such a structure that the spacer layer SP1 and the electron supply layer ES1 are interposed between the cap layer CAP1 and the channel layer CH1 is adopted, and the Al composition ratio of the electron supply layer ES1 is lower than the Al composition ratio of the spacer layer SP1. Therefore, an average Al composition ratio between the cap layer CAP1 and the channel layer CH1 can be made lower than the Al composition ratio of the spacer layer SP1. On the other hand, in FIG. 1, if the electron supply layer ES having the same Al composition ratio as the spacer layer SP1 is formed between the cap layer CAP and the channel layer CH, the Al composition ratio between the chap layer CAP and the channel layer CH becomes high. Since a higher Al composition ratio makes the polarization charge quantity larger, a large quantity of positive polarization charges is formed on the back surface side of the electron supply layer ES1, namely, on the side of the channel layer CH, as compared with the first embodiment. As a result, the conduction band in the vicinity of the interface between the electron supply layer ES and the channel layer CH lowers and the two-dimensional electron gas concentration increases, so that the threshold voltage becomes negative. As described above, in view of maintaining the normally-off operation, the configuration where the electron supply layer ES1 itself is replaced with the spacer layer SP1 cannot be said to be desired.

Therefore, in the first embodiment, in order to minimize the shift of the threshold voltage toward the negative side while ensuring a high potential barrier due to the spacer layer SP1, not the configuration where the electron supply layer ES1 itself is replaced with the spacer layer SP1 but the configuration where the thin spacer layer SP1 is interposed between the electron supply layer ES1 and the channel layer CH1 is adopted. In this regard, even when the configuration where the spacer layer SP1 is interposed between the electron supply layer ES1 and the channel layer CH1 is adopted, the Al composition ratio of the spacer layer SP1 is high, so that positive polarization charges are generated on the channel layer CH1 side of the spacer layer SP1. Therefore, the conduction band in the vicinity of the interface between the channel layer CH1 and the spacer layer SP1 is lowered, and there is the effect of shifting the threshold voltage toward the negative side, as compared with the case where the spacer layer SP1 is not interposed. In the first embodiment, however, the average AL composition ratio of the spacer layer SP1 and the electron supply layer ES1 hardly increases, so that the reduction in threshold voltage can be made small. Further, it can be thought that the influence of the spacer layer SP1 having a high area density of the polarization charges is reduced relatively by thinning the film thickness of the spacer layer SP1, and therefore, in the configuration where the spacer layer SP1 is interposed between the electron supply layer ES1 and the channel layer CH1, such as shown in the first embodiment, the shift of the threshold voltage toward the negative side can be minimized, so that the normally-off operation can be maintained. Hence, in view of maintaining the normally-off operation, for example, it can be said that it is preferred that the film thickness of the spacer layer SP1 interposed between the electron supply layer ES1 and the channel layer CH1 be thinner than the film thickness of the electron supply layer ES1.

Also in the first embodiment, like the related art, negative charges are produced in the p-type cap layer CAP1 due to ionization of acceptors. Therefore, by adjusting, if necessary, the film thickness of the electron supply layer ES1, in thermal equilibrium, the channel layer CH1 under the gate electrode GE is depleted, so that the normally-off operation whose threshold voltage is a positive voltage can be realized.

Figure 8:
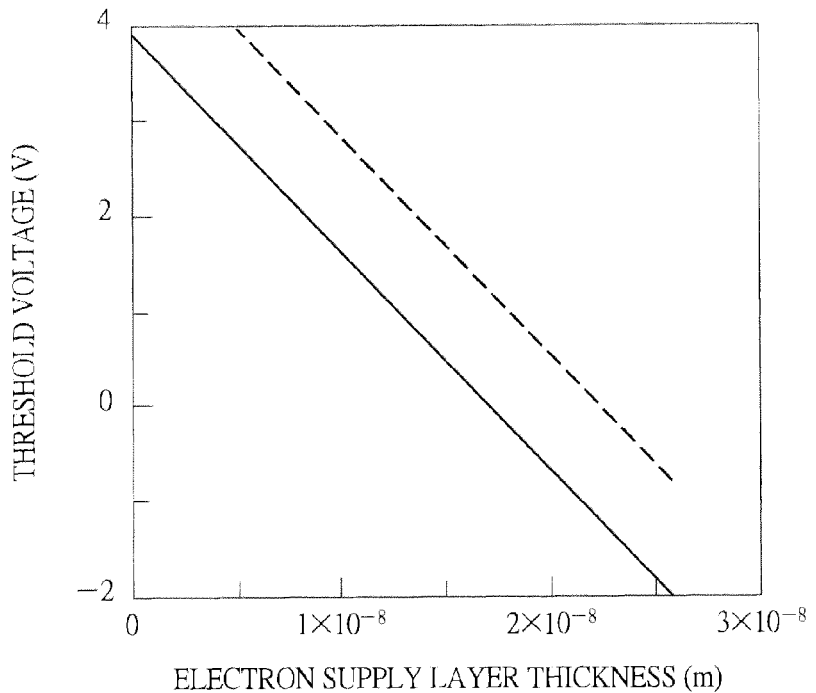
FIG. 8 is a graph showing numerical simulation results showing film thickness dependence of an electron supply layer with respect to a threshold voltage, in the high electron mobility transistor in the first embodiment, and in the high electron mobility transistor in the related art.

FIG. 8 is numerical simulation results showing film thickness dependence of the electron supply layer ES1 with respect to the threshold voltage, in the high electron mobility transistor in the first embodiment, and in the high electron mobility transistor in the related art. In FIG. 8, the horizontal axis represents the film thickness (m) of the electron supply layer ES1, and the vertical axis represents the threshold voltage (V). At this time, the acceptor concentration of the p-type cap layer CAP1 is set at $5 \times 10^{18}$ cm$^{-3}$, and the film thickness of the p-type cap layer CAP1 is set at 30 nm. In FIG. 8, the solid line represents the high electron mobility transistor in the first embodiment, and the broken line represents the high electron mobility transistor in the related art.

As shown in FIG. 8, it can be seen that the threshold voltage of the high electron mobility transistor in the first embodiment, under the influence of the interposition of the spacer layer SP1, is shifted to the negative side more than the threshold voltage of the high electron mobility transistor in the related art where the spacer layer SP1 is not interposed. It can be seen, however, that even in this case, if the film thickness of the electron supply layer ES1 is set at about 18 nm or less, the normally-off operation becomes possible sufficiently even in the high electron mobility transistor in the first embodiment.

It should be noted that, in the first embodiment, since the spacer layer SP1 whose band gap is larger than the band gap of the electron supply layer ES1 is introduced, and the gate leakage current is suppressed by the spacer layer SP1, the gate leakage current does not worsen even if the layer thickness of the electron supply layer ES1 is further reduced as compared with that in the related art.

Figure 9:
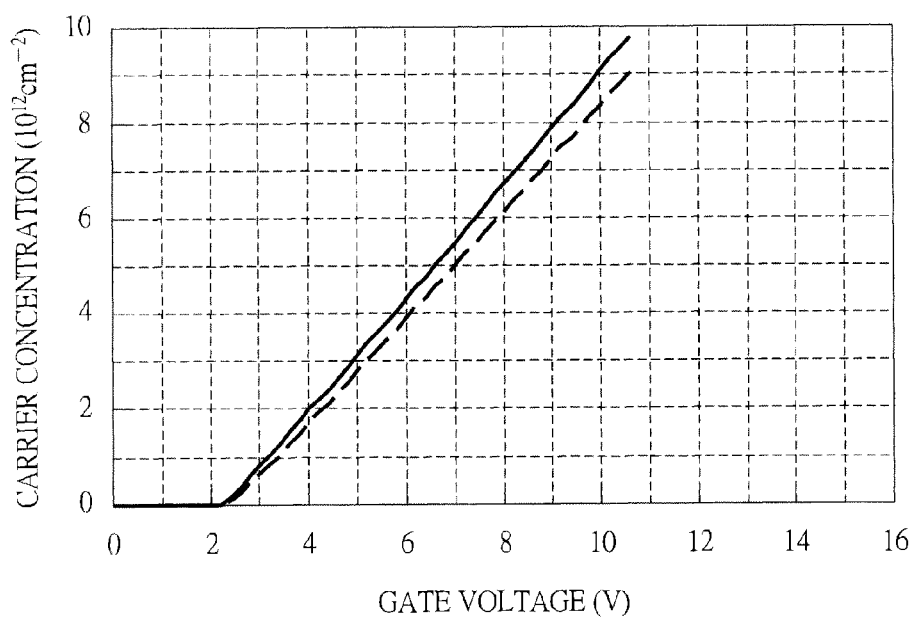
FIG. 9 is a graph showing calculation results showing gate voltage dependence of a carrier concentration of a two-dimensional electron gas, in the high electron mobility transistor in the first embodiment and in the high electron mobility transistor in the related art.

FIG. 9 is a graph showing calculation results showing gate voltage dependence of the carrier concentration ($10^{12}$ cm$^{-2}$) of the two-dimensional electron gas, in the high electron mobility transistor in the first embodiment and in the high electron mobility transistor in the related art. In FIG. 9, the horizontal axis represents the gate voltage (V), and the vertical axis represents the carrier concentration ($10^{12}$ cm$^{-2}$) of the two-dimensional electron gas. At this time, the acceptor concentration of the p-type cap layer CAP1 is set at $5 \times 10^{18}$ cm$^{-3}$, and the film thickness of the electron supply layer ES1 is set at 14 nm. In FIG. 9, the solid line represents the high electron mobility transistor in the first embodiment, and the broken line represents the high electron mobility transistor in the related art. As shown in FIG. 9, it can be seen that even in the first embodiment where the spacer layer SP1 is interposed, approximately similarly to the related art where the spacer layer SP1 is not interposed, the normally-off operation having a threshold voltage of about +2 V can be realized.

From the above, it can be seen that according to the first embodiment, in the high electron mobility transistor, the on-resistance can be sufficiently reduced with the normally-off operation maintained, so that the performance of a semiconductor device including the high electron mobility transistor can be improved.

Figure 10:
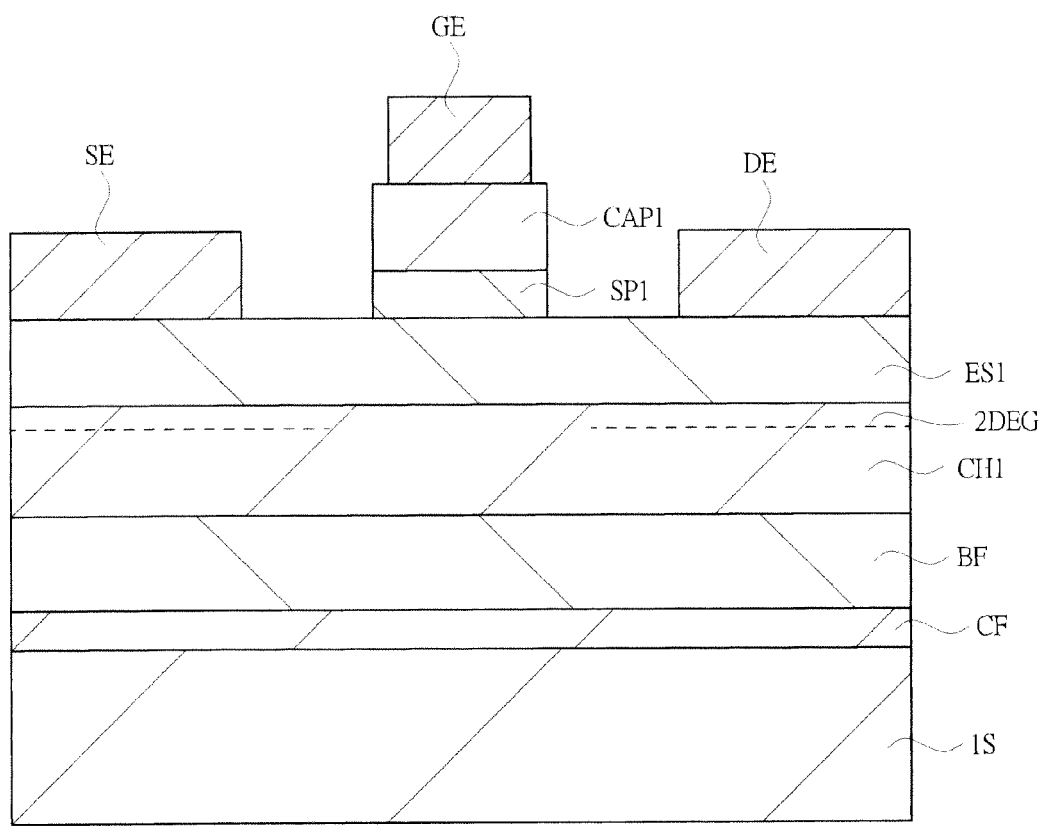
FIG. 10 is a sectional view showing the configuration of a high electron mobility transistor in another aspect.

It should be noted that the configuration where the spacer layer SP1 is interposed between the channel layer CH1 and the electron supply layer ES1 has been described in the first embodiment, but the same advantageous effect as the first embodiment can be obtained by adopting a configuration where the spacer layer SP1 is interposed between the electron supply layer ES1 and the p-type cap layer CAP1, for example, as shown in FIG. 10. That is, also in the case where the spacer layer SP1 is interposed between the electron supply layer ES1 and the p-type cap layer CAP1, a high potential barrier can be formed between the p-type cap layer CAP1 and the channel layer CH1 in which the two-dimensional electron gas is generated, so that the gate leakage current can be reduced. That is, in the case where the spacer layer SP1 is interposed between the electron supply layer ES1 and the p-type cap layer CAP1, the above first mechanism of forming a high potential barrier can provide the effect of increasing the maximum carrier concentration of the two-dimensional electron gas due to a reduction in gate leakage current. This can reduce the on-resistance significantly, which in turn can improve the performance of the semiconductor device. Here, in order to prevent increase of contact resistance caused by the large band gap of the spacer layer SP1, it is desired that the spacer layer SP1 is formed only under the bottom of the cap layer CAP1.

In the configuration where the spacer layer SP1 is interposed between the electron supply layer ES1 and the p-type cap layer CAP1, however, the electrons constituting the two-dimensional electron gas travel along the interface between the electron supply layer ES1 and the channel layer CH1. At this time, the electron supply layer ES1 is formed of aluminum gallium nitride (AlGaN), and therefore the electron supply layer ES1 is composed of a ternary mixed crystal semiconductor material. In aluminum gallium nitride (AlGaN) that is a ternary mixed crystal semiconductor material, aluminum atoms (Al atoms) and gallium atoms (Ga atoms) are randomly arranged. Therefore, the electrons travelling along the interface of the electron supply layer ES1 are influenced by alloy scattering due to the random arrangement of the aluminum atoms (Al atoms) and the gallium atoms (Ga atoms). Hence, in the configuration where the spacer layer SP1 is interposed between the electron supply layer ES1 and the p-type cap layer CAP1, the advantageous effect of reducing the on-resistance due to the second mechanism of suppressing the alloy scattering to improve the electron mobility cannot be obtained.

From the above, it is desired to adopt the configuration where the spacer layer SP1 is provided between the channel layer CH1 and the electron supply layer ES1, like the first embodiment, in view of achieving reduction of the gate leakage current and improvement of the electron mobility according to the above synergetic effect of the first mechanism and the second mechanism.

<Method of Manufacturing the Semiconductor Device>

The semiconductor device in the first embodiment is configured in the above manner, and a method of manufacturing the same will be described below with reference to the drawings. Specifically, a case where setting has been performed such that x=1, y=0.22, and z=0 will be taken as an example to describe the method of manufacturing the semiconductor device in the first embodiment. In this case, the spacer layer SP1 is composed of aluminum nitride (AlN) (band gap: about 6.2 eV), and the electron supply layer ES1 is composed of $Al_{0.22}Ga_{0.78}N$ (band gap: about 4.0 eV). In addition, the p-type cap layer CAP1 is composed of gallium nitride (GaN) (band gap: about 3.4 eV).

Figure 11:
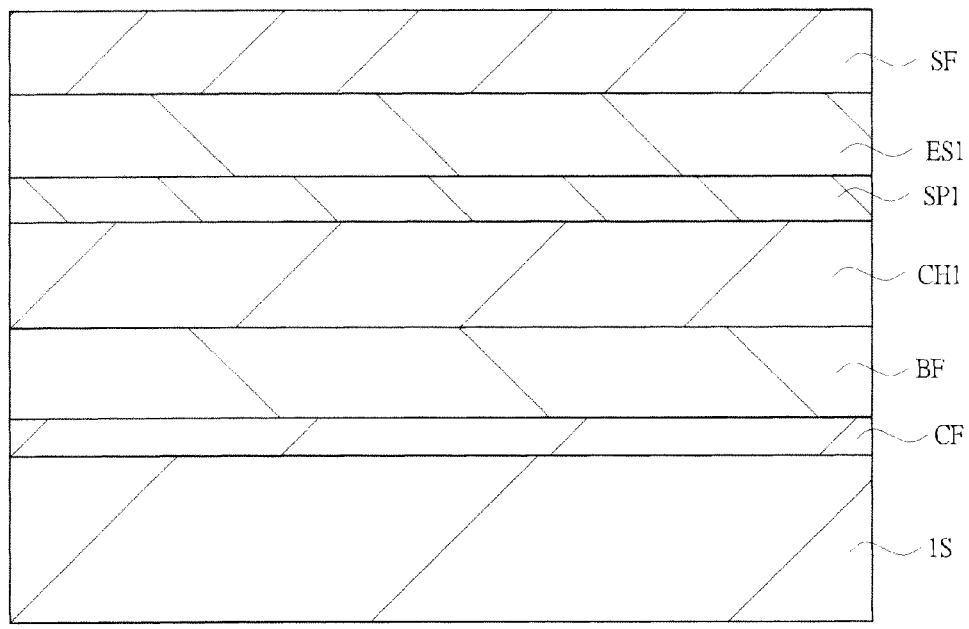
FIG. 11 is a sectional view showing a process of manufacturing a semiconductor device in the first embodiment.

First, as shown in FIG. 11, a semiconductor layer structure is formed, by metal organic chemical vapor deposition (MOCVD), on a semiconductor substrate 1S composed of for example, silicon having an exposed (111) plane. In this semiconductor layer structure, first, a nucleation layer CF composed of a superlattice of alternate layers of undoped aluminum nitride (AlN) and undoped gallium nitride (GaN) is formed on the semiconductor substrate 1S. The film thickness of the nucleation layer CF is 200 nm, for example. Next, a buffer layer BF composed of, for example, undoped gallium nitride (GaN) is formed on the nucleation layer CF. The film thickness of the buffer layer BF is 1 μm, for example. Then, a channel layer CH1 composed of undoped gallium nitride (GaN) is formed on the buffer layer BF. The film thickness of the channel layer CH1 is 50 nm, for example. Thereafter, a spacer layer SP1 composed of undoped aluminum nitride (AlN) is formed on the channel layer CH1. The film thickness of the spacer layer SP1 is 1 nm, for example. Then, an electron supply layer ES1 composed of undoped $Al_{0.22}Ga_{0.78}N$ is formed on the spacer layer SP1. The film thickness of the electron supply layer ES1 is 14 nm, for example. Next, a semiconductor film SF composed of p-type gallium nitride (p-type GaN) is formed on the electron supply layer ES1. The impurity concentration of the semiconductor film SF is $5\times10^{18}$ $cm^{-3}$, for example, and the film thickness thereof is 30 nm, for example. In addition, as a p-type impurity, magnesium (Mg), for example, can be used. In this manner, the semiconductor layer structure is formed. This semiconductor layer structure is formed by group-III plane growth of deposition in the direction of a [0001] crystal axis (c axis).

Here, the film thickness of the spacer layer SP1 is thinner than the film thickness of the electron supply layer ES1, and further, the film thickness of the electron supply layer ES1 is set thinner than a critical thickness at which a dislocation is generated on the buffer layer BF. Therefore, according to the first embodiment, a good crystal quality where dislocation generation has been suppressed can be obtained.

In the respective semiconductor layers constituting the above semiconductor layer structure, based on spontaneous polarization and piezoelectric polarization, polarization charges are generated at upper and lower interfaces of each semiconductor layer. The area density of the polarization charges is $6.4\times10^{13}$ $cm^{-2}$ for the spacer layer SP1 composed of aluminum nitride (AlN), and $1.2\times10^{13}$ $cm^{-2}$ for the electron supply layer ES1 composed of $Al_{0.22}Ga_{0.78}N$, for example. The polarity of the polarization charges, in the case of group-III plane growth, is negative on the surface side and positive on the back surface side.

Figure 12:
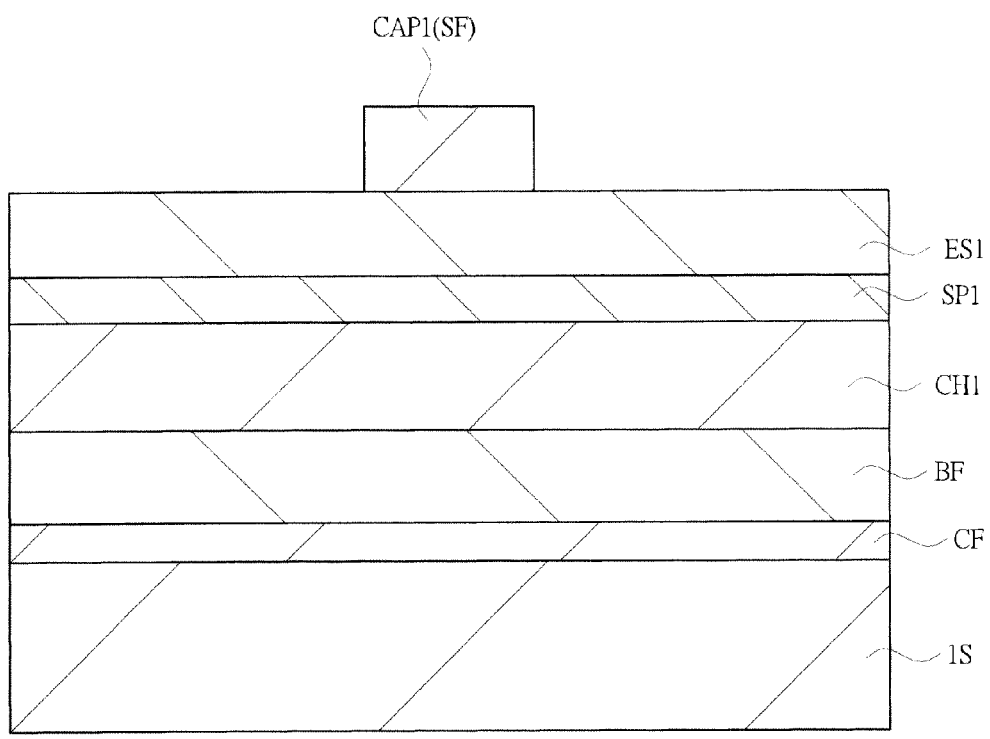
FIG. 12 is a cross-sectional view showing the process of manufacturing the semiconductor device continued from FIG. 11.

Next, as shown in FIG. 12, a resist film is applied on the semiconductor film SF, and exposure and development processes are performed on the resist film to pattern the resist film. The patterning of the resist film is performed so as to leave the resist film in a region where the p-type cap layer CAP1 is to be formed. Then, the p-type cap layer CAP1 composed of the semiconductor film SF is formed by etching the semiconductor film SF with the patterned resist film as a mask. Specifically, the etching of the semiconductor film SF can be performed by dry-etching using etching gas, such as boron chloride ($BCl_3$), for example.

Figure 13:
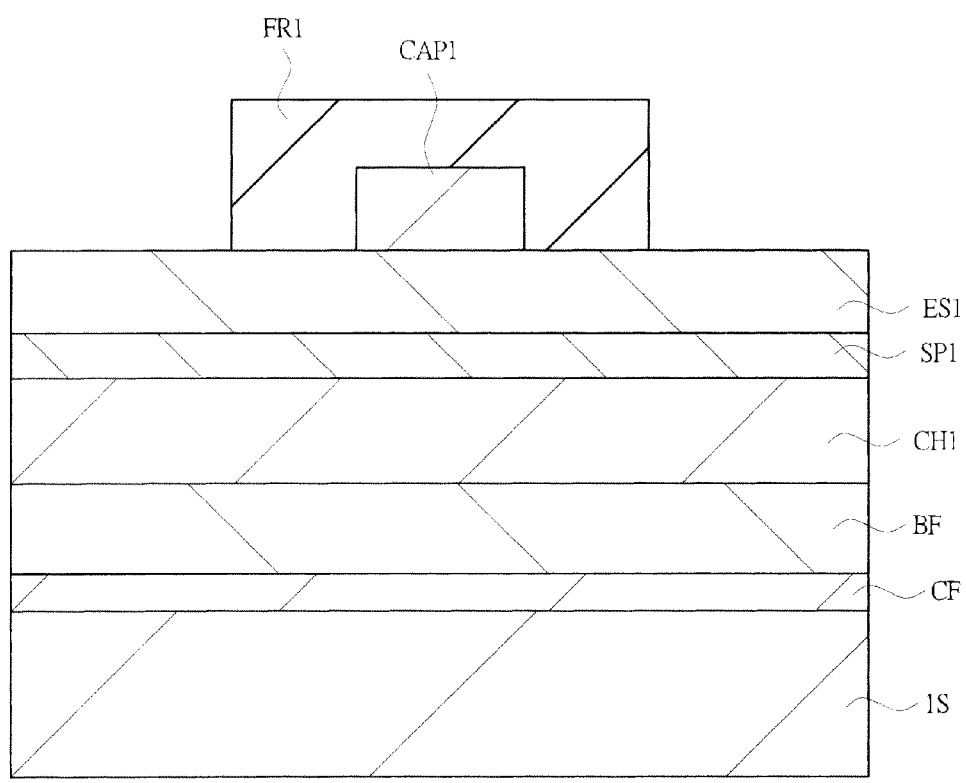
FIG. 13 is a cross-sectional view showing the process of manufacturing the semiconductor device continued from FIG. 12.

Then, after the patterned resist film is removed, a resist film FR1 is applied on the electron supply layer ES1 on which the p-type cap layer CAP1 has been formed, as shown in FIG. 13. Subsequently, exposure and development processes are performed on the resist film FR1 to pattern the resist film FR1. The patterning of the resist film FR1 is performed so as to expose a source electrode forming region and a drain electrode forming region.

Figure 14:
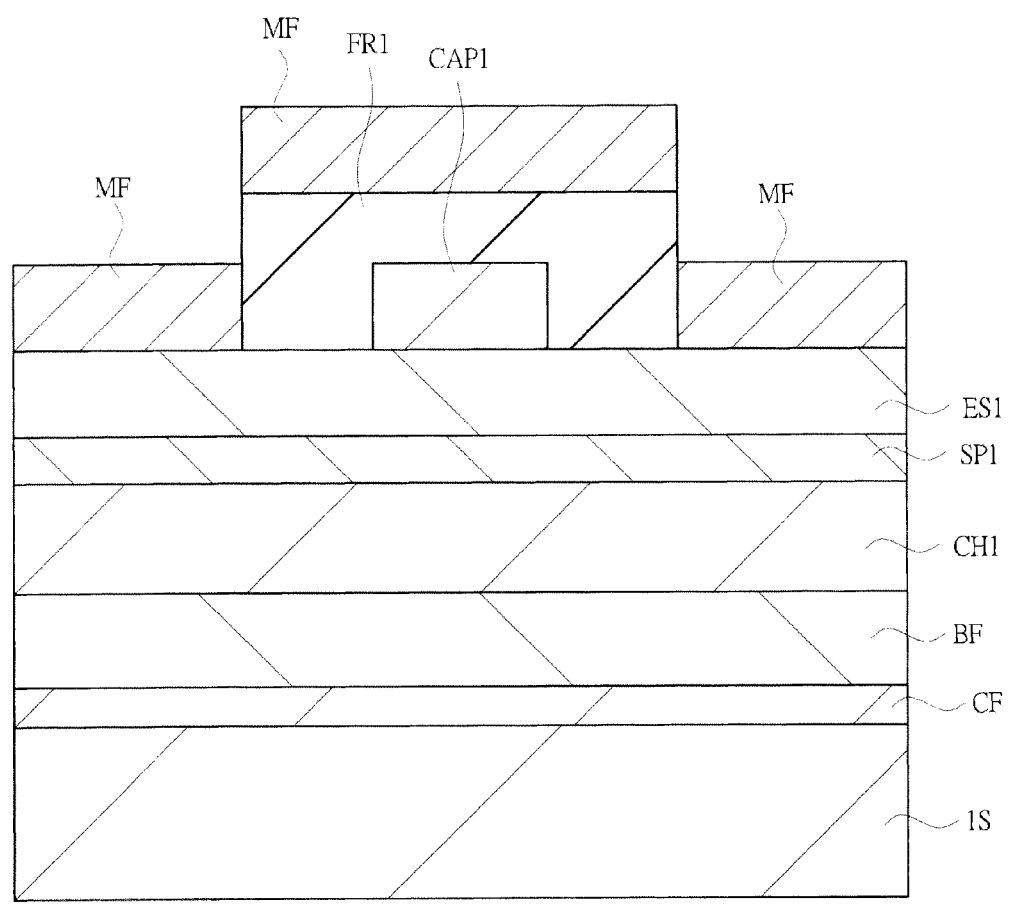
FIG. 14 is a cross-sectional view showing the process of manufacturing the semiconductor device continued from FIG. 13.

Thereafter, as shown in FIG. 14, a metal film MF is formed on the patterned resist film FR1. Therefore, in the source electrode forming region and the drain electrode forming region, metal films MF are formed directly on the electron supply layer ES1. On the other hand, in the other regions, metal films MF are formed on the resist film FR1. At this time, the metal film MF (Ti/Al/Ni/Au) is composed of a titanium film (Ti), an aluminum film (Al) formed on the titanium film, a nickel film (Ni) formed on the aluminum film, and a gold film (Au) formed on the nickel film, for example. The metal film MF can be formed by vapor deposition, for example.

Figure 15:
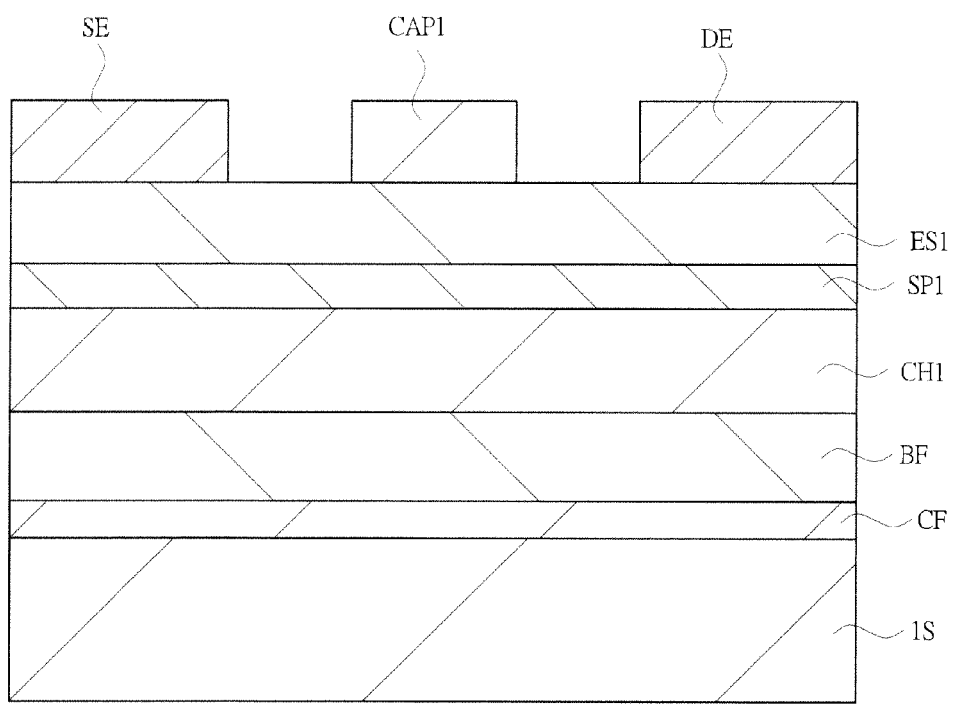
FIG. 15 is a cross-sectional view showing the process of manufacturing the semiconductor device continued from FIG. 14.

Next, as shown in FIG. 15, the resist film FR1 is lifted off. This removes the resist film FR1 and the metal film MF formed on the resist film FR1, and leaves only the metal film MF formed in direct contact with the electron supply layer ES1. Thereby, the source electrode SE and the drain electrode DE, which are composed of the metal film MF in direct contact with the electron supply layer ES1 can be formed. The source electrode SE and the drain electrode DE are disposed so as to be separated from each other, and the p-type cap layer CAP1 is formed so as to be sandwiched between the source electrode and the drain electrode. Thereafter, a thermal treatment (alloy treatment) is performed on the semiconductor substrate 1S to bring the source electrode SE, and the channel layer CH1 in which the two-dimensional electron gas is formed, into ohmic contact with each other. Similarly, the thermal treatment brings the drain electrode DE and the channel layer CH1 into ohmic contact with each other. Then, though not shown, in order to achieve element isolation between devices, an element isolation region is formed by implantation of nitrogen (N) ions or the like.

Figure 16:
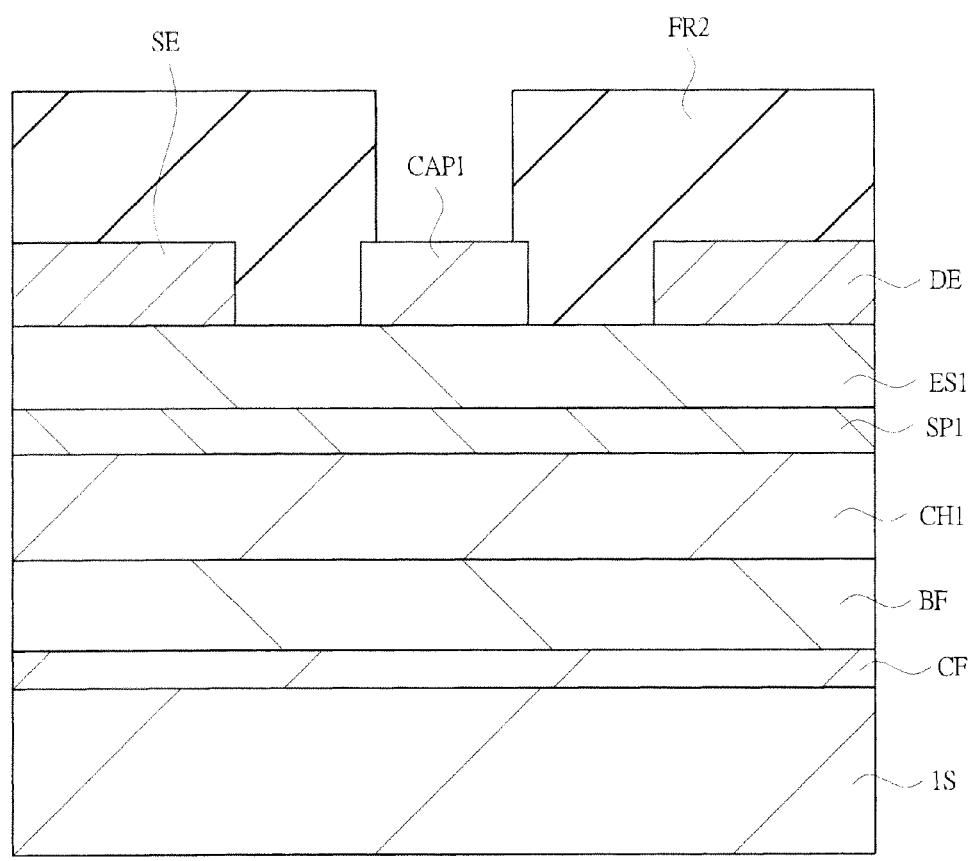
FIG. 16 is a cross-sectional view showing the process of manufacturing the semiconductor device continued from FIG. 15.

Then, as shown in FIG. 16, a resist film FR2 is applied on the electron supply layer ES1 on which the source electrode SE, the drain electrode DE, and the p-type cap layer CAP1 have been formed. Subsequently, exposure and development processes are performed on the resist film FR2 to pattern the resist film FR2. The patterning of the resist film FR2 is performed so as to expose a gate electrode forming region on the p-type cap layer CAP1.

Figure 17:
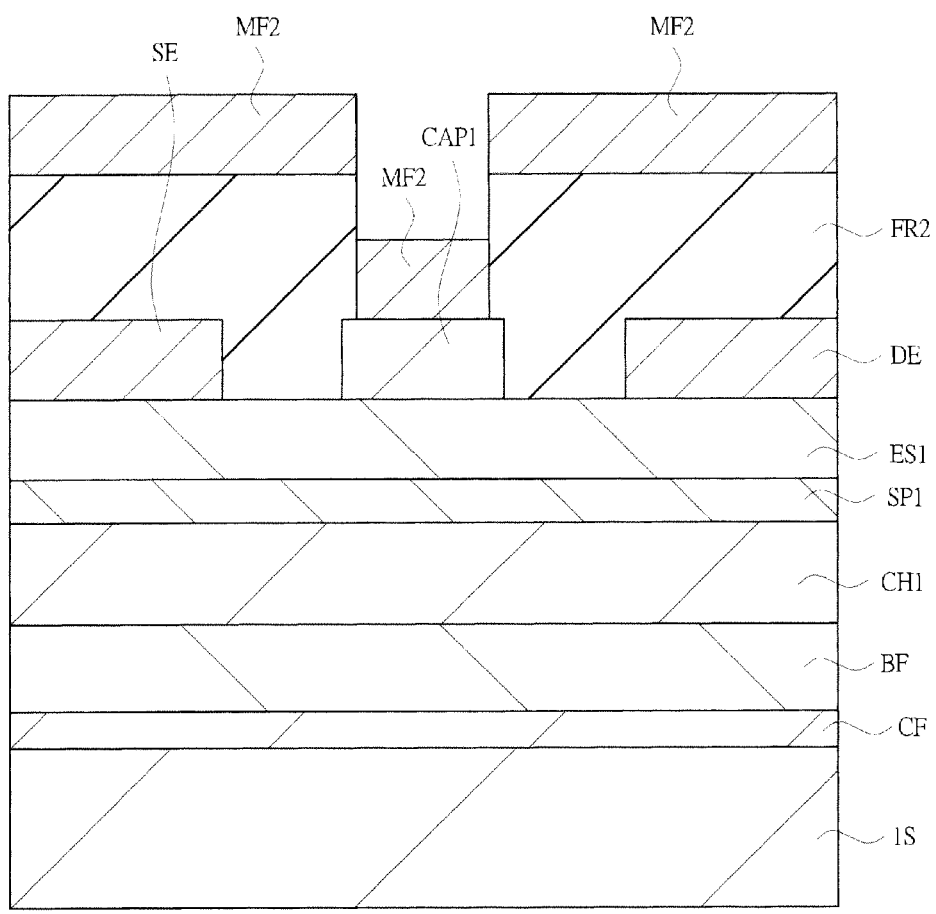
FIG. 17 is a cross-sectional view showing the process of manufacturing the semiconductor device continued from FIG. 16.

Thereafter, as shown in FIG. 17, a metal film MF2 is formed on the patterned resist film FR2. Thereby, in the gate electrode forming region, the metal film MF2 is formed directly on the p-type cap layer CAP1. On the other hand, in the other region, a metal film MF2 is formed on the resist film FR2. At this time, the metal film MF2 (Ni/Au) is composed of a nickel film (Ni) and a gold film (Au) formed on the nickel film, for example. The metal film MF2 can be formed by vapor deposition, for example. Then, as shown in FIG. 4, the resist film FR2 is lifted off. This removes the resist film FR2 and the metal film MF2 formed on the resist film FR2, and leaves only the metal film MF2 formed in direct contact with the p-type cap layer CAP1. Thereby, the gate electrode composed of the metal film MF2 in direct contact with the p-type cap layer CAP1 can be formed. In the above manner, the high electron mobility transistor (semiconductor device) in the first embodiment can be manufactured.

It should be noted that in the first embodiment, the aluminum composition ratio of the spacer layer SP1 composed of aluminum gallium nitride ($Al_xGa_{1-x}N$) is set at x=1, but a certain level of effect of improving the on-resistance can be obtained even at X=0.5, for example. In this case, a threshold voltage approximately equivalent to that in the first embodiment can be obtained, for example, by setting the film thickness of the spacer layer SP1 at 2 nm.

In addition, in the first embodiment, the aluminum composition ratio of the p-type cap layer CAP1 composed of aluminum gallium nitride ($Al_zGa_{1-z}N$) has been set at z=0, but z=0.22, for example, may be employed. In this case, the normally-off operation becomes possible, similarly to the first embodiment, by setting the impurity concentration of the p-type cap layer CAP1 at about $1\times10^{19}$ cm$^{-3}$, and the film thickness of the electron supply layer ES1 at about 4 nm or less.

Figure 18:
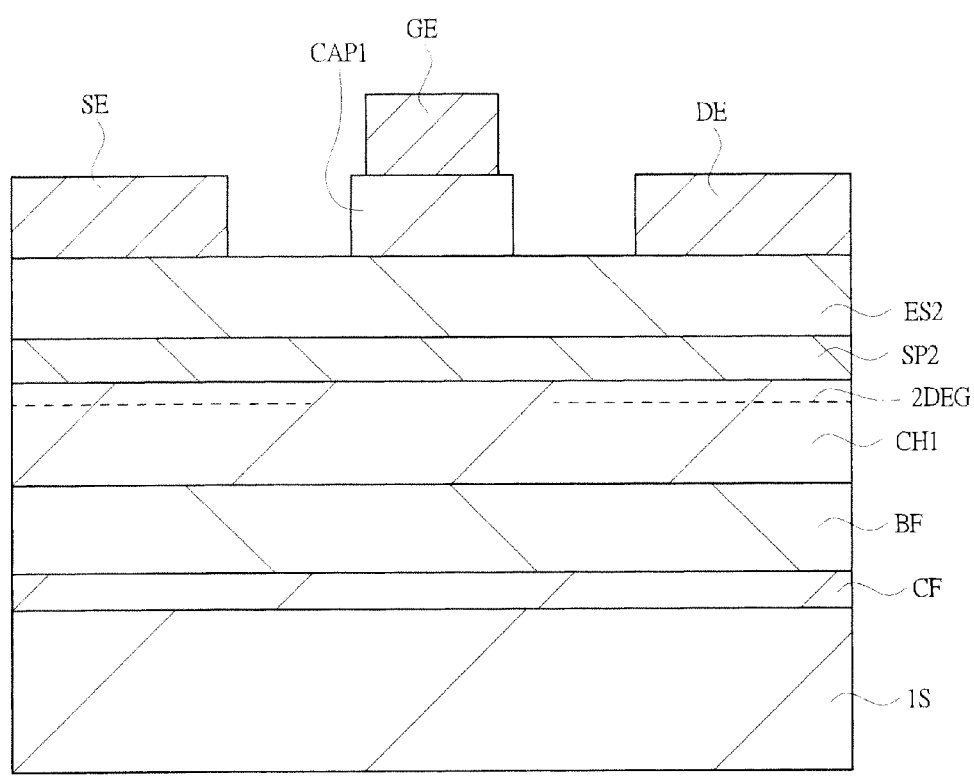
FIG. 18 is a sectional view showing the configuration of a high electron mobility transistor in a second embodiment.

(Second Embodiment)
<Feature of the Second Embodiment>
FIG. 18 is a sectional view showing the configuration of a high electron mobility transistor in a second embodiment. In FIG. 18, the same reference numerals as in FIG. 4 denote the same contents in FIG. 4, and the second embodiment differs from the first embodiment in the composition of a spacer layer SP2 and the composition of an electron supply layer ES2. That is, a feature of the second embodiment lies in that the spacer layer SP2 is composed of aluminum indium nitride ($Al_uIn_{1-u}N$), and the electron supply layer ES2 is composed of aluminum gallium nitride ($Al_vGa_{1-v}N$).

Here, the band gap of the spacer layer SP2 composed of aluminum indium nitride ($Al_uIn_{1-u}N$) is larger than the band gap of the electron supply layer ES2 composed of aluminum gallium nitride ($Al_vGa_{1-v}N$). Thereby, due to the fact that the band gap of the spacer layer SP2 is large, a high potential barrier (electron barrier) is formed in the vicinity of an interface between the channel layer CH1 and the electron supply layer ES2. That is, a higher potential barrier is formed when the spacer layer SP2 is provided than when the spacer layer SP2 is not provided. As a result, according to the high electron mobility transistor in the second embodiment, the high potential barrier suppresses the gate leakage current significantly. Therefore, according to the high electron mobility transistor in the second embodiment, the maximum carrier concentration of the two-dimensional electron gas accumulated in the channel layer CH1 increases, so that the on-resistance of the high electron mobility transistor in the second embodiment can be sufficiently reduced.

Specifically, in the second embodiment, the spacer layer SP2 is formed of undoped $Al_uIn_{1-u}N$, and the electron supply layer ES2 is formed of undoped $Al_vGa_{1-v}N$. Therefore, the condition that the band gap of the spacer layer SP2 becomes larger than the band gap of the electron supply layer ES2 will be described below.

First, a band gap Eg of $Al_sIn_{1-s}N$ can be expressed by the following expression (3), for example.

$$Eg(Al_sIn_{1-s}N)=0.9+5.3s \quad (3)$$

Therefore, from this expression (3) and the expression (1) described in the first embodiment, if a composition ratio u of the spacer layer SP2 and a composition ratio v of the electron supply layer ES2 are set so as to satisfy an inequality (4), the band gap of the spacer layer SP2 becomes larger than the band gap of the electron supply layer ES2.

$$2.8v+2.5<5.3u \quad (4)$$

By forming the spacer layer SP2 and the electron supply layer ES2 such that the composition ratio u of the spacer layer SP2 and the composition ratio v of the electron supply layer ES2 satisfy the inequality (4), a higher potential barrier can be formed when the spacer layer SP2 is provided than when the spacer layer SP2 is not provided. As a result, the high potential barrier suppresses the gate leakage current significantly, so that the maximum carrier concentration of the two-dimensional electron gas accumulated in the channel layer CH1 increases, which makes it possible to sufficiently reduce the on-resistance of the high electron mobility transistor in the second embodiment.

In the second embodiment, the potential barrier due to the spacer layer SP2 is remarkably high. This is due to the fact that the conduction band offset between the aluminum indium nitride ($Al_uIn_{1-u}N$) constituting the spacer layer SP2 and gallium nitride (GaN) constituting the channel layer CH1 is as much as about 0.9 eV. Further, within aluminum indium nitride ($Al_uIn_{1-u}N$) constituting the spacer layer SP2, an internal electric field caused by spontaneous polarization is also generated. Therefore, according to a synergetic effect of the above large conduction band offset and the above internal electric field, a higher potential barrier is formed in the vicinity of an interface of the channel layer CH1, than in the related art where the spacer layer SP2 is not provided.

From this, it can be supposed that it becomes difficult for part of the two-dimensional electron gas accumulated in the well-type potential in the vicinity of the interface between the channel layer CH1 and the spacer layer SP2 to get over the high potential barrier. This means that the gate leakage current flowing from the gate electrode GE toward the channel layer CH1 is sufficiently reduced. As a result, according to the high electron mobility transistor in the second embodiment, the maximum carrier concentration of the two-dimensional electron gas accumulated in the channel layer CH1 increases. Thereby, such a remarkable effect as allowing the on-resistance of the high electron mobility transistor in the second embodiment to be reduced sufficiently can be obtained.

On the other hand, also in the second embodiment, due to ionization of acceptor, negative charges are produced within the p-type cap layer CAP1. Therefore, by adjusting, if necessary, the film thickness of the electron supply layer ES2, in thermal equilibrium, the channel layer CH1 under the gate electrode GE is depleted, so that the normally-off operation whose threshold voltage is a positive voltage can be realized.

Figure 19:
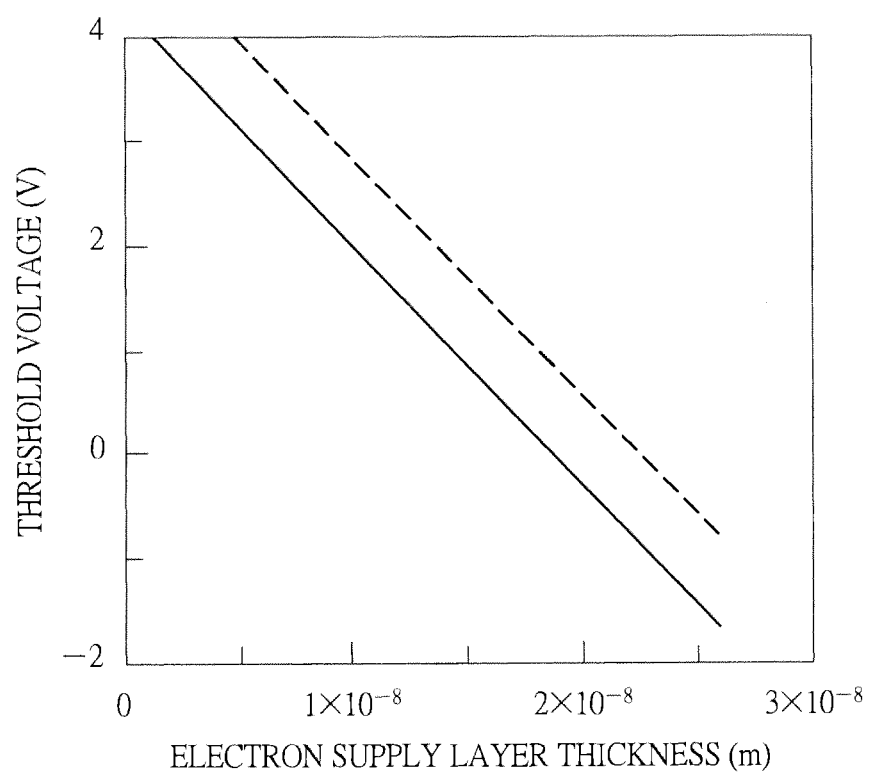
FIG. 19 is a graph showing numerical simulation results showing film thickness dependence of an electron supply layer with respect to a threshold voltage, in the high electron mobility transistor in the second embodiment, and in the high electron mobility transistor in the related art.

FIG. 19 shows numerical simulation results showing film thickness dependence of the electron supply layer ES2 with respect to the threshold voltage, in the high electron mobility transistor in the second embodiment, and in the high electron mobility transistor in the related art. In FIG. 19, the horizontal axis represents the film thickness (m) of the electron supply layer ES2, and the vertical axis represents the threshold voltage (V). At this time, the acceptor concentration of the p-type cap layer CAP1 is set at $5\times10^{18}$ cm$^{-3}$, and the film thickness of the p-type cap layer CAP1 is set at 30 nm. In FIG. 19, the solid line represents the high electron mobility transistor in the second embodiment, and the broken line represents the high electron mobility transistor in the related art.

As shown in FIG. 19, it can be seen that the threshold voltage of the high electron mobility transistor in the second embodiment, under the influence of the interposition of the spacer layer SP2, is shifted to the negative side more than the threshold voltage of the high electron mobility transistor in the related art where the spacer layer SP2 is not interposed. It can be seen, however, that even in this case, if the film thickness of the electron supply layer ES2 is set at about 20 nm or less, the normally-off operation becomes possible sufficiently even in the high electron mobility transistor in the second embodiment.

According to the foregoing, it can be seen that according to the second embodiment, in the high electron mobility transistor, the on-resistance can be sufficiently reduced with the normally-off operation maintained, so that the performance of a semiconductor device including the high electron mobility transistor can be improved.

<Method of Manufacturing the Semiconductor Device>

The semiconductor device in the second embodiment is configured in the above manner, and a method of manufacturing the same will be described below with reference to the drawings Specifically, a case where setting has been performed such that u=0.82, v=0.22, and z=0 will be taken as an example to describe the method of manufacturing the semiconductor device in the second embodiment. In this case, the spacer layer SP2 is composed of aluminum indium nitride ($Al_{0.82}In_{0.18}N$) (band gap: about 5.2 eV), and the electron supply layer ES2 is composed of $Al_{0.22}Ga_{0.78}N$ (band gap: about 4.0 eV). In addition, the p-type cap layer CAP1 is composed of gallium nitride (GaN) (band gap: about 3.4 eV).

Figure 20:
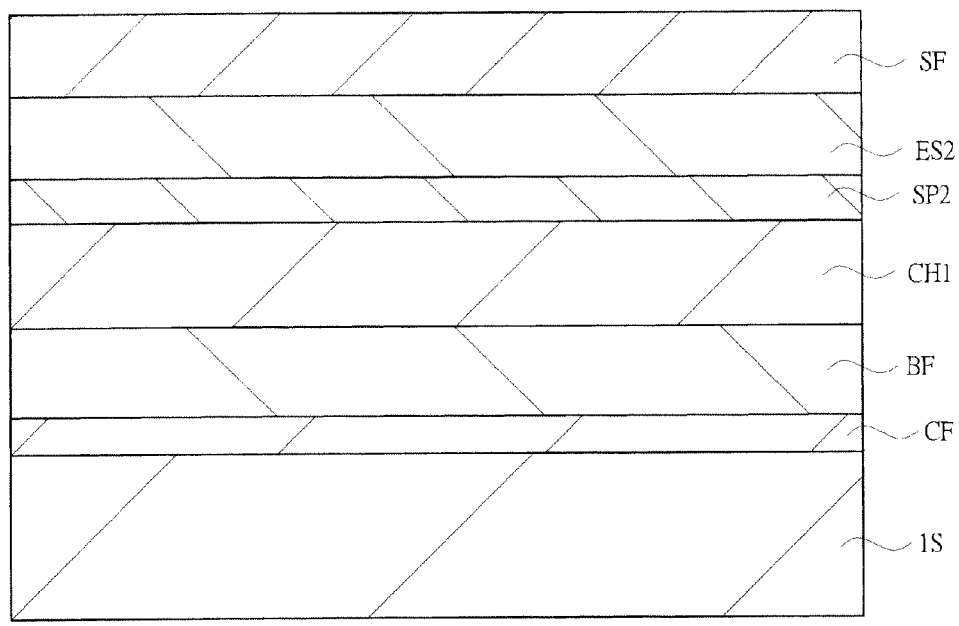
FIG. 20 is a sectional view showing a process of manufacturing a semiconductor device in the second embodiment.

First, as shown in FIG. 20, a semiconductor layer structure is formed, by metal organic chemical vapor deposition (MOCVD), on a semiconductor substrate 1S composed of silicon having an exposed (111) plane, for example In this semiconductor layer structure, first, a nucleation layer CF composed of a superlattice of alternate layers of undoped aluminum nitride (AlN) and undoped gallium nitride (GaN) is formed on the semiconductor substrate 1S. The film thickness of the nucleation layer CF is 200 nm, for example. Next, a buffer layer BF composed of undoped gallium nitride (GaN), for example, is formed on the nucleation layer CF. The film thickness of the buffer layer BF is 1 μm, for example. Then, a channel layer CH1 composed of undoped gallium nitride (GaN) is formed on the buffer layer BF. The film thickness of the channel layer CH1 is 50 nm, for example. Thereafter, a spacer layer SP2 composed of undoped aluminum indium nitride ($Al_{0.82}In_{0.18}N$) is formed on the channel layer CH1. The film thickness of the spacer layer SP2 is 1 nm, for example. Then, an electron supply layer ES2 composed of undoped $Al_{0.22}Ga_{0.78}N$ is formed on the spacer layer SP2. The film thickness of the electron supply layer ES2 is 16 nm, for example. Next, a semiconductor film SF composed of p-type gallium nitride (p-type GaN) is formed on the electron supply layer ES1. The impurity concentration of the semiconductor film SF is $5\times10^{18}$ cm$^{-3}$, for example, and the film thickness thereof is 30 nm, for example. In addition, as a p-type impurity, magnesium (Mg), for example, can be used. In this manner, the semiconductor layer structure is formed. This semiconductor layer structure is formed by group-III plane growth of deposition in the direction of a [0001] crystal axis (c axis). The respective surfaces, on the side of the gate electrode GE, of the buffer layer BF, the channel layer CH1, the spacer layer SP2, the electron supply layer ES2, and the semiconductor film SF (CAP1) become (0001) group-III planes. For example, an interface of the spacer layer SP2 with the electron supply layer ES2 becomes a (0001) group-III plane.

Here, the film thickness of the spacer layer SP2 is thinner than the film thickness of the electron supply layer ES2, and further, the film thickness of the electron supply layer ES2 is set thinner than a critical thickness at which a dislocation is generated on the buffer layer BF Therefore, according to the second embodiment, a good crystal quality where dislocation generation is suppressed can be obtained.

In the respective semiconductor layers constituting the above semiconductor layer structure, based on spontaneous polarization and piezoelectric polarization, polarization charges are generated at upper and lower interfaces of each semiconductor layer. The area density of the polarization charges is $4.5\times10^{13}$ cm$^{-2}$ for the spacer layer SP2 composed of aluminum indium nitride ($Al_{0.82}In_{0.18}N$), and $1.2\times10^{13}$ cm$^{-2}$ for the electron supply layer ES2 composed of $Al_{0.22}Ga_{0.78}N$, for example. The polarity of the polarization charges, in the case of group-III plane growth, is negative on the surface side and positive on the back surface side.

Figure 21:
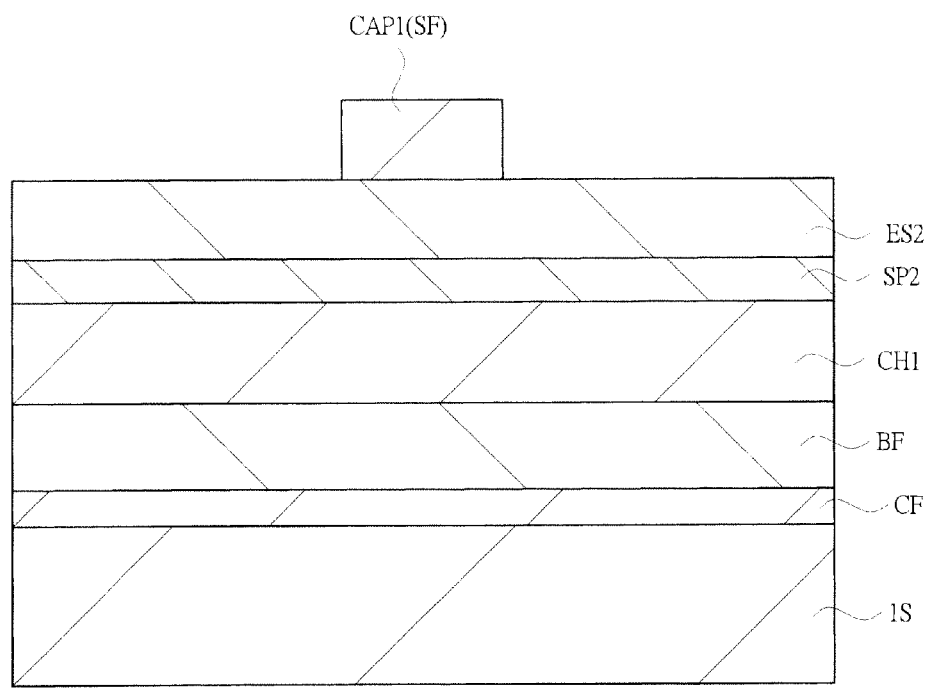
FIG. 21 is a cross-sectional view showing the process of manufacturing the semiconductor device continued from FIG. 20.

Next, as shown in FIG. 21, a resist film is applied on the semiconductor film SF, and exposure and development processes are performed on the resist film to pattern the resist film. The patterning of the resist film is performed so as to leave the resist film in a region where the p-type cap layer CAP1 is to be formed. Then, the p-type cap layer CAP1 composed of the semiconductor film SF is formed by etching the semiconductor film SF with the patterned resist film as a mask. Specifically, the etching of the semiconductor film SF can be performed by dry-etching using etching gas, such as boron chloride ($BCl_3$), for example.

Then, after the patterned resist film has been removed, a resist film is applied on the electron supply layer ES2 on which the p-type cap layer CAP1 has been formed. Subsequently, exposure and development processes are performed on the resist film to pattern the resist film. The patterning of the resist film is performed so as to expose a source electrode forming region and a drain electrode forming region.

Thereafter, a metal film is formed on the patterned resist film. Therefore, in the source electrode forming region and the drain electrode forming region, the metal films is formed directly on the electron supply layer ES2. On the other hand, in the other region, the metal film is formed on the resist film. At this time, the metal film (Ti/Al/Ni/Au) is composed of a titanium film (Ti), an aluminum film (Al) formed on the titanium film, a nickel film (Ni) formed on the aluminum film, and a gold film (Au) formed on the nickel film, for example. The metal film can be formed by vapor deposition, for example.

Figure 22:
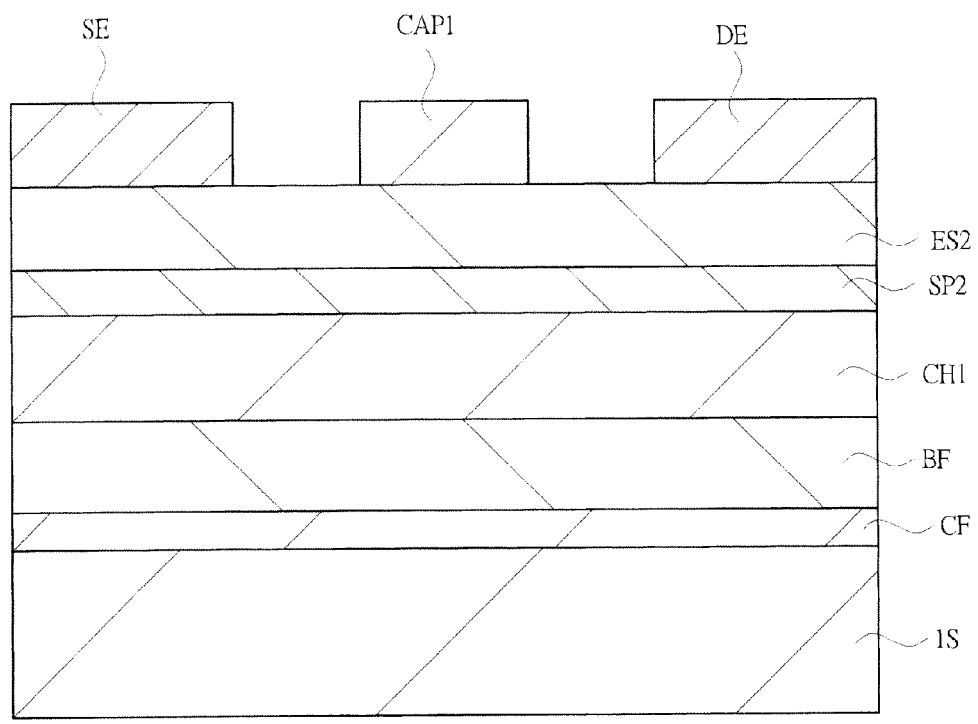
FIG. 22 is a cross-sectional view showing the process of manufacturing the semiconductor device continued from FIG. 21.

Next, the resist film is lifted off. This removes the resist film and the metal film formed on the resist film, and leaves only the metal film formed in direct contact with the electron supply layer ES2. Thereby, as shown in FIG. 22, the source electrode SE and the drain electrode DE, which are composed of the metal film in direct contact with the electron supply layer ES2, can be formed. The source electrode SE and the drain electrode DE are disposed to be separated from each other, and the p-type cap layer CAP1 is formed so as to be sandwiched between the source electrode and the drain electrode DE. Thereafter, a thermal treatment (alloy treatment) is performed on the semiconductor substrate 1S to bring the source electrode SE, and the channel layer CH1 in which the two-dimensional electron gas is formed, into ohmic contact with each other. Similarly, the thermal treatment brings the drain electrode and the channel layer CH1 into ohmic contact with each other. Then, though not shown, in order to achieve element isolation between devices, an element isolation region is formed by implantation of nitrogen (N) ions or the like.

Then, a resist film is applied on the electron supply layer ES2 on which the source electrode SE, the drain electrode DE, and the p-type cap layer CAP1 have been formed. Subsequently, exposure and development processes are performed on the resist film to pattern the resist film. The patterning of the resist film is performed so as to expose a gate electrode forming region on the p-type cap layer CAP1.

Thereafter, a metal film is formed on the patterned resist film. Thereby, in the gate electrode forming region, the metal film is formed directly on the p-type cap layer CAP1. On the other hand, in the other region, the metal film is formed on the resist film. At this time, the metal film (Ni/Au) is composed of a nickel film (Ni) and a gold film (Au) formed on the nickel film, for example. The metal film can be formed by vapor deposition, for example. Then, as shown in FIG. 18, the resist film is lifted off. This removes the resist film and the metal film formed on the resist film, and leaves only the metal film formed in direct contact with the p-type cap layer CAP1. Thereby, the gate electrode composed of the metal film in direct contact with the p-type cap layer CAP1 can be formed. In the above manner, the high electron mobility transistor (semiconductor device) in the second embodiment can be manufactured.

In the case where the spacer layer SP2 is composed of aluminum indium nitride ($Al_uIn_{1-u}N$), and the aluminum composition ratio is set at about u=0.82, the following advantageous effect is further obtained. The spacer layer SP2 composed of $Al_{0.82}In_{0.18}N$ can be lattice-matched to the buffer layer BF composed of GaN. Since the lattice matching can be made, a good crystal quality without internal strains can be obtained, so that the long-term reliability of the high electron mobility transistor can be significantly improved.

It should be noted that in the second embodiment, the aluminum composition ratio of the p-type cap layer CAP1 composed of aluminum gallium nitride ($Al_zGa_{1-z}N$) is set at z=0, but the aluminum composition ratio thereof may be set at z=0.22, for example. In this case, by setting the impurity concentration of the p-type cap layer CAP1 at about $1\times10^{19}$ cm$^{-3}$, and the film thickness of electron supply layer ES2 at about 6 nm or less, the normally-off operation becomes possible, similarly to the second embodiment.

(Third Embodiment)
<Feature of Third Embodiment>

Figure 23:
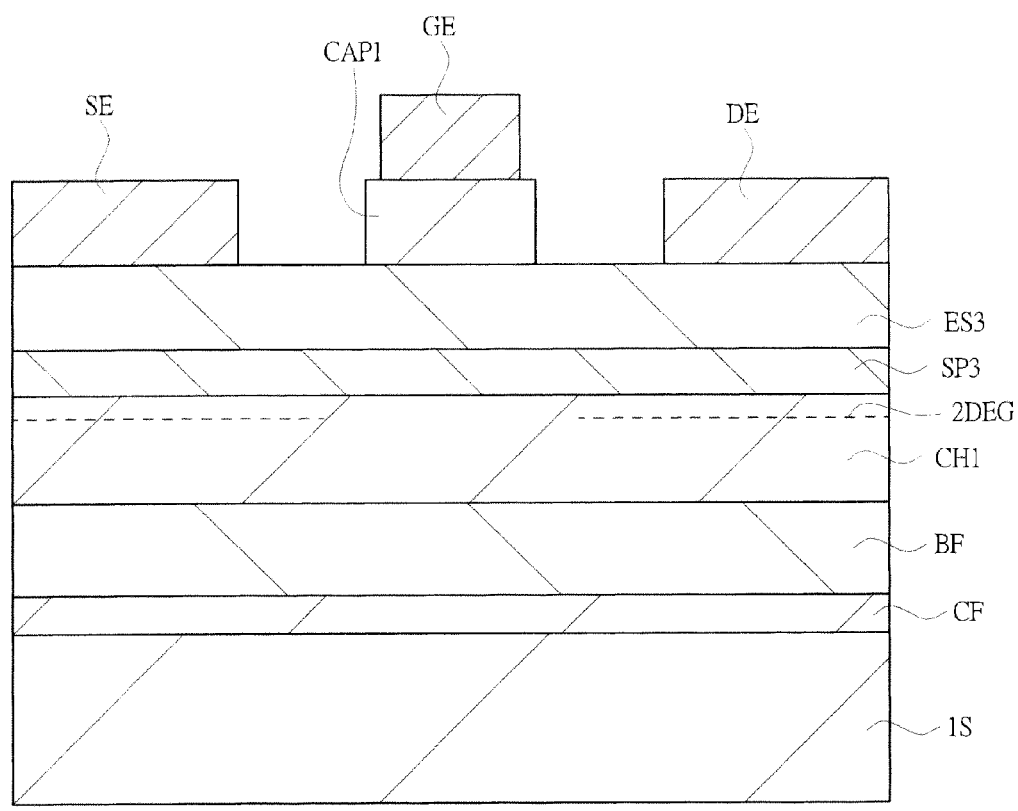
FIG. 23 is a sectional view showing the configuration of a high electron mobility transistor in a third embodiment.

FIG. 23 is a sectional view showing the configuration of a high electron mobility transistor in a third embodiment. In FIG. 23, the same reference numerals as in FIG. 4 denote the same contents in FIG. 4, and the third embodiment differs from the first embodiment in the composition of a spacer layer SP3 and the composition of an electron supply layer ES3. That is, a feature of the third embodiment is that the spacer layer SP3 is composed of aluminum gallium nitride ($Al_aGa_{1-a}N$), and the electron supply layer ES3 is composed of aluminum indium nitride ($Al_bIn_{1-b}N$).

Here, the band gap of the spacer layer SP3 composed of aluminum gallium nitride ($Al_aGa_{1-a}N$) is larger than the band gap of the electron supply layer ES3 composed of aluminum indium nitride ($Al_bIn_{1-b}N$). Thereby, the fact that the band gap of the spacer layer SP3 is large, a high potential barrier (electron barrier) is formed in the vicinity of an interface between the channel layer CH1 and the electron supply layer ES3. That is, a higher potential barrier is formed when the spacer layer SP3 is provided than when the spacer layer SP3 is not provided. As a result, according to the high electron mobility transistor in the third embodiment, the high potential barrier suppresses the gate leakage current significantly. Therefore, according to the high electron mobility transistor in the third embodiment, the maximum carrier concentration of the two-dimensional electron gas accumulated in the channel layer CH1 increases, so that the on-resistance of the high electron mobility transistor in the third embodiment can be sufficiently reduced.

Specifically, in the third embodiment, the spacer layer SP3 is formed of undoped $Al_aGa_{1-a}N$, and the electron supply layer ES3 is formed of undoped $Al_bIn_{1-b}N$. Therefore, a condition that the band gap of the spacer layer SP3 becomes larger than the band gap of the electron supply layer ES3 will be described below.

First, from the expression (1) described in the first embodiment and the expression (3) described in the second embodiment, if a composition ratio "a" of the spacer layer SP3 and a composition ratio b of the electron supply layer ES3 are set so as to satisfy an inequality (5), the band gap of the spacer layer SP3 becomes larger than the band gap of the electron supply layer ES3.

$$5.3b<2.8a+2.5 \tag{5}$$

By forming the spacer layer SP3 and the electron supply layer ES3 such that the composition ratio "a" of the spacer layer SP3 and the composition ratio b of the electron supply layer ES3 satisfy the inequality (5), a higher potential barrier can be formed when the spacer layer SP3 is provided than when the spacer layer SP3 is not provided. As a result, the high potential barrier suppresses the gate leakage current significantly, so that the maximum carrier concentration of the two-dimensional electron gas accumulated in the channel layer CH1 increases, which makes it possible to sufficiently reduce the on-resistance of the high electron mobility transistor in the third embodiment.

In the third embodiment, the potential barrier due to the spacer layer SP3 is remarkably high. This is due to the fact that the conduction band offset between the aluminum gallium nitride ($Al_aGa_{1-a}N$) constituting the spacer layer SP3 and gallium nitride (GaN) constituting the channel layer CH1 is as much as about 1.9 eV. Further, within aluminum gallium nitride ($Al_aGa_{1-a}N$) constituting the spacer layer SP3, an internal electric field caused by spontaneous polarization is also generated. Therefore, according to a synergetic effect of the above large conduction band offset and the above internal electric field, a higher potential barrier is formed in the vicinity of an interface of the channel layer CH1, than in the related art where the spacer layer SP3 is not provided.

From this, it can be supposed that it becomes difficult for part of the two-dimensional electron gas accumulated in the well-type potential in the vicinity of the interface between the channel layer CH1 and the spacer layer SP3 to get over the high potential barrier. This means that the gate leakage current flowing from the gate electrode GE toward the channel layer CH1 is sufficiently reduced. As a result, according to the high electron mobility transistor in the third embodiment, the maximum carrier concentration of the two-dimensional electron gas accumulated in the channel layer CH1 increases, so that such a remarkable effect as allowing the on-resistance of the high electron mobility transistor in the third embodiment to be reduced sufficiently can be obtained.

On the other hand, also in the third embodiment, due to ionization of acceptor, negative charges are produced within the p-type cap layer CAP1. Therefore, by adjusting, if necessary, the film thickness of the electron supply layer ES3, in thermal equilibrium, the channel layer CH1 under the gate electrode GE is depleted, so that the normally-off operation whose threshold voltage is a positive voltage can be realized.

Figure 24:
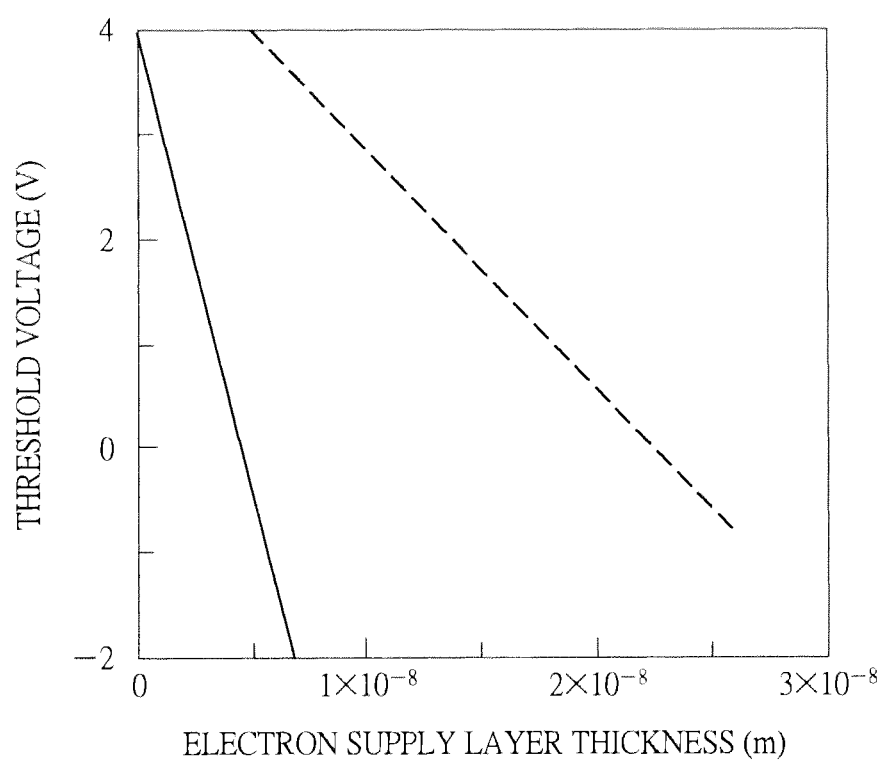
FIG. 24 is a graph showing numerical simulation results showing film thickness dependence of an electron supply layer with respect to a threshold voltage, in the high electron mobility transistor in the third embodiment, and in the high electron mobility transistor in the related art.

FIG. 24 shows numerical simulation results showing film thickness dependence of the electron supply layer ES3 with respect to the threshold voltage, in the high electron mobility transistor in the third embodiment, and in the high electron mobility transistor in the related art. In FIG. 24, the horizontal axis represents the film thickness (m) of the electron supply layer ES3, and the vertical axis represents the threshold voltage (V). At this time, the acceptor concentration of the p-type cap layer CAP1 is set at $5 \times 10^{18}$ cm$^{-3}$, and the film thickness of the p-type cap layer CAP1 is set at 30 nm. In FIG. 24, the solid line represents the high electron mobility transistor in the third embodiment, and the broken line represents the high electron mobility transistor in the related art.

As shown in FIG. 24, it can be seen that the threshold voltage of the high electron mobility transistor in the third embodiment, under the influence of the interposition of the spacer layer SP3, is shifted to the negative side more than the threshold voltage of the high electron mobility transistor in the related art where the spacer layer SP3 is not interposed. It can be seen, however, that even in this case, if the film thickness of the electron supply layer ES3 is set at about 5 nm or less, the normally-off operation becomes possible sufficiently even in the high electron mobility transistor in the third embodiment.

From the above, it can be seen that according to the third embodiment, in the high electron mobility transistor, the on-resistance can be sufficiently reduced with the normally-off operation maintained, so that the performance of a semiconductor device including the high electron mobility transistor can be improved.

<Method of Manufacturing the Semiconductor Device>

The semiconductor device in the third embodiment is configured in the above manner, and a method of manufacturing the same will be described below with reference to the drawings. Specifically, a case where setting has been performed such that a=1, b=0.82, and z=0 will be taken as an example to describe the method of manufacturing the semiconductor device in the third embodiment. In this case, the spacer layer SP3 is aluminum nitride (AlN) (band gap: about 6.2 eV), and the electron supply layer ES3 is $Al_{0.82}In_{0.18}N$ (band gap: about 5.2 eV). In addition, the p-type cap layer CAP1 is gallium nitride (GaN) (band gap: about 3.4 eV).

Figure 25:
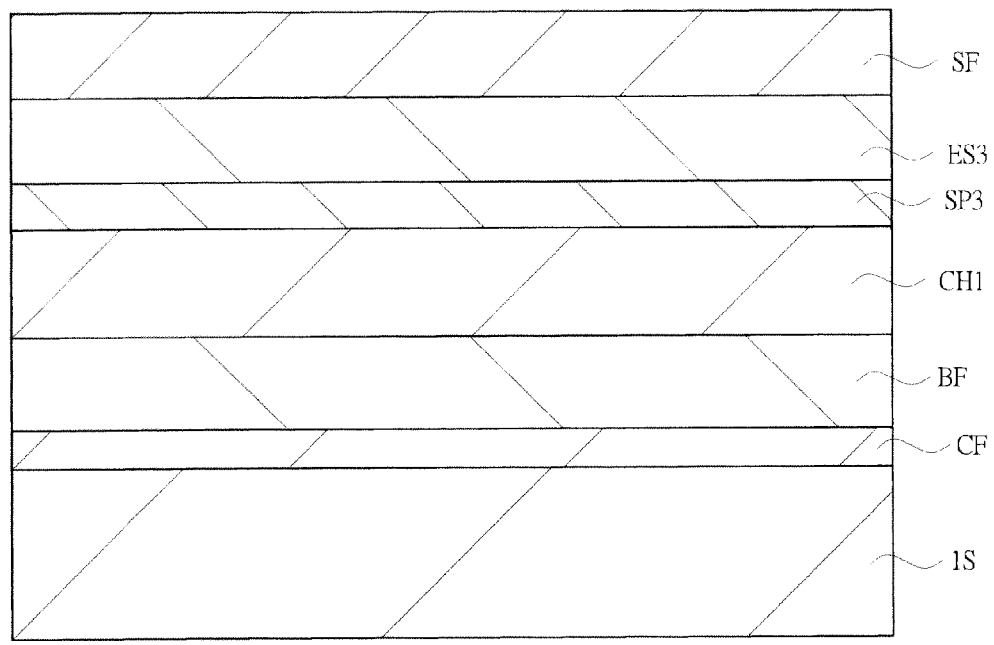
FIG. 25 is a sectional view showing a process of manufacturing a semiconductor device in the third embodiment.

First, as shown in FIG. 25, a semiconductor layer structure is formed, by metal organic chemical vapor deposition (MOCVD), on a semiconductor substrate 1S composed of silicon having an exposed (111) plane, for example. In this semiconductor layer structure, first, a nucleation layer CF composed of a superlattice of alternate layers of undoped aluminum nitride (AlN) and undoped gallium nitride (GaN) is formed on the semiconductor substrate 1S. The film thickness of the nucleation layer CF is 200 nm, for example. Next, a buffer layer BF composed of undoped gallium nitride (GaN), for example, is formed on the nucleation layer CF. The film thickness of the buffer layer BF is 1 μm, for example. Then, a channel layer CH1 composed of undoped gallium nitride (GaN) is formed on the buffer layer BF. The film thickness of the channel layer CH1 is 50 nm, for example. Thereafter, a spacer layer SP3 composed of undoped aluminum nitride (AlN) is formed on the channel layer CH1. The film thickness of the spacer layer SP3 is 1 nm, for example. Then, an electron supply layer ES3 composed of undoped $Al_{0.82}In_{0.18}N$ is formed on the spacer layer SP3. The film thickness of the electron supply layer ES3 is 5 nm, for example. Next, a semiconductor film SF composed of p-type gallium nitride (p-type GaN) is formed on the electron supply layer ES3. The impurity concentration of the semiconductor film SF is $5 \times 10^{18}$ cm$^{-3}$, for example, and the film thickness thereof is 30 nm, for example. In addition, as a p-type impurity, magnesium (Mg), for example, can be used In this manner, the semiconductor layer structure is formed. This semiconductor layer structure is formed by group-III plane growth of deposition in the direction of a [0001] crystal axis (c axis). The respective surfaces, on the side of the gate electrode GE, of the semiconductor layers become (0001) group-III planes. For example, an interface of the spacer layer SP3 with the electron supply layer ES3 becomes a (0001) group-III plane.

Here, the aluminum composition ratio of the electron supply layer ES3 composed of aluminum indium nitride ($Al_b In_{1-b}N$) is set at about b=0.82. This makes it possible to lattice-match the electron supply layer ES3 composed of $Al_{0.82}In_{0.18}N$ to the buffer layer BF composed of gallium nitride (GaN), so that a good crystal quality without internal strains can be obtained.

In the respective semiconductor layers constituting the above semiconductor layer structure, based on spontaneous polarization and piezoelectric polarization, polarization charges are generated at upper and lower interfaces of each semiconductor layer. The area density of the polarization charges is $6.4 \times 10^{13}$ cm$^{-2}$ for the spacer layer SP3 composed of aluminum nitride (AlN), and $4.5 \times 10^{13}$ cm$^{-2}$ for the electron supply layer ES3 composed of $Al_{0.82}In_{0.18}N$, for example. The polarity of the polarization charges, in the case of group-III plane growth, is negative on the surface side and positive on the back surface side.

Figure 26:
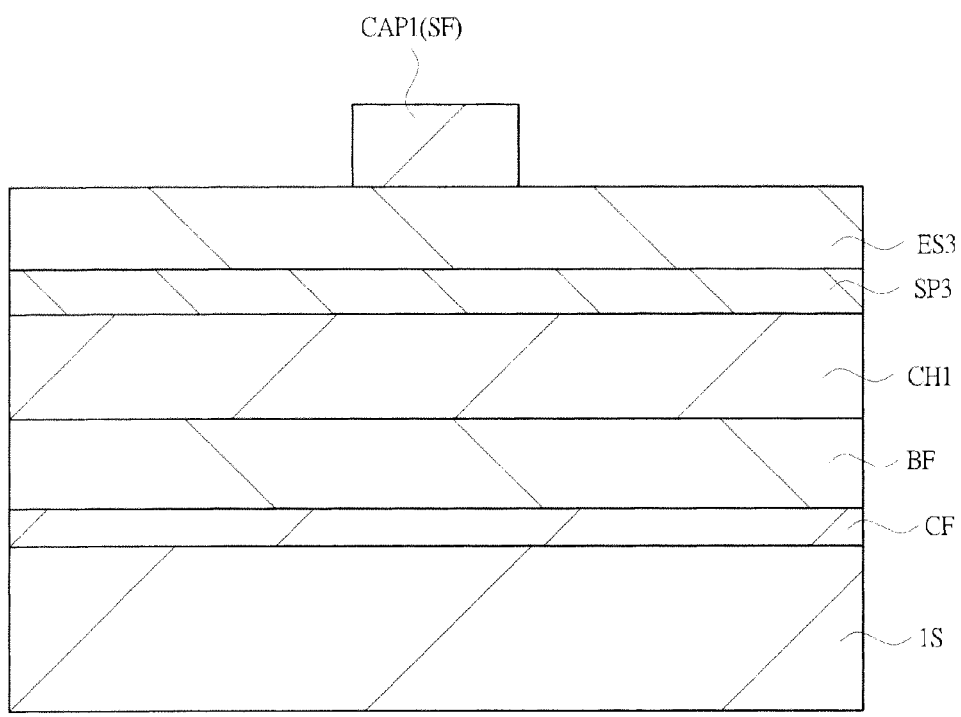
FIG. 26 is a cross-sectional view showing the process of manufacturing the semiconductor device continued from FIG. 25.

Next, as shown in FIG. 26, a resist film is applied on the semiconductor film SF, and exposure and development processes are performed on the resist film to pattern the resist film. The patterning of the resist film is so performed as to leave the resist film in a region where the p-type cap layer CAP1 is to be formed. Then, the p-type cap layer CAP1 composed of the semiconductor film SF is formed by etching the semiconductor film SF with the patterned resist film as a mask. Specifically, the etching of the semiconductor film SF can be performed by dry-etching using etching gas, such as boron chloride ($BCl_3$), for example.

Then, after the patterned resist film has been removed, a resist film is applied on the electron supply layer ES3 on which the p-type cap layer CAP1 has been formed. Subsequently, exposure and development processes are performed on the resist film to pattern the resist film. The patterning of the resist film is performed so as to expose a source electrode forming region and a drain electrode forming region.

Thereafter, a metal film is formed on the patterned resist film. Therefore, in the source electrode forming region and the drain electrode forming region, the metal film is formed directly on the electron supply layer ES3. On the other hand, in the other region, the metal film is formed on the resist film. At this time, the metal film (Ti/Al/Ni/Au) is composed of a titanium film (Ti), an aluminum film (Al) formed on the titanium film, a nickel film (Ni) formed on the aluminum film, and a gold film (Au) formed on the nickel film, for example. The metal film can be formed by vapor deposition, for example.

Figure 27:
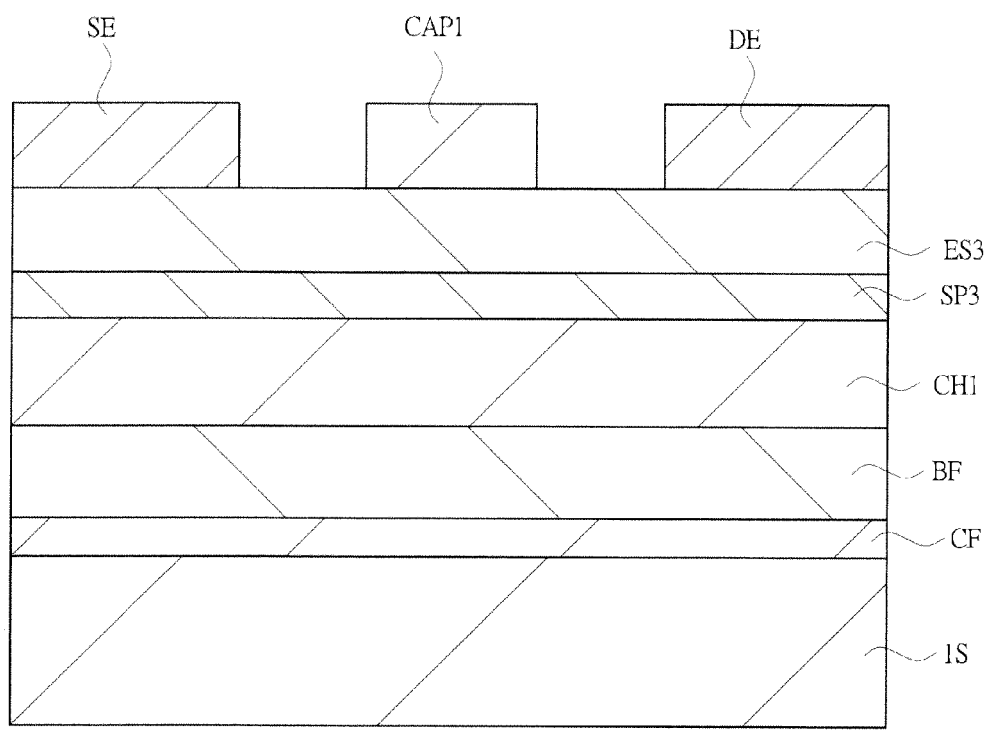
FIG. 27 is a cross-sectional view showing the process of manufacturing the semiconductor device continued from FIG. 26.

Next, the resist film is lifted off. This removes the resist film and the metal film formed on the resist film, and leaves only the metal film formed in direct contact with the electron supply layer ES3. Thereby, as shown in FIG. 27, the source electrode SE and the drain electrode DE, which are composed of the metal film in direct contact with the electron supply layer ES3, can be formed. The source electrode SE and the drain electrode DE are disposed so as to be separated from each other, and the p-type cap layer CAP1 is formed so as to be sandwiched between the source electrode SE and the drain electrode DE. Thereafter, a thermal treatment (alloy treatment) is performed on the semiconductor substrate 1S to bring the source electrode SE, and the channel layer CH1 in which the two-dimensional electron gas is formed, into ohmic contact with each other. Similarly, the thermal treatment brings the drain electrode DE and the channel layer CH1 into ohmic contact with each other. Then, though not shown, in order to achieve element isolation between devices, an element isolation region is formed by implantation of nitrogen (N) ions or the like.

Then, a resist film is applied on the electron supply layer ES3 on which the source electrode SE, the drain electrode DE, and the p-type cap layer CAP1 have been formed. Subsequently, exposure and development processes are performed on the resist film to pattern the resist film. The patterning of the resist film is performed so as to expose a gate electrode forming region on the p-type cap layer CAP1.

Thereafter, a metal film is formed on the patterned resist film. Thereby, in the gate electrode forming region, the metal film MF is formed directly on the p-type cap layer CAP1. On the other hand, in the other region, the metal film is formed on the resist film. At this time, the metal film (Ni/Au) is composed of a nickel film (Ni) and a gold film (Au) formed on the nickel film, for example. The metal film can be formed by vapor deposition, for example. Then, as shown in FIG. 23, the resist film is lifted off This removes the resist film and the metal film formed on the resist film, and leaves only the metal film formed in direct contact with the p-type cap layer CAP1. Thereby, the gate electrode composed of the metal film in direct contact with the p-type cap layer CAP1 can be formed. In the above manner, the high electron mobility transistor (semiconductor device) in the third embodiment can be manufactured.

It should be noted that in the case where aluminum nitride (AlN) is used as the spacer layer SP3, like the third embodiment, alloy scattering of carriers (electrons) constituting the two-dimensional electron gas is suppressed, so that the mobility of electrons is improved. Therefore, according to the third embodiment, the on-resistance of the high electron mobility transistor can be significantly reduced by a synergetic effect of the effect of increasing the mobility and the effect of increasing the maximum carrier concentration of the two-dimensional electron gas.

In addition, in the third embodiment, the aluminum composition ratio of the spacer layer SP3 composed of aluminum gallium nitride ($Al_aGa_{1-a}N$) is set at a=1, but a certain level of effect of improving the on-resistance can be provided even at a=0.5, for example. In this case, by setting the film thickness of the spacer layer SP3 at 2 nm, for example, a threshold voltage approximately equivalent to that in the third embodiment can be obtained.

Figure 28:
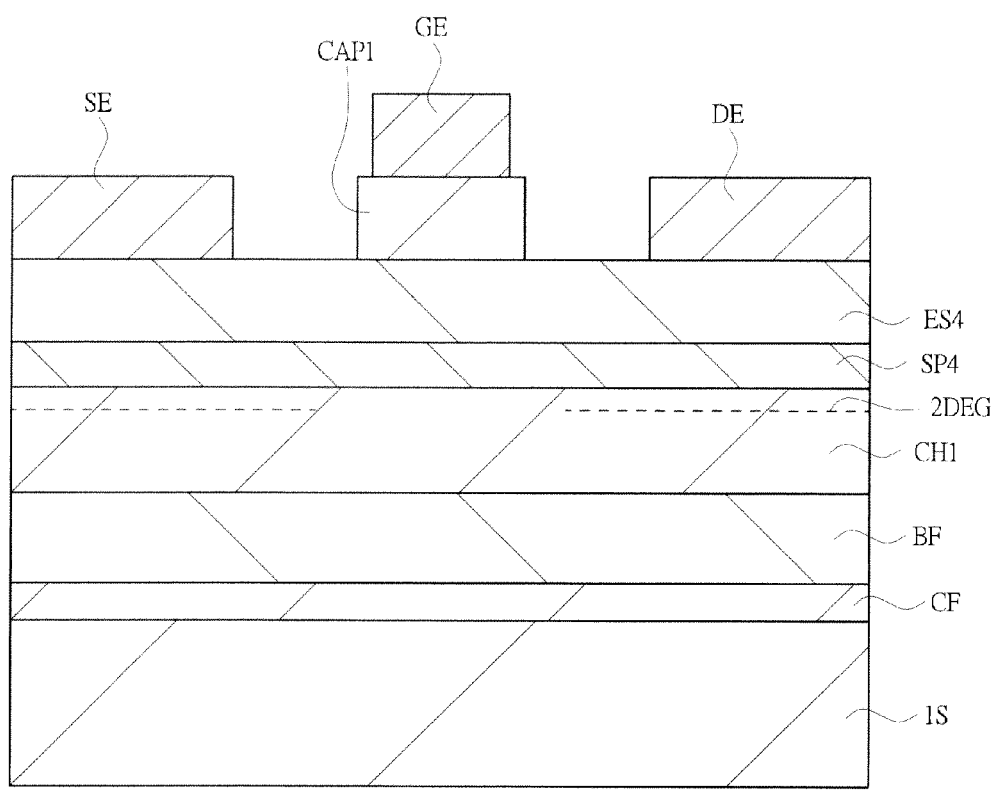
FIG. 28 is a sectional view showing the configuration of a high electron mobility transistor in a fourth embodiment.

(Fourth Embodiment)
<Feature of Fourth Embodiment>
FIG. 28 is a sectional view showing the configuration of a high electron mobility transistor in a fourth embodiment. In FIG. 28, the same reference numerals as in FIG. 4 denote the same contents in FIG. 4, and the fourth embodiment differs from the first embodiment in the composition of a spacer layer SP4 and the composition of an electron supply layer ES4. That is, a feature of the fourth embodiment lies in that the spacer layer SP4 is composed of aluminum indium nitride ($Al_dIn_{1-d}N$), and the electron supply layer ES4 is composed of aluminum indium nitride ($Al_eIn_{1-e}N$).

Here, the band gap of the spacer layer SP4 composed of aluminum indium nitride ($Al_dIn_{1-d}N$) is larger than the band gap of the electron supply layer ES4 composed of aluminum indium nitride ($Al_eIn_{1-e}N$). Thereby, due to the fact that the band gap of the spacer layer SP4 is large, a high potential barrier (electron barrier) is formed in the vicinity of an interface between the channel layer CH1 and the electron supply layer ES4. That is, a higher potential barrier is formed when the spacer layer SP4 is provided than when the spacer layer SP4 is not provided. As a result, according to the high electron mobility transistor in the fourth embodiment, the high potential barrier suppresses the gate leakage current significantly. Therefore, according to the high electron mobility transistor in the fourth embodiment, the maximum carrier concentration of the two-dimensional electron gas accumulated in the channel layer CH1 increases, so that the on-resistance of the high electron mobility transistor in the fourth embodiment can be sufficiently reduced.

Specifically, in the fourth embodiment, the spacer layer SP4 is formed of undoped $Al_dIn_{1-d}N$, and the electron supply layer ES4 is formed of undoped $Al_eIn_{1-e}N$. Therefore, a condition that the band gap of the spacer layer SP4 becomes larger than the band gap of the electron supply layer ES4 will be described below.

First, from the expression (3) described in the second embodiment, if a composition ratio d of the spacer layer SP4 and a composition ratio e of the electron supply layer ES4 are set so as to satisfy an inequality (6), the band gap of the spacer layer SP4 becomes larger than the band gap of the electron supply layer ES4.

$$e < d \tag{6}$$

By forming the spacer layer SP4 and the electron supply layer ES4 such that the composition ratio d of the spacer layer SP4 and the composition ratio e of the electron supply layer ES4 satisfy the inequality (6), a higher potential barrier can be formed when the spacer layer SP4 is provided than when the spacer layer SP4 is not provided. As a result, the high potential barrier suppresses the gate leakage current significantly, so that the maximum carrier concentration of the two-dimensional electron gas accumulated in the channel layer CH1 increases, which makes it possible to sufficiently reduce the on-resistance of the high electron mobility transistor in the fourth embodiment.

In the fourth embodiment, the potential barrier due to the spacer layer SP4 is remarkably high. This is due to the fact that the conduction band offset between the aluminum indium nitride ($Al_dIn_{1-d}N$) constituting the spacer layer SP4 and gallium nitride (GaN) constituting the channel layer CH1 is as much as about 1.5 eV. Further, within aluminum indium nitride ($Al_dIn_{1-d}N$) constituting the spacer layer SP4, an internal electric field caused by spontaneous polarization is also generated. Therefore, by a synergetic effect of the above large conduction band offset and the above internal electric field, a higher potential barrier is formed in the vicinity of an interface of the channel layer CH1, than in the related art where the spacer layer SP4 is not provided.

From this, it can be supposed that it becomes difficult for part of the two-dimensional electron gas accumulated in the well-type potential in the vicinity of the interface between the channel layer CH1 and the spacer layer SP4 to get over the high potential barrier. This means that the gate leakage current flowing from the gate electrode GE toward the channel layer CH1 is sufficiently reduced. As a result, according to the high electron mobility transistor in the fourth embodiment, the maximum carrier concentration of the two-dimensional electron gas accumulated in the channel layer CH1 increases, so that such a remarkable effect as allowing the on-resistance of the high electron mobility transistor in the fourth embodiment to be reduced sufficiently can be obtained.

On the other hand, also in the fourth embodiment, due to ionization of acceptor, negative charges are produced within the p-type cap layer CAP1. Therefore, by adjusting, if necessary, the film thickness of the electron supply layer ES4, in thermal equilibrium, the channel layer CH1 under the gate electrode GE is depleted, so that the normally-off operation whose threshold voltage is a positive voltage can be realized.

Figure 29:
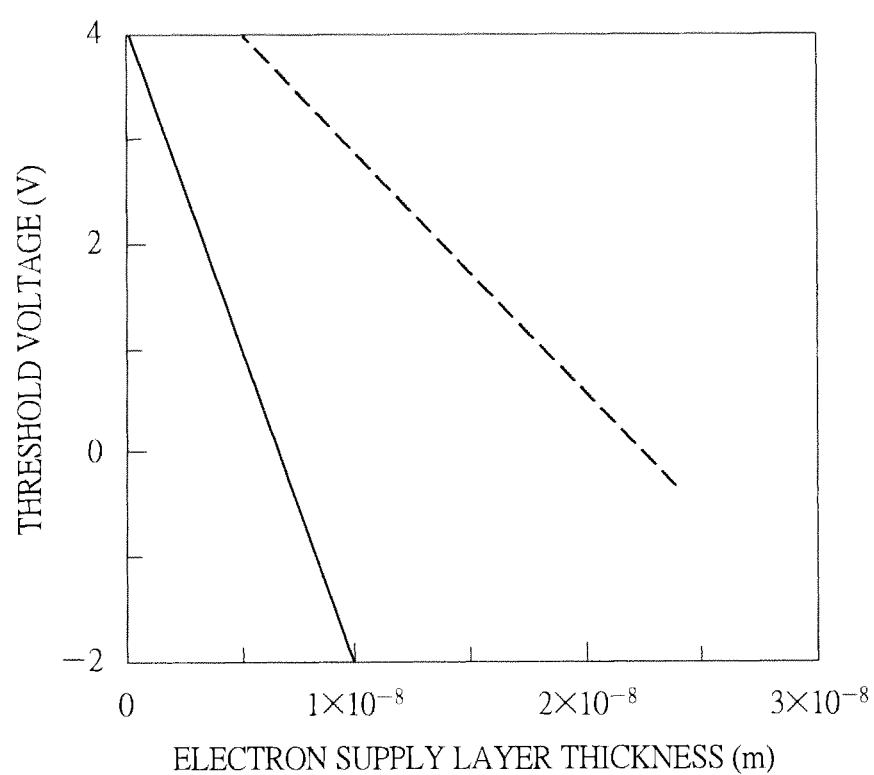
FIG. 29 is a graph showing numerical simulation results showing film thickness dependence of an electron supply layer with respect to a threshold voltage, in the high electron mobility transistor in the fourth embodiment, and in the high electron mobility transistor in the related art.

FIG. 29 shows numerical simulation results showing film thickness dependence of the electron supply layer ES4 with respect to the threshold voltage, in the high electron mobility transistor in the fourth embodiment, and in the high electron mobility transistor in the related art. In FIG. 29, the horizontal axis represents the film thickness (m) of the electron supply layer ES4, and the vertical axis represents the threshold voltage (V). At this time, the acceptor concentration of the p-type cap layer CAP1 is set at $5 \times 10^{18}$ cm$^{-3}$, and the film thickness of the p-type cap layer CAP1 is set at 30 nm. In FIG. 29, the solid line represents the high electron mobility transistor in the fourth embodiment, and the broken line represents the high electron mobility transistor in the related art.

As shown in FIG. 29, it can be seen that the threshold voltage of the high electron mobility transistor in the fourth embodiment, under the influence of the interposition of the spacer layer SP4, is shifted to the negative side more than the threshold voltage of the high electron mobility transistor in the related art where the spacer layer SP4 is not interposed. It can be seen, however, that even in this case, if the film thickness of the electron supply layer ES4 is set at about 8 tun or less, the normally-off operation becomes possible sufficiently even in the high electron mobility transistor in the fourth embodiment.

From the above, it can be seen that according to the fourth embodiment, in the high electron mobility transistor, the on-resistance can be sufficiently reduced with the normally-off operation maintained, so that the performance of a semiconductor device including the high electron mobility transistor can be improved.

<Method of Manufacturing the Semiconductor Device>

The semiconductor device in the fourth embodiment is configured in the above manner, and a method of manufacturing the same will be described below with reference to the drawings. Specifically, a case where setting has been performed such that d=0.9, e=0.7, and z=0 will be taken as an example to describe the method of manufacturing the semiconductor device in the fourth embodiment. In this case, the spacer layer SP4 is composed of aluminum indium nitride ($Al_{0.9}In_{0.1}N$) (band gap: about 5.7 eV), and the electron supply layer ES4 is composed of aluminum indium nitride ($Al_{0.7}In_{0.3}N$) (band gap: about 4.6 eV). In addition, the p-type cap layer CAP1 is composed of gallium nitride (GaN) (band gap: about 3.4 eV).

Figure 30:
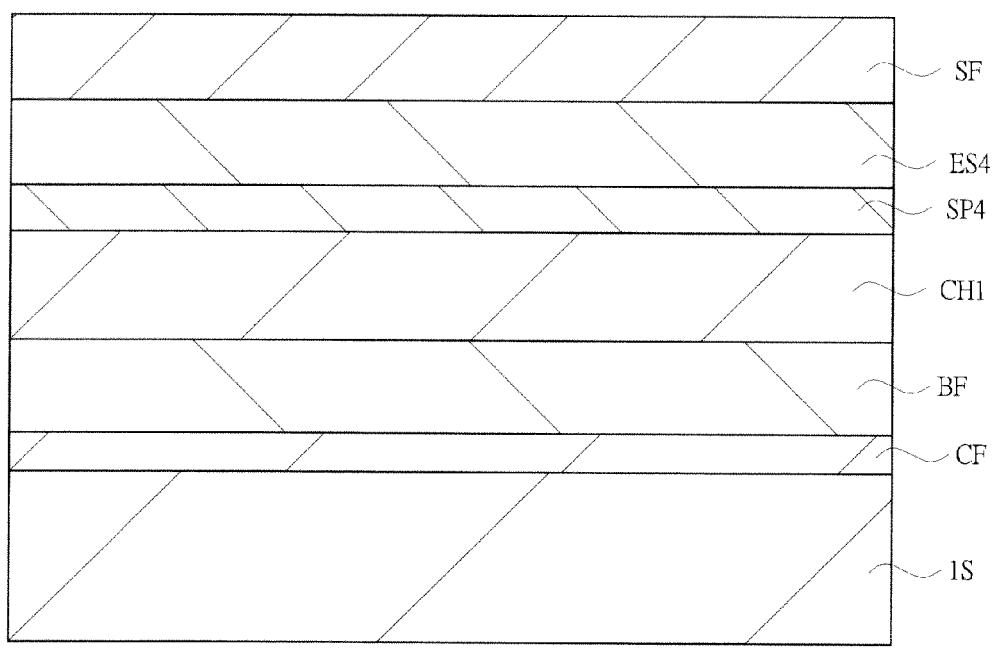
FIG. 30 is a sectional view showing a process of manufacturing a semiconductor device in the fourth embodiment.

First, as shown in FIG. 30, a semiconductor layer structure is formed, by metal organic chemical vapor deposition (MOCVD), on a semiconductor substrate 1S composed of silicon having an exposed (111) plane, for example. In this semiconductor layer structure, first, a nucleation layer CF composed of a superlattice of alternate layers of undoped aluminum nitride (AlN) and undoped gallium nitride (GaN) is formed on the semiconductor substrate 1S. The film thickness of the nucleation layer CF is 200 nm, for example. Next, a buffer layer BF composed of undoped gallium nitride (GaN), for example, is formed on the nucleation layer CF. The film thickness of the buffer layer BF is 1 μm, for example. Then, a channel layer CH1 composed of undoped gallium nitride (GaN) is formed on the buffer layer BF. The film thickness of the channel layer CH1 is 50 nm, for example. Thereafter, a spacer layer SP4 composed of undoped aluminum indium nitride ($Al_{0.9}In_{0.1}N$) is formed on the channel layer CH1. The film thickness of the spacer layer SP4 is 1 nm, for example. Then, an electron supply layer ES4 composed of undoped $Al_{0.7}In_{0.3}N$ is formed on the spacer layer SP4. The film thickness of the electron supply layer ES4 is 7 nm, for example. Next, a semiconductor film SF composed of p-type gallium nitride (p-type GaN) is formed on the electron supply layer ES4. The impurity concentration of the semiconductor film SF is $5 \times 10^{18}$ cm$^{-3}$, for example, and the film thickness thereof is 30 nm, for example. In addition, as a p-type impurity, magnesium (Mg), for example, can be used. In this manner, the semiconductor layer structure is formed. This semiconductor layer structure is formed by group-III plane growth of deposition in the direction of a [0001] crystal axis (c axis). This causes the respective surfaces, on the side of the gate electrode GE, of the semiconductor layers to become (0001) group-III planes. For example, an interface of the spacer layer SP4 with the electron supply layer ES4 becomes a (0001) group-III plane.

Here, the film thickness of the spacer layer SP4 is thinner than the film thickness of the electron supply layer ES4, and further, the film thickness of the electron supply layer ES4 is set thinner than a critical thickness at which a dislocation is generated on the buffer layer BF. Therefore, according to the fourth embodiment, a good crystal quality where dislocation generation has been suppressed can be obtained.

In the respective semiconductor layers constituting the above semiconductor layer structure, based on spontaneous polarization and piezoelectric polarization, polarization charges are generated at upper and lower interfaces of each semiconductor layer. The area density of the polarization charges is $5.3 \times 10^{13}$ cm$^{-2}$ for the spacer layer SP4 composed of aluminum indium nitride ($Al_{0.9}In_{0.1}N$), and $3.2 \times 10^{13}$ cm$^{-2}$ for the electron supply layer ES4 composed of $Al_{0.7}In_{0.3}N$, for example. The polarity of the polarization charges, in the case of group-III plane growth, is negative on the surface side and positive on the back surface side.

Figure 31:
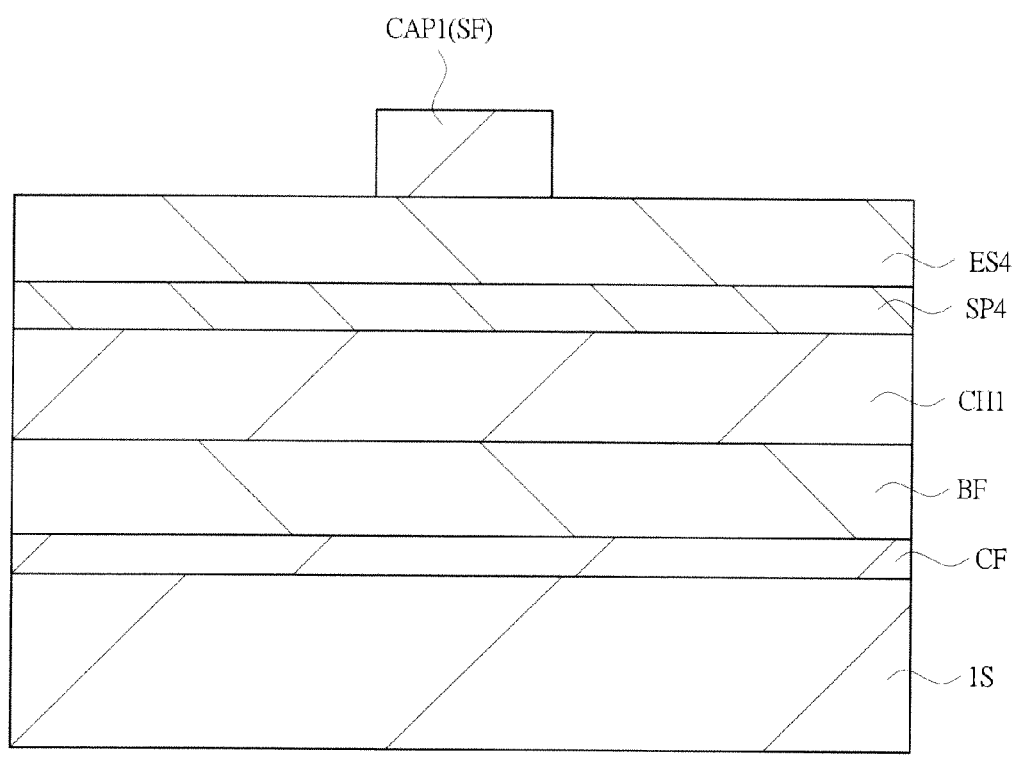
FIG. 31 is a cross-sectional view showing the process of manufacturing the semiconductor device continued from FIG. 30.

Next, as shown in FIG. 31, a resist film is applied on the semiconductor film SF, and exposure and development processes are performed on the resist film to pattern the resist film. The patterning of the resist film is performed so as to leave the resist film in a region where the p-type cap layer CAP1 is to be formed. Then, the p-type cap layer CAP1 composed of the semiconductor film SF is formed by etching the semiconductor film SF with the patterned resist film as a mask. Specifically, the etching of the semiconductor film SF can be performed by dry-etching using etching gas, such as boron chloride ($BCl_3$), for example.

Then, after the patterned resist film has been removed, a resist film is applied on the electron supply layer ES4 on which the p-type cap layer CAP1 has been formed. Subsequently, exposure and development processes are performed on the resist film to pattern the resist film. The patterning of the resist film is performed so as to expose a source electrode forming region and a drain electrode forming region.

Thereafter, a metal film is formed on the patterned resist film. Therefore, in the source electrode forming region and the drain electrode forming region, the metal film is formed directly on the electron supply layer ES4. On the other hand, in the other region, the metal film is formed on the resist film. At this time, the metal film (Ti/Al/Au) is composed of a titanium film (Ti), an aluminum film (Al) formed on the titanium film, a nickel film (Ni) formed on the aluminum film, and a gold film (Au) formed on the nickel film, for example. The metal film can be formed by vapor deposition, for example.

Figure 32:
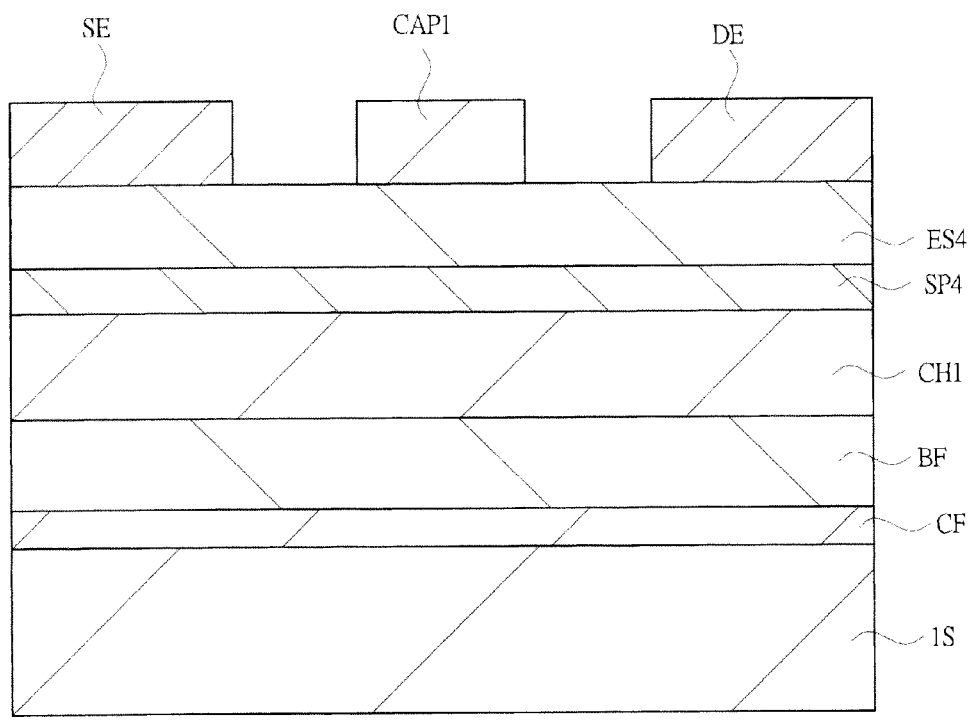
FIG. 32 is a cross-sectional view showing the process of manufacturing the semiconductor device continued from FIG. 31.

Next, the resist film is lifted off This removes the resist film and the metal film formed on the resist film, and leaves only the metal film formed in direct contact with the electron supply layer ES4. Thereby, as shown in FIG. 32, the source electrode SE and the drain electrode DE, which are composed of the metal film in direct contact with the electron supply layer ES4, can be formed. The source electrode SE and the drain electrode DE are disposed so as to be separated from each other, and the p-type cap layer CAP1 is formed so as to be sandwiched between the source electrode SE and the drain electrode DE. Thereafter, a thermal treatment (alloy treatment) is performed on the semiconductor substrate 1S to bring the source electrode SE, and the channel layer CH1 in which the two-dimensional electron gas is formed, into ohmic contact with each other. Similarly, the thermal treatment brings the drain electrode DE and the channel layer CH1 into ohmic contact with each other. Then, though not shown, in order to achieve element isolation between devices, an element isolation region is formed by implantation of nitrogen (N) ions or the like.

Then, a resist film is applied on the electron supply layer ES4 on which the source electrode SE, the drain electrode DE, and the p-type cap layer CAP1 have been formed. Subsequently, exposure and development processes are performed on the resist film to pattern the resist film. The patterning of the resist film is performed so as to expose a gate electrode forming region on the p-type cap layer CAP1.

Thereafter, a metal film is formed on the patterned resist film. Thereby, in the gate electrode forming region, the metal film is formed directly on the p-type cap layer CAP1. On the other hand, in the other region, the metal film is formed on the resist film. At this time, the metal film (Ni/Au) is composed of a nickel film (Ni) and a gold film (Au) formed on the nickel film, for example The metal film can be formed by vapor deposition, for example. Then, as shown in FIG. 28, the resist film is lifted off This removes the resist film and the metal film formed on the resist film, and leaves only the metal film formed in direct contact with the p-type cap layer CAP1. Thereby, the gate electrode composed of the metal film in direct contact with the p-type cap layer CAP1 can be formed. In the above manner, the high electron mobility transistor (semiconductor device) in the fourth embodiment can be manufactured.

(Fifth Embodiment)

Figure 33:
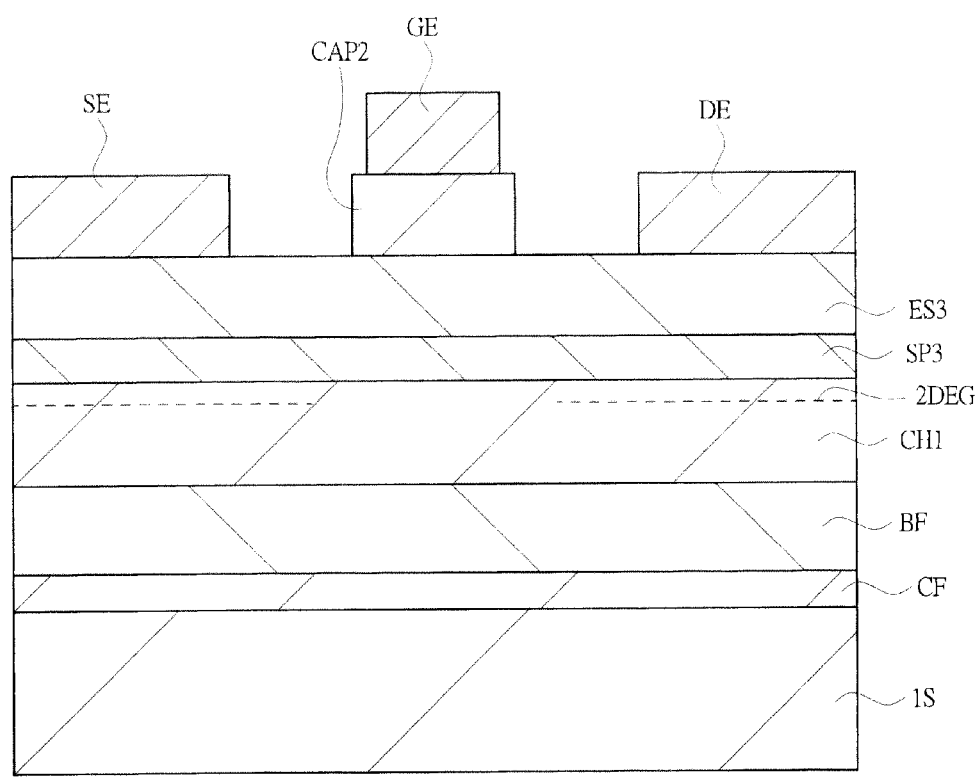
FIG. 33 is a sectional view showing the configuration of a high electron mobility transistor in a fifth embodiment.

FIG. 33 is a sectional view showing the configuration of a high electron mobility transistor in a fifth embodiment. The fifth embodiment has the same configuration as the third embodiment, except that the p-type cap layer CAP1 in the third embodiment is replaced with a cap layer CAP2 composed of p-type ($0 \le c \le 1$). Therefore, the fifth embodiment can also obtain the same advantageous effect as the third embodiment. That is, also in the fifth embodiment, the potential barrier due to the spacer layer SP3 is remarkably high. This is due to the fact that a conduction band offset between aluminum gallium nitride ($Al_aGa_{1-a}N$) constituting the spacer layer SP3 and gallium nitride (GaN) constituting the channel layer CH1 is as much as about 1.9 eV. Further, within aluminum gallium nitride ($Al_aGa_{1-a}N$) constituting the spacer layer SP3, an internal electric field caused by spontaneous polarization is also generated. Therefore, by a synergetic effect of the above large conduction band offset and the above internal electric field, a higher potential barrier is formed in the vicinity of an interface of the channel layer CH1, than in the related art where the spacer layer SP3 is not provided.

From this, it can be supposed that it becomes difficult for part of the two-dimensional electron gas accumulated in the well-type potential in the vicinity of the interface between the channel layer CH1 and the spacer layer SP3 to get over the high potential barrier. This means that the gate leakage current flowing from the gate electrode GE toward the channel layer CH1 is sufficiently reduced. As a result, according to the high electron mobility transistor in the fifth embodiment, the maximum carrier concentration of the two-dimensional electron gas accumulated in the channel layer CH1 increases, so that such a remarkable effect as allowing the on-resistance of the high electron mobility transistor in the fifth embodiment to be reduced sufficiently can be obtained.

On the other hand, also in the fifth embodiment, ionization of acceptor causes negative charges within the p-type cap layer CAP1. Therefore, by adjusting, if necessary, the film thickness of the electron supply layer ES3, in thermal equilibrium, the channel layer CH1 under the gate electrode GE is depleted, so that the normally-off operation whose threshold voltage is a positive voltage can be realized.

From the above, it can be seen that according to the fifth embodiment, in the high electron mobility transistor, the on-resistance can be sufficiently reduced with the normally-off operation maintained, so that the performance of a semiconductor device including the high electron mobility transistor can be improved.

<Method of Manufacturing the Semiconductor Device>

The semiconductor device in the fifth embodiment is configured in the above manner, and a method of manufacturing the same will be described below with reference to the drawings. Specifically, a case where setting has been performed such that a=1, b=0.82, and c=0.82 will be taken as an example to describe the method of manufacturing the semiconductor device in the fifth embodiment. In this case, the spacer layer SP3 is composed of aluminum nitride (AlN) (band gap: about 6.2 eV), and the electron supply layer ES3 and the p-type cap layer CAP2 are composed of $Al_{0.82}In_{0.18}N$ (band gap: about 5.2 eV).

Figure 34:
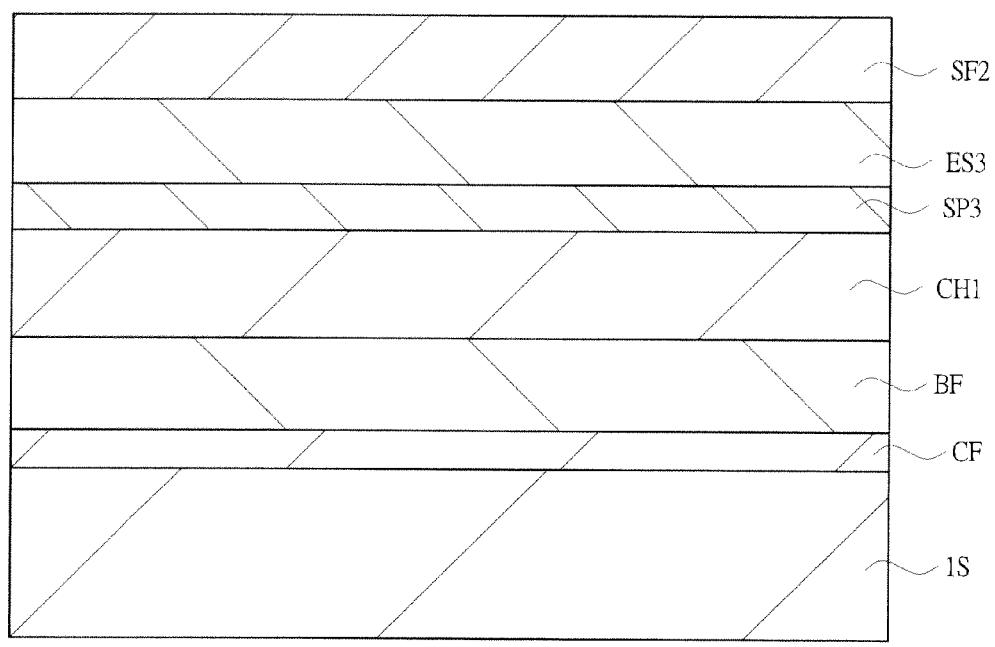
FIG. 34 is a sectional view showing a process of manufacturing a semiconductor device in the fifth embodiment.

First, as shown in FIG. 34, a semiconductor layer structure is formed, by metal organic chemical vapor deposition (MOCVD), on a semiconductor substrate 1S composed of silicon having an exposed (111) plane, for example. In this semiconductor layer structure, first, a nucleation layer CF composed of a superlattice of alternate layers of undoped aluminum nitride (AlN) and undoped gallium nitride (GaN) is formed on the semiconductor substrate 1S. The film thickness of the nucleation layer CF is 200 nm, for example. Next, a buffer layer BF composed of undoped gallium nitride (GaN), for example, is formed on the nucleation layer CF. The film thickness of the buffer layer BF is 1 μm, for example. Then, a channel layer CH1 composed of undoped gallium nitride (GaN) is formed on the buffer layer BF. The film thickness of the channel layer CH1 is 50 nm, for example. Thereafter, a spacer layer SP3 composed of undoped aluminum nitride (AlN) is formed on the channel layer CH1. The film thickness of the spacer layer SP3 is 1 nm, for example. Then, an electron supply layer ES3 composed of undoped $Al_{0.82}In_{0.18}N$ is formed on the spacer layer SP3. The film thickness of the electron supply layer ES3 is 5 nm, for example. Next, a semiconductor film SF2 composed of p-type $Al_{0.82}In_{0.18}N$ is formed on the electron supply layer ES3. The impurity concentration of the semiconductor film SF2 is $5 \times 10^{19}$ $cm^{-3}$, for example, and the film thickness thereof is 25 nm, for example. In addition, as a p-type impurity, magnesium (Mg), for example, can be used. In this manner, the semiconductor layer structure is formed. This semiconductor layer structure is formed by group-III plane growth of deposition in the direction of a [0001] crystal axis (c axis). This causes the respective surfaces of the semiconductor layers to become (0001) group-III planes.

Here, the aluminum composition ratio of the electron supply layer ES3 composed of aluminum indium nitride ($Al_b In_{1-b}$ N) is set at about b=0.82. This makes it possible to lattice-match the electron supply layer ES3 composed of $Al_{0.82}In_{0.18}N$ to the buffer layer BF composed of gallium nitride (GaN), so that a good crystal quality without internal strains can be obtained.

In the respective semiconductor layers constituting the above semiconductor layer structure, based on spontaneous polarization and piezoelectric polarization, polarization charges are generated at upper and lower interfaces of each semiconductor layer. The area density of the polarization charges is $6.4 \times 10^{13}$ cm$^{-2}$ for the spacer layer SP3 composed of aluminum nitride (AlN), and $4.5 \times 10^{13}$ cm$^{-2}$ for the electron supply layer ES3 composed of $Al_{0.82}In_{0.18}N$, for example. The polarity of the polarization charges, in the case of group-III plane growth, is negative on the surface side and positive on the back surface side.

Figure 35:
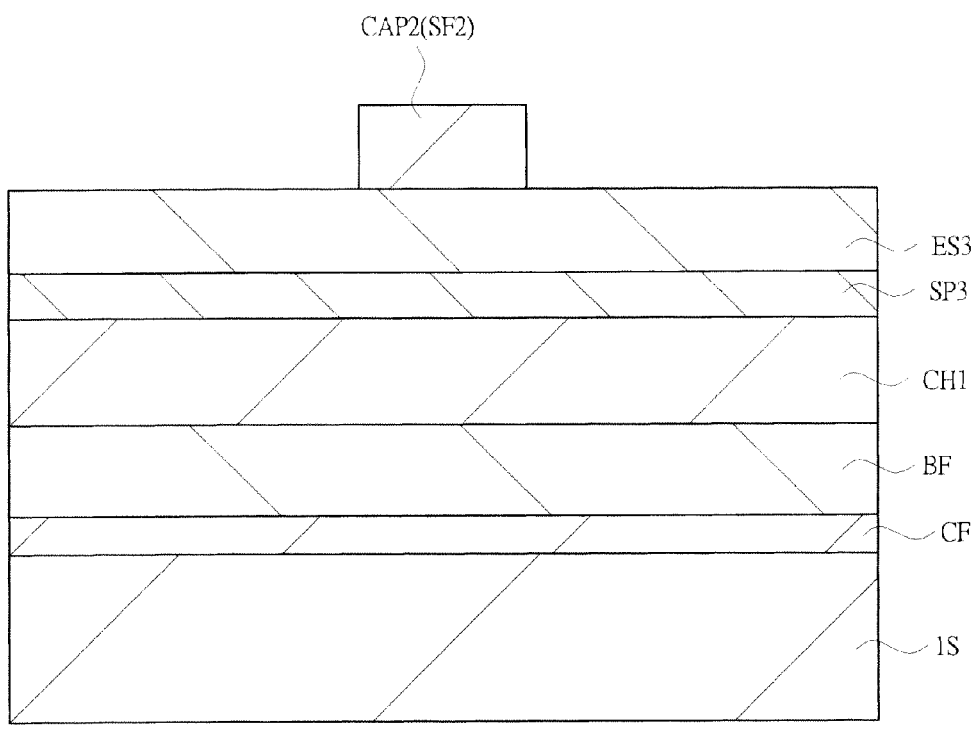
FIG. 35 is a cross-sectional view showing the process of manufacturing the semiconductor device continued from FIG. 34.

Next, as shown in FIG. 35, a resist film is applied on the semiconductor film SF2, and exposure and development processes are performed on the resist film to pattern the resist film. The patterning of the resist film is so performed as to leave the resist film in a region where the p-type cap layer CAP2 is to be formed. Then, the p-type cap layer CAP2 composed of the semiconductor film SF2 is formed by etching the semiconductor film SF2 with the patterned resist film as a mask. Specifically, the etching of the semiconductor film SF2 can be performed by dry-etching using etching gas, such as boron chloride ($BCl_3$), for example.

Then, after the patterned resist film has been removed, a resist film is applied on the electron supply layer ES3 on which the p-type cap layer CAP2 has been formed. Subsequently, exposure and development processes are performed on the resist film to pattern the resist film. The patterning of the resist film is performed so as to expose a source electrode forming region and a drain electrode forming region.

Thereafter, a metal film is formed on the patterned resist film. Therefore, in the source electrode forming region and the drain electrode forming region, the metal film is formed directly on the electron supply layer ES3. On the other hand, in the other region, the metal film is formed on the resist film. At this time, the metal film (Ti/Al/Ni/Au) is composed of a titanium film (Ti), an aluminum film (Al) formed on the titanium film, a nickel film (Ni) formed on the aluminum film, and a gold film (Au) formed on the nickel film, for example. The metal film can be formed by vapor deposition, for example.

Figure 36:
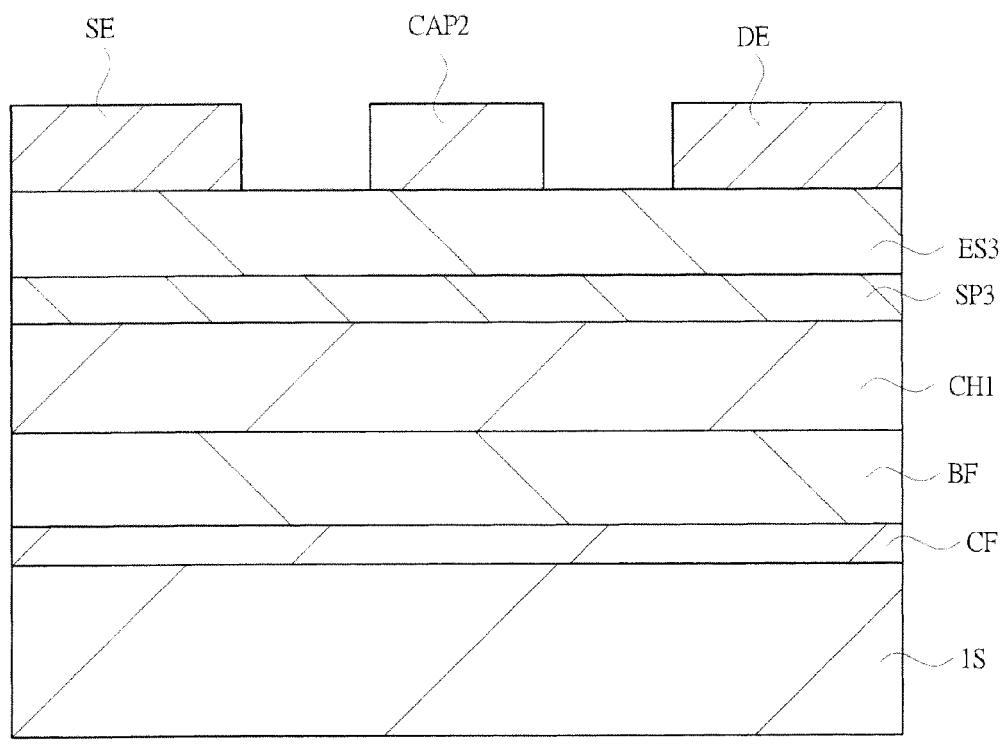
FIG. 36 is a cross-sectional view showing the process of manufacturing the semiconductor device continued from FIG. 35.

Next, the resist film is lifted off. This removes the resist film and the metal film formed on the resist film, and leaves only the metal film formed in direct contact with the electron supply layer ES3. Thereby, as shown in FIG. 36, the source electrode SE and the drain electrode DE, which are composed of the metal film in direct contact with the electron supply layer ES3, can be formed. The source electrode SE and the drain electrode DE are disposed so as to be separated from each other, and the p-type cap layer CAP2 is formed so as to be sandwiched between the source electrode SE and the drain electrode DE. Thereafter, a thermal treatment (alloy treatment) is performed on the semiconductor substrate 1S to bring the source electrode SE, and the channel layer CH1 in which the two-dimensional electron gas is formed, into ohmic contact with each other. Similarly, the thermal treatment brings the drain electrode DE and the channel layer CH1 into ohmic contact with each other. Then, though not shown, in order to achieve element isolation between devices, an element isolation region is formed by implantation of nitrogen (N) ions or the like.

Then, a resist film is applied on the electron supply layer ES3 on which the source electrode SE, the drain electrode DE, and the p-type cap layer CAP2 have been formed. Subsequently, exposure and development processes are performed on the resist film to pattern the resist film. The patterning of the resist film is performed so as to expose a gate electrode forming region on the p-type cap layer CAP2.

Thereafter, a metal film is formed on the patterned resist film. Thereby, in the gate electrode forming region, the metal film is formed directly on the p-type cap layer CAP2. On the other hand, in the other region, the metal film is formed on the resist film. At this time, the metal film (Ni/Au) is composed of a nickel film (Ni) and a gold film (Au) formed on the nickel film, for example. The metal film can be formed by vapor deposition, for example. Then, as shown in FIG. 33, the resist film is lifted off. This removes the resist film and the metal film formed on the resist film, and leaves only the metal film formed in direct contact with the p-type cap layer CAP2. Thereby, the gate electrode composed of the metal film in direct contact with the p-type cap layer CAP2 can be formed. In the above manner, the high electron mobility transistor (semiconductor device) in the fifth embodiment can be manufactured.

It should be noted that in the case where aluminum nitride (AlN) is used as the spacer layer SP3, like the fifth embodiment, alloy scattering of carriers (electrons) constituting the two-dimensional electron gas is suppressed, so that the mobility of electrons is improved. Therefore, according to the fifth embodiment, by a synergetic effect of the effect of increasing the maximum carrier concentration of the two-dimensional electron gas and the effect of increasing the mobility, the on-resistance of the high electron mobility transistor can be significantly reduced.

(Sixth Embodiment)

Figure 37:
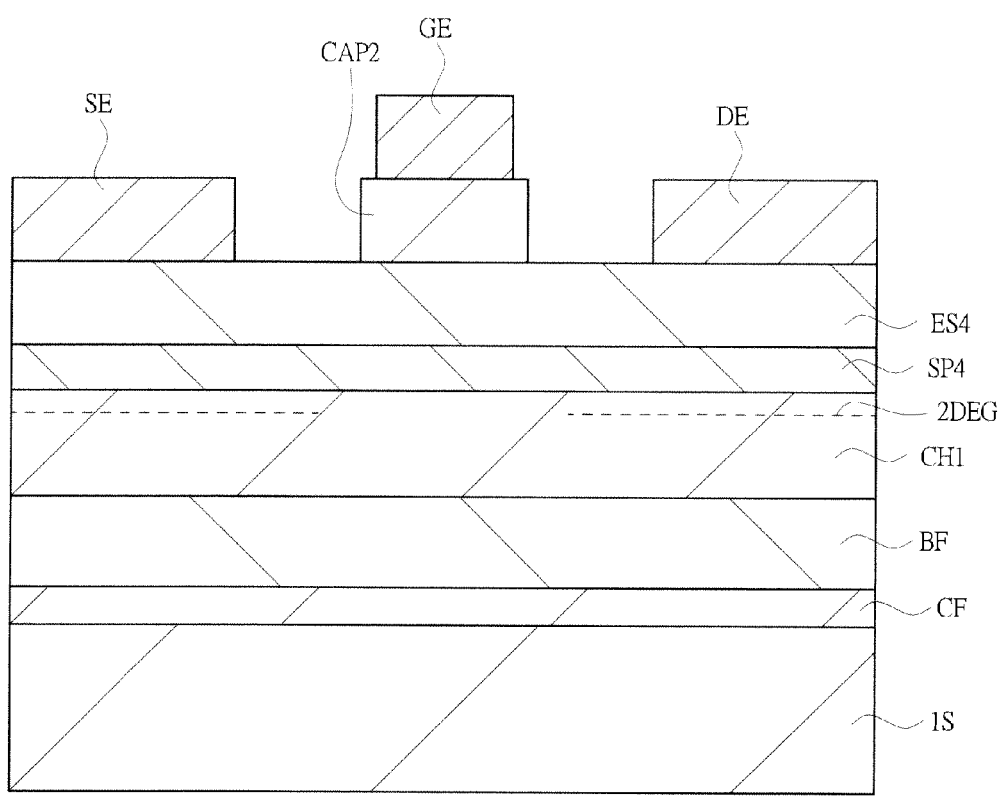
FIG. 37 is a sectional view showing the configuration of a high electron mobility transistor in a sixth embodiment.

FIG. 37 is a sectional view showing the configuration of a high electron mobility transistor in a sixth embodiment. The sixth embodiment has the same configuration as the fourth embodiment, except that the p-type cap layer CAP1 in the fourth embodiment is replaced with a cap layer CAP2 composed of p-type $Al_fIn_{1-f}N$ ($0 \leq f \leq 1$). Therefore, the sixth embodiment can also obtain the same advantageous effect as the fourth embodiment. That is, also in the sixth embodiment, the potential barrier due to the spacer layer SP4 is remarkably high. This is due to the fact that a conduction band offset between aluminum indium nitride ($Al_dIn_{1-d}N$) constituting the spacer layer SP4 and gallium nitride (GaN) constituting the channel layer CH1 is as much as about 1.5 eV. Further, within aluminum indium nitride ($Al_dIn_{1-d}N$) constituting the spacer layer SP4, an internal electric field caused by spontaneous polarization is also generated. Therefore, by a synergetic effect of the above large conduction band offset and the above internal electric field, a higher potential barrier is formed in the vicinity of an interface of the channel layer CH1, than in the related art where the spacer layer SP4 is not provided.

From this, it can be supposed that it becomes difficult for part of the two-dimensional electron gas accumulated in the well-type potential in the vicinity of the interface between the channel layer CH1 and the spacer layer SP4 to get over the high potential barrier. This means that the gate leakage current flowing from the gate electrode GE toward the channel layer CH1 is sufficiently reduced. As a result, according to the high electron mobility transistor in the sixth embodiment, the maximum carrier concentration of the two-dimensional electron gas accumulated in the channel layer CH1 increases, so that such a remarkable effect as allowing the on-resistance of the high electron mobility transistor in the sixth embodiment to be reduced sufficiently can be obtained.

On the other hand, also in the sixth embodiment, ionization of acceptor causes negative charges within the p-type cap layer CAP2. Therefore, by adjusting, if necessary, the film thickness of the electron supply layer ES4, in thermal equilibrium, the channel layer CH1 under the gate electrode GE is depleted, so that the normally-off operation whose threshold voltage is a positive voltage can be realized.

From the above, it can be seen that according to the sixth embodiment, in the high electron mobility transistor, the on-resistance can be sufficiently reduced with the normally-off operation maintained, so that the performance of a semiconductor device including the high electron mobility transistor can be improved.

<Method of Manufacturing the Semiconductor Device>

The semiconductor device in the sixth embodiment is configured in the above manner, and a method of manufacturing the same will be described below with reference to the drawings Specifically, a case where setting has been performed such that d=0.9, e=0.7, and f=0.7 will be taken as an example to describe the method of manufacturing the semiconductor device in the sixth embodiment. In this case, the spacer layer SP4 is composed of aluminum indium nitride ($Al_{0.9}In_{0.1}N$) (band gap: about 5.7 eV), and the electron supply layer ES4 and the p-type cap layer CAP2 are composed of aluminum indium nitride ($Al_{0.7}In_{0.3}N$) (band gap: about 4.6 eV).

Figure 38:
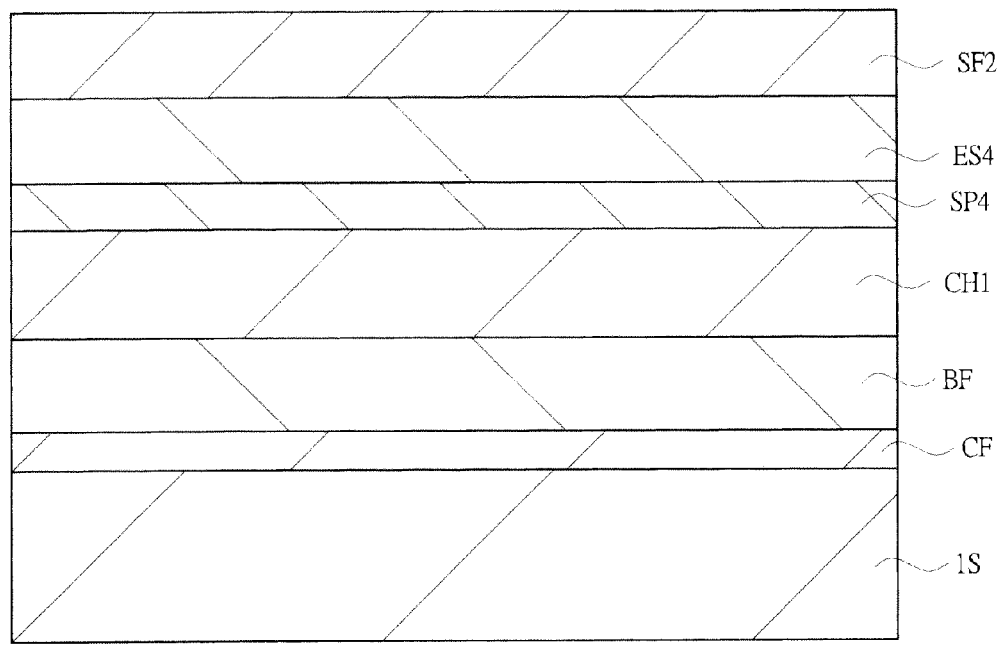
FIG. 38 is a sectional view showing a process of manufacturing a semiconductor device in the sixth embodiment.

First, as shown in FIG. 38, a semiconductor layer structure is formed, by metal organic chemical vapor deposition (MOCVD), on a semiconductor substrate 1S composed of silicon having an exposed (111) plane, for example. In this semiconductor layer structure, first, a nucleation layer CF composed of a superlattice of alternate layers of undoped aluminum nitride (AlN) and undoped gallium nitride (GaN) is formed on the semiconductor substrate 1S. The film thickness of the nucleation layer CF is 200 nm, for example. Next, a buffer layer BF composed of undoped gallium nitride (GaN), for example, is formed on the nucleation layer CF. The film thickness of the buffer layer BF is 1 μm, for example. Then, a channel layer CH1 composed of undoped gallium nitride (GaN) is formed on the buffer layer BF. The film thickness of the channel layer CH1 is 50 nm, for example. Thereafter, a spacer layer SP4 composed of undoped aluminum indium nitride ($Al_{0.9}In_{0.1}N$) is formed on the channel layer CH1. The film thickness of the spacer layer SP4 is 1 nm, for example. Then, an electron supply layer ES4 composed of undoped $Al_{0.7}In_{0.3}N$ is formed on the spacer layer SP4. The film thickness of the electron supply layer ES4 is 7 nm, for example. Next, a semiconductor film SF2 composed of p-type $Al_{0.7}In_{0.3}N$ is formed on the electron supply layer ES4. The impurity concentration of the semiconductor film SF2 is $5 \times 10^{19}$ $cm^{-3}$, for example, and the film thickness thereof is 20 nm, for example. In addition, as a p-type impurity, magnesium (Mg), for example, can be used. In this manner, the semiconductor layer structure is formed. This semiconductor layer structure is formed by group-III plane growth of deposition in the direction of a [0001] crystal axis (c axis).

Here, the film thickness of the spacer layer SP4 is thinner than the film thickness of the electron supply layer ES4, and further, the film thickness of the electron supply layer ES4 is set thinner than a critical thickness at which a dislocation is generated on the buffer layer BF. Therefore, according to the sixth embodiment, a good crystal quality where dislocation generation has been suppressed can be provided.

In the respective semiconductor layers constituting the above semiconductor layer structure, based on spontaneous polarization and piezoelectric polarization, polarization charges are generated at upper and lower interfaces of each semiconductor layer. The area density of the polarization charges is $5.3 \times 10^{13}$ $cm^{-2}$ for the spacer layer SP4 composed of aluminum indium nitride $Al_{0.9}In_{0.1}N$, and $3.2 \times 10^{13}$ $cm^{-2}$ for the electron supply layer ES4 composed of $Al_{0.7}In_{0.3}N$, for example The polarity of the polarization charges, in the case of group-III plane growth, is negative on the surface side and positive on the back surface side.

Figure 39:
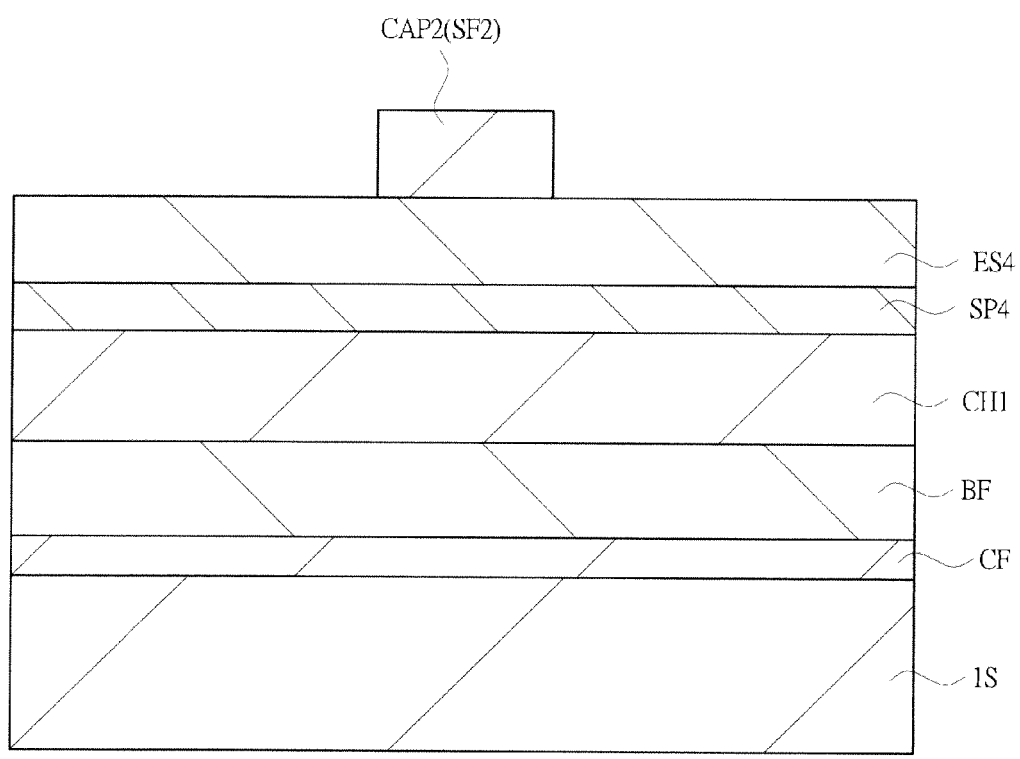
FIG. 39 is a cross-sectional view showing the process of manufacturing the semiconductor device continued from FIG. 38.

Next, as shown in FIG. 39, a resist film is applied on the semiconductor film SF2, and exposure and development processes are performed on the resist film to pattern the resist film. The patterning of the resist film is so performed as to leave the resist film in a region where the p-type cap layer CAP2 is to be formed. Then, the p-type cap layer CAP2 composed of the semiconductor film SF2 is formed by etching the semiconductor film SF2 with the patterned resist film as a mask. Specifically, the etching of the semiconductor film SF2 can be performed by dry-etching using etching gas, such as boron chloride ($BCl_3$), for example.

Then, after the patterned resist film has been removed, a resist film is applied on the electron supply layer ES4 on which the p-type cap layer CAP2 has been formed. Subsequently, exposure and development processes are performed on the resist film to pattern the resist film. The patterning of the resist film is performed so as to expose a source electrode forming region and a drain electrode forming region.

Thereafter, a metal film is formed on the patterned resist film. Therefore, in the source electrode forming region and the drain electrode forming region, the metal film is formed directly on the electron supply layer ES4. On the other hand, in the other region, the metal film is formed on the resist film. At this time, the metal film (Ti/Al/Ni/Au) is composed of a titanium film (Ti), an aluminum film (Al) formed on the titanium film, a nickel film (Ni) formed on the aluminum film, and a gold film (Au) formed on the nickel film, for example. The metal film can be formed by vapor deposition, for example.

Figure 40:
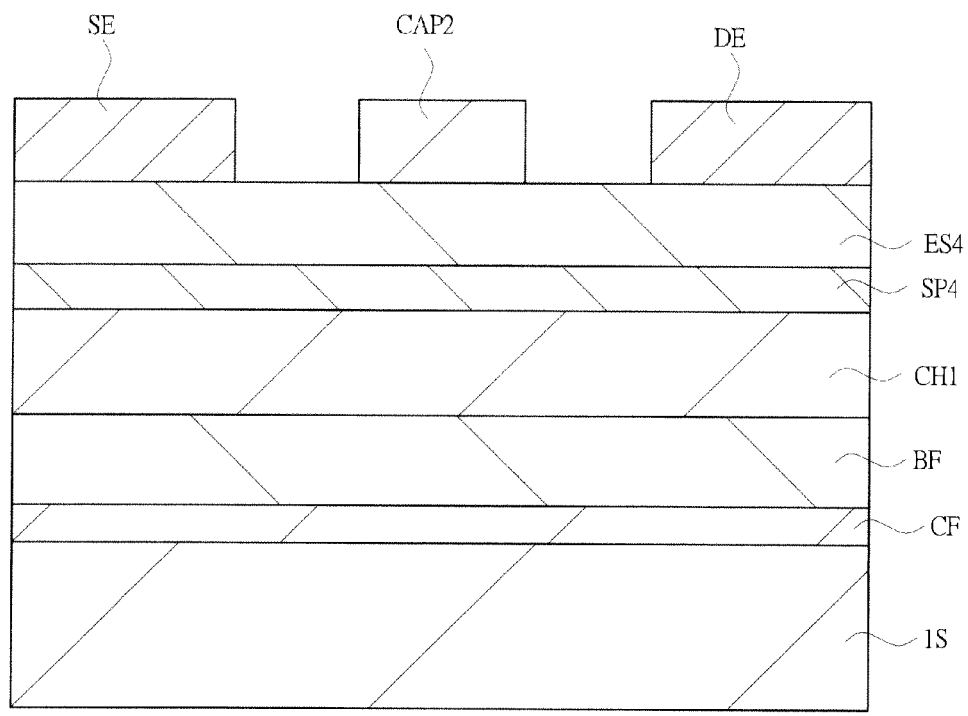
FIG. 40 is a cross-sectional view showing the process of manufacturing the semiconductor device continued from FIG. 39.

Next, the resist film is lifted off. This removes the resist film and the metal film formed on the resist film, and leaves only the metal film formed in direct contact with the electron supply layer ES4. Thereby, as shown in FIG. 40, the source electrode SE and the drain electrode DE, which are composed of the metal film in direct contact with the electron supply layer ES4, can be formed. The source electrode SE and the drain electrode DE are disposed so as to be separated from each other, and the p-type cap layer CAP2 is formed so as to be sandwiched between the source electrode SE and the drain electrode DE. Thereafter, a thermal treatment (alloy treatment) is performed on the semiconductor substrate 1S to bring the source electrode SE, and the channel layer CH1 in which the two-dimensional electron gas is formed, into ohmic contact with each other. Similarly, the thermal treatment brings the drain electrode DE and the channel layer CH1 into ohmic contact with each other. Then, though not shown, in order to achieve element isolation between devices, an element isolation region is formed by implantation of nitrogen (N) ions or the like.

Then, a resist film is applied on the electron supply layer ES4 on which the source electrode SE, the drain electrode DE, and the p-type cap layer CAP2 have been formed. Subsequently, exposure and development processes are performed on the resist film to pattern the resist film. The patterning of the resist film is performed so as to expose a gate electrode forming region on the p-type cap layer CAP2.

Thereafter, a metal film is formed on the patterned resist film. Thereby, in the gate electrode forming region, the metal film is formed directly on the p-type cap layer CAP2. On the other band, in the other region, the metal film is formed on the resist film. At this time, the metal film (Ni/Au) is composed of a nickel film (Ni) and a gold film (Au) formed on the nickel film, for example. The metal film can be formed by vapor deposition, for example Then, as shown in FIG. 37, the resist film is lifted off. This removes the resist film and the metal film formed on the resist film, and leaves only the metal film formed in direct contact with the p-type cap layer CAP2. Thereby, the gate electrode composed of the metal film in direct contact with the p-type cap layer CAP2 can be formed. In the above manner, the high electron mobility transistor (semiconductor device) in the sixth embodiment can be manufactured.

Hereinabove, the invention made by the present inventors have been described on the basis of the embodiments thereof, but the present invention is not limited to the above embodiments, and it will be obvious that various changes may be made without departing from the scope of the invention.

(Modification)

(1) In the above embodiments, the examples where silicon (Si) is used as a semiconductor substrate have been described, but the semiconductor substrate is not limited thereto, and a substrate composed of silicon carbide (SiC), sapphire ($Al_2O_3$), gallium nitride (GaN), diamond (C), or the like, may be used.

(2) In the above embodiments, the examples where a superlattice composed of aluminum nitride (AlN) and gallium nitride (GaN) is used as a nucleation layer has been described, but the nucleation layer is not limited thereto, and a monolayer film composed of aluminum nitride (AlN), aluminum gallium nitride (AlGaN), gallium nitride (GaN), or the like, may be used.

(3) In the above embodiments, the examples where gallium nitride (GaN) is used as a buffer layer has been described, but the buffer layer is not limited thereto, and another group III-nitride semiconductor represented by aluminum gallium nitride (AlGaN), indium gallium nitride (InGaN), aluminum indium nitride (AlInN), or AlGaInN may be used.

(4) In the above embodiments, the examples where gallium nitride (GaN) is used as a channel layer has been described, but the channel layer is not limited thereto, and another group III-nitride semiconductor represented by AlGaN, AlInN, AlGaInN, InGaN, or indium nitride (InN), or the like may be used.

(5) In the above embodiments, the examples where aluminum gallium nitride (AlGaN) or aluminum indium nitride (AlInN) is used as a spacer layer has been described, but the spacer layer is not limited thereto, another group III nitride semiconductor whose band gap is larger than that of the electron supply layer may be used. For example, GaN, AlGaInN, InGaN, or the like, may be used.

(6) In the above embodiments, the examples where aluminum indium nitride (AlInN) or aluminum gallium nitride (AlGaN) is used as an electron supply layer has been described, but the electron supply layer is not limited thereto, and another group III-nitride semiconductor whose band gap is larger than that of the channel layer may be used. For example, AlN, GaN, AlGaInN, InGaN, or the like, may be used.

(7) In the above embodiments, the electron supply layer is undoped, but may be doped with an n-type impurity, such as silicon (Si), for example. Further, the electron supply layer may have a multi-layer structure, such as a bilayer structure composed of an undoped layer and an n-type layer, or a trilayer structure composed of an undoped layer, an n-type layer, and an undoped layer, or the like.

(8) In the above embodiments, the examples where a p-type cap layer is composed of p-type AlGaN or p-type AlInN has been described, but the p-type cap layer is not limited thereto, and another group IR-nitride semiconductor represented by p-type AlGaInN, p-type InGaN, or p-type InN may be used. In this regard, as the p-type impurity, though magnesium (Mg) has been used, another p-type impurity, such as zinc (Zn) or hydrogen (H), or the like may be used.

(9) In the above embodiments, a protective film is not provided on the outermost surface of the device, but an insulation film composed of silicon nitride ($Si_3N_4$), aluminum oxide ($Al_2O_3$), silicon oxide ($SiO_2$), or the like, may be formed thereon.

(10) In the above embodiments, the examples where the source electrode and the drain electrode are composed of Ti/Al/Ni/Au has been described, but the source electrode and the drain electrode are not limited thereto, and another material represented by Ti/Al, Ti/Al/molybdenum (Mo)/Au or Ti/Al/niobium (Nb)/Au may be used.

(11) In the above embodiments, the examples where the gate electrode is composed of Ni/Au has been described, but the gate electrode is not limited thereto, and other material, such as Ni/palladium (Pd)/Au, Ni/platinum (Pt)/Au, Ti/Au, Ti/Pd/Au, or Ti/Pt/Au, or the like may be used. In this regard, the contact between the gate electrode and the p-type cap layer may be a Schottky contact or an ohmic contact.

(12) In the above embodiments, the examples where element isolation between devices is made by implantation of nitrogen (N) ions has been described, but the element isolation therebetween is not limited thereto, and the element isolation therebetween may be made by implantation of another ion, such as boron (B), or the like or may be made by mesa etching.

Hereinabove, according to the present technical idea, with the normally-off operation maintained, a high electron mobility transistor where a gate leakage current is significantly suppressed can be obtained. Therefore, the maximum carrier concentration of the two-dimensional electron gas that can be accumulated in the channel layer increases, so that the on-resistance can be reduced. In particular, when aluminum nitride (AlN) is used as the spacer layer, the electron mobility is improved, so that a further reduction of on-resistance is realized. In addition, when aluminum indium nitride (AlInN) having an aluminum composition ratio of about 0.82 is used as the spacer layer, a good crystal quality without an internal strains can be obtained, so that the long-term reliability of the high electron mobility transistor can be dramatically improved. Therefore, according to the high electron mobility transistor to which the present technical idea is applied, it becomes possible to provide a normally-off device where the on-resistance is reduced. As a result, it is possible to provide a high electron mobility transistor that makes a large contribution to enhancing the performance of an electronic device represented by a mobile phone base station, a fixed wireless transmitter, a digital broadcasting ground station, radar equipment, a motor controller, a high-frequency generator, a power supply device, or an inverter lamp.

(Supplementary Note)

Some of the embodiments are s as follows.

A semiconductor device including a field-effect transistor, the field-effect transistor including: (a) a channel layer composed of a first nitride semiconductor layer; (b) a spacer layer composed of a second nitride semiconductor layer formed on the channel layer; (c) an electron supply layer composed of a third nitride semiconductor layer formed on the spacer layer;

(d) a source electrode formed on the electron supply layer; (e) a drain electrode formed on the electron supply layer and separated from the source electrode; (f) a p-type cap layer formed on the electron supply layer sandwiched between the source electrode and the drain electrode; and (g) a gate electrode formed on the p-type cap layer, the spacer layer having a band-gap larger than that of the electron supply layer.

What is claimed is:

1. A semiconductor device including a field-effect transistor, the field-effect transistor comprising:
   (a) a channel layer composed of a first nitride semiconductor layer;
   (b) a spacer layer composed of a second nitride semiconductor layer formed on the channel layer;
   (c) an electron supply layer composed of a third nitride semiconductor layer formed on the spacer layer;
   (d) a source electrode formed on the electron supply layer;
   (e) a drain electrode formed on the electron supply layer and separated from the source electrode;
   (f) a p-type cap layer formed on the electron supply layer sandwiched between the source electrode and the drain electrode, wherein the electron supply layer between the spacer layer and the p-type cap layer is undoped; and
   (g) a gate electrode formed on the p-type cap layer, the spacer layer having a band-gap larger than that of the electron supply layer.

2. The semiconductor device according to claim 1,
   wherein the channel layer is formed of GaN,
   the spacer layer is formed of $Al_xGa_{1-x}N$,
   the electron supply layer is formed of $Al_yGa_{1-y}N$, and
   a composition ratio x and a composition ratio y satisfy a relationship y<x.

3. The semiconductor device according to claim 1,
   wherein the channel layer is formed of GaN,
   the spacer layer is formed of $Al_uIn_{1-u}N$,
   the electron supply layer is formed of $Al_vGa_{1-v}N$, and a composition ratio u and a composition ratio v satisfy a relationship 2.8v+2.5<5.3u.

4. The semiconductor device according to claim 1,
   wherein the channel layer is formed of GaN,
   the spacer layer is formed of $Al_aGa_{1-a}N$,
   the electron supply layer is formed of $Al_bIn_{1-b}N$, and
   a composition ratio a and a composition ratio b satisfy a relationship 5.3b<2.8a+2.5.

5. The semiconductor device according to claim 1,
   wherein the channel layer is formed of GaN,
   the spacer layer is formed of $Al_dIn_{1-d}N$,
   the electron supply layer is formed of $Al_eIn_{1-e}N$, and
   a composition ratio d and a composition ratio e satisfy a relationship e<d.

6. The semiconductor device according to claim 1,
   wherein the p-type cap layer is formed of p-type $Al_zGa_{1-z}N$ (0<z<1).

7. The semiconductor device according to claim 1,
   wherein the p-type cap layer is formed of p-type $Al_cIn_{1-c}N$ (0<c<1).

8. The semiconductor device according to claim 1,
   wherein the film thickness of the spacer layer is smaller than the film thickness of the electron supply layer.

9. The semiconductor device according to claim 1,
   wherein a contact between the p-type cap layer and the gate electrode is a Schottky contact.

10. The semiconductor device according to claim 1,
    wherein a contact between the p-type cap layer and the gate electrode is an ohmic contact.

11. The semiconductor device according to claim 1, further comprising:
    a buffer layer formed below the channel layer;
    a nucleation layer formed below the buffer layer; and
    a semiconductor substrate formed below the nucleation layer.

12. The semiconductor device according to claim 1, further comprising:
    a buffer layer formed below the channel layer; and
    a semiconductor substrate formed below the buffer layer.

13. The semiconductor device according to claim 1,
    wherein polarization charges are generated on a surface or a back surface of the spacer layer, and
    polarization charges are generated on a surface or a back surface of the electron supply layer.

14. The semiconductor device according to claim 13,
    wherein the polarity of the polarization charges generated in the spacer layer is negative on the surface side and positive on the back surface side, and
    the polarity of the polarization charges generated in the electron supply layer is negative on the surface side and positive on the back surface side.

15. The semiconductor device according to claim 14,
    wherein the area density of the polarization charges generated in the spacer layer is larger than the area density of the polarization charges generated in the electron supply layer.

16. The semiconductor device according to claim 1,
    wherein the field-effect transistor is a normally-off transistor.

17. The semiconductor device according to claim 1,
    wherein an interface of the spacer layer with the electron supply layer is a (0001) group-III plane.

18. A method of manufacturing a semiconductor device comprising:
    (a) forming a channel layer composed of a first nitride semiconductor layer;
    (b) forming, on the channel layer, a spacer layer composed of a second nitride semiconductor layer;
    (c) forming, on the spacer layer, an electron supply layer composed of a third nitride semiconductor layer whose band gap is smaller than the band gap of the second nitride semiconductor layer;
    (d) forming a p-type nitride semiconductor layer on the electron supply layer;
    (e) removing part of the p-type nitride semiconductor layer after the step (d), thereby forming a p-type cap layer, wherein the electron supply layer between the spacer layer and the p-type cap layer is undoped;
    (f) forming a source electrode and a drain electrode on the electron supply layer exposed such that the source electrode and the drain electrode sandwich the p-type cap layer, after the step (e); and
    (g) forming a gate electrode on the p-type cap layer after the step (f).

19. The method of manufacturing a semiconductor device according to claim 18,
    wherein a thickness of the spacer layer is smaller than that of the electron supply layer.

20. The method of manufacturing a semiconductor device according to claim 18,
    wherein the channel layer, the spacer layer, and the electron supply layer are formed by group-III plane growth of deposition in the direction of a [0001] crystal axis.

* * * * *